United States Patent
Kimura

(10) Patent No.: US 9,013,457 B2
(45) Date of Patent: Apr. 21, 2015

(54) SEMICONDUCTOR DEVICE AND METHOD FOR DRIVING SEMICONDUCTOR DEVICE

(71) Applicant: Semiconductor Energy Laboratory Co., Ltd., Kanagawa-ken (JP)

(72) Inventor: Hajime Kimura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 141 days.

(21) Appl. No.: 13/906,769

(22) Filed: May 31, 2013

(65) Prior Publication Data

US 2013/0321248 A1 Dec. 5, 2013

(30) Foreign Application Priority Data

Jun. 1, 2012 (JP) .................. 2012-126402

(51) Int. Cl.
*G09G 5/00* (2006.01)
*H01L 33/00* (2010.01)
*G09G 3/32* (2006.01)

(52) U.S. Cl.
CPC .......... *H01L 33/0041* (2013.01); *G09G 3/3208* (2013.01); *G09G 3/3233* (2013.01); *G09G 3/3291* (2013.01); *G09G 2300/0426* (2013.01); *G09G 2300/0819* (2013.01); *G09G 2300/0852* (2013.01); *G09G 2300/0861* (2013.01); *G09G 2310/0251* (2013.01); *G09G 2310/0256* (2013.01); *G09G 2310/0262* (2013.01); *G09G 2320/043* (2013.01)

(58) Field of Classification Search
USPC ....................................................... 345/204
See application file for complete search history.

(56) References Cited

U.S. PATENT DOCUMENTS

| | | |
|---|---|---|
| 5,684,365 A | 11/1997 | Tang et al. |
| 5,956,011 A | 9/1999 | Koyama et al. |
| 6,037,924 A | 3/2000 | Koyama et al. |
| 6,310,598 B1 | 10/2001 | Koyama et al. |
| 6,608,613 B2 | 8/2003 | Koyama et al. |
| 6,693,383 B2 | 2/2004 | Bae et al. |
| 6,737,813 B2 | 5/2004 | Kawasaki et al. |
| 6,839,057 B2 | 1/2005 | Iguchi |
| 6,928,136 B2 | 8/2005 | Nagao et al. |

(Continued)

FOREIGN PATENT DOCUMENTS

| | | |
|---|---|---|
| EP | 1 459 126 B1 | 1/2007 |
| JP | 8-234683 | 9/1996 |

(Continued)

OTHER PUBLICATIONS

Kamiya, T. et al., "Carrier Transport Properties and Electronic Structures of Amorphous Oxide Semiconductors: The Present Status," Solid State Physics, vol. 44, No. 9, Sep. 1, 2009, pp. 621-633, Agne Gijutsu Center.

*Primary Examiner* — Jonathan Boyd
(74) *Attorney, Agent, or Firm* — Husch Blackwell LLP

(57) ABSTRACT

By holding a voltage that depends on a video signal in a first capacitor, holding a voltage that depends on a threshold voltage of a transistor in a second capacitor, and then applying a total voltage of the voltage held in the first capacitor and the voltage held in the second capacitor between a source and a gate of the transistor, even when the threshold voltage varies, a current corresponding to the video signal can be supplied to a load. The voltage that depends on the video signal and the voltage that depends on the threshold voltage of the transistor are separately acquired.

24 Claims, 53 Drawing Sheets

(56) References Cited

U.S. PATENT DOCUMENTS

| | | |
|---|---|---|
| 6,958,750 B2 | 10/2005 | Azami et al. |
| 6,975,142 B2 | 12/2005 | Azami et al. |
| 7,042,426 B2 | 5/2006 | Shin |
| 7,068,076 B2 | 6/2006 | Azami |
| 7,129,917 B2 | 10/2006 | Yamazaki et al. |
| 7,133,012 B2 | 11/2006 | Abe |
| 7,151,278 B2 | 12/2006 | Nagao et al. |
| 7,173,590 B2 | 2/2007 | Uchino et al. |
| 7,317,429 B2 | 1/2008 | Shirasaki et al. |
| 7,327,357 B2 | 2/2008 | Jeong |
| 7,365,742 B2 | 4/2008 | Kim et al. |
| 7,382,342 B2 | 6/2008 | Uchino et al. |
| 7,429,985 B2 | 9/2008 | Kimura et al. |
| 7,443,367 B2 | 10/2008 | Numao |
| 7,456,810 B2 | 11/2008 | Kimura |
| 7,502,001 B2 | 3/2009 | Fish et al. |
| 7,532,209 B2 | 5/2009 | Kimura |
| 7,626,199 B2 | 12/2009 | Kim |
| 7,671,826 B2 | 3/2010 | Kimura |
| 7,674,650 B2 | 3/2010 | Akimoto et al. |
| 7,714,813 B2 | 5/2010 | Uchino et al. |
| 7,714,815 B2 | 5/2010 | Kim et al. |
| 7,738,014 B2 | 6/2010 | Kwak et al. |
| 7,817,117 B2 | 10/2010 | Kimura |
| 7,982,696 B2 | 7/2011 | Kimura |
| 7,986,287 B2 | 7/2011 | Umezaki et al. |
| 8,049,743 B2 | 11/2011 | Kang |
| 8,063,859 B2 | 11/2011 | Kimura |
| 8,164,547 B2 | 4/2012 | Kimura |
| 8,264,430 B2 | 9/2012 | Kimura |
| 8,305,306 B2 | 11/2012 | Kimura |
| 8,325,111 B2 | 12/2012 | Kimura |
| 2003/0090481 A1 | 5/2003 | Kimura |
| 2003/0117352 A1 | 6/2003 | Kimura |
| 2003/0132931 A1 | 7/2003 | Kimura et al. |
| 2003/0137503 A1 | 7/2003 | Kimura et al. |
| 2004/0080474 A1 | 4/2004 | Kimura |
| 2004/0095305 A1 | 5/2004 | Kimura et al. |
| 2004/0174349 A1 | 9/2004 | Libsch et al. |
| 2004/0174354 A1 | 9/2004 | Ono et al. |
| 2005/0243079 A1 | 11/2005 | Ozaki |
| 2006/0082528 A1 | 4/2006 | Guo et al. |
| 2006/0109225 A1 | 5/2006 | Haga et al. |
| 2006/0170628 A1 | 8/2006 | Yamashita et al. |
| 2006/0290613 A1 | 12/2006 | Hong et al. |
| 2007/0103419 A1 | 5/2007 | Uchino et al. |
| 2007/0120810 A1 | 5/2007 | You et al. |
| 2007/0126664 A1* | 6/2007 | Kimura ..................... 345/76 |
| 2007/0126665 A1 | 6/2007 | Kimura |
| 2007/0132694 A1 | 6/2007 | Uchino et al. |
| 2007/0164962 A1 | 7/2007 | Uchino et al. |
| 2007/0236424 A1 | 10/2007 | Kimura |
| 2007/0279403 A1 | 12/2007 | Uchino et al. |
| 2008/0225061 A1 | 9/2008 | Kimura et al. |
| 2008/0278425 A1 | 11/2008 | Koyama |
| 2009/0009676 A1 | 1/2009 | Kimura et al. |
| 2009/0051674 A1 | 2/2009 | Kimura et al. |
| 2009/0140981 A1 | 6/2009 | Kwak et al. |
| 2010/0001983 A1 | 1/2010 | Abe |
| 2010/0149160 A1 | 6/2010 | Kimura |
| 2010/0220092 A1 | 9/2010 | Kimura |
| 2011/0024760 A1 | 2/2011 | Kimura |
| 2011/0205144 A1 | 8/2011 | Kimura et al. |
| 2011/0260170 A1 | 10/2011 | Kimura |
| 2012/0327142 A1 | 12/2012 | Kimura |
| 2013/0057174 A1 | 3/2013 | Kimura |
| 2013/0092963 A1 | 4/2013 | Kimura |

FOREIGN PATENT DOCUMENTS

| | | |
|---|---|---|
| JP | 2003-195810 A | 7/2003 |
| JP | 2004-280059 A | 10/2004 |
| JP | 2004-295131 A | 10/2004 |
| JP | 2005-189643 A | 7/2005 |
| JP | 2005-195756 A | 7/2005 |
| WO | WO 03/058328 A1 | 7/2003 |

* cited by examiner

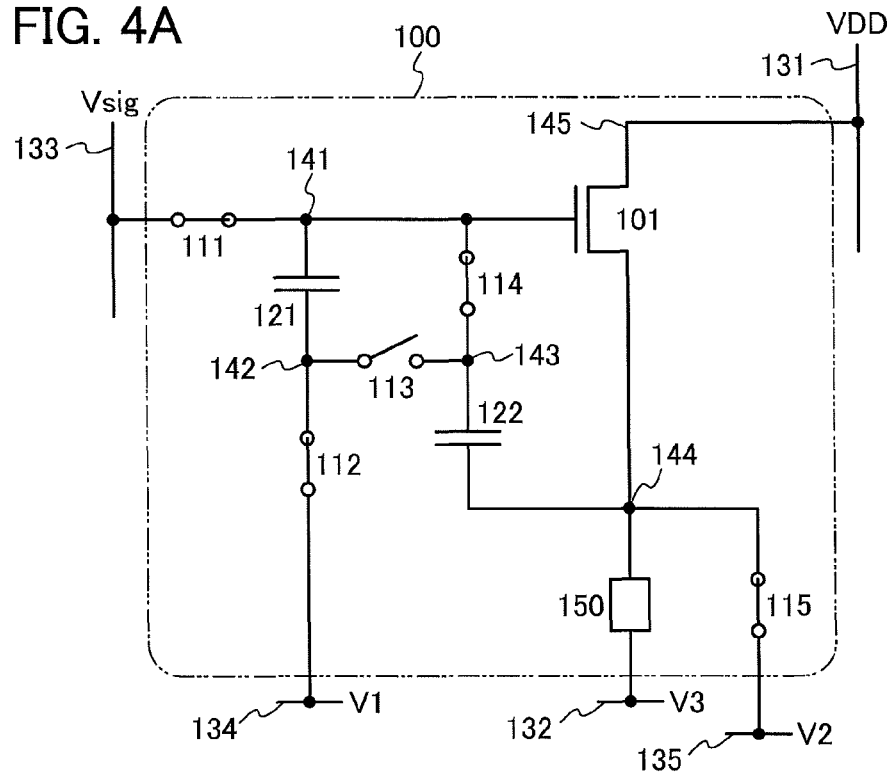
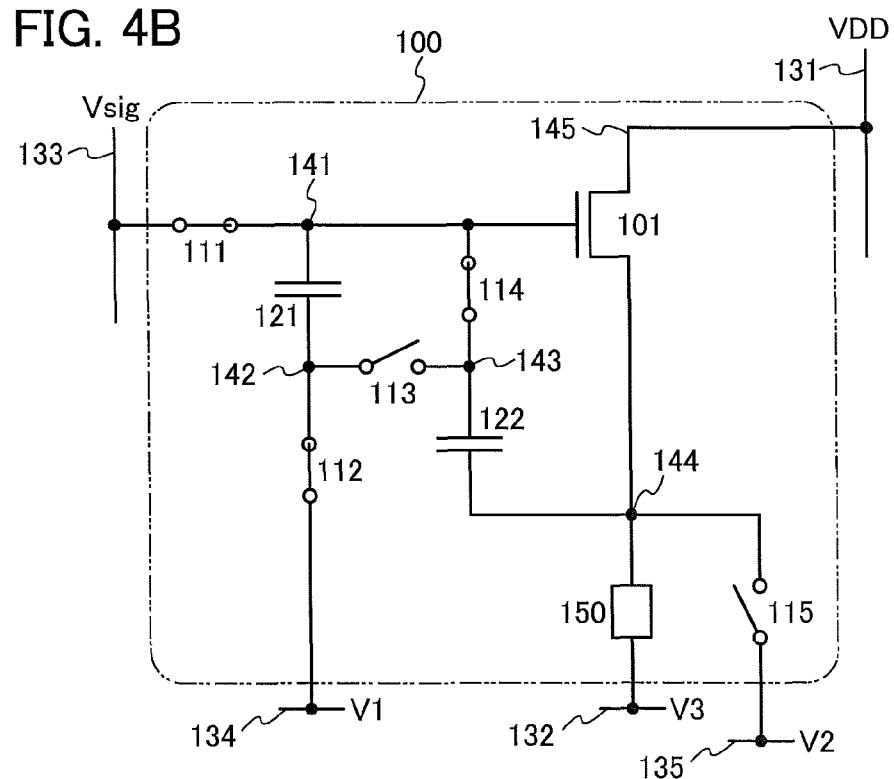

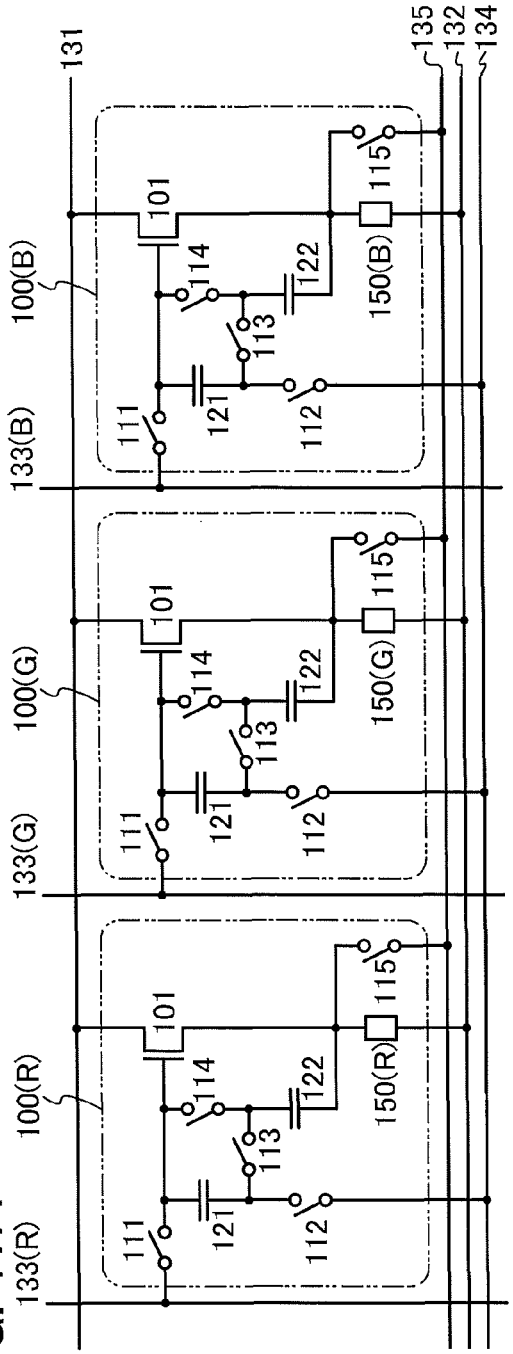
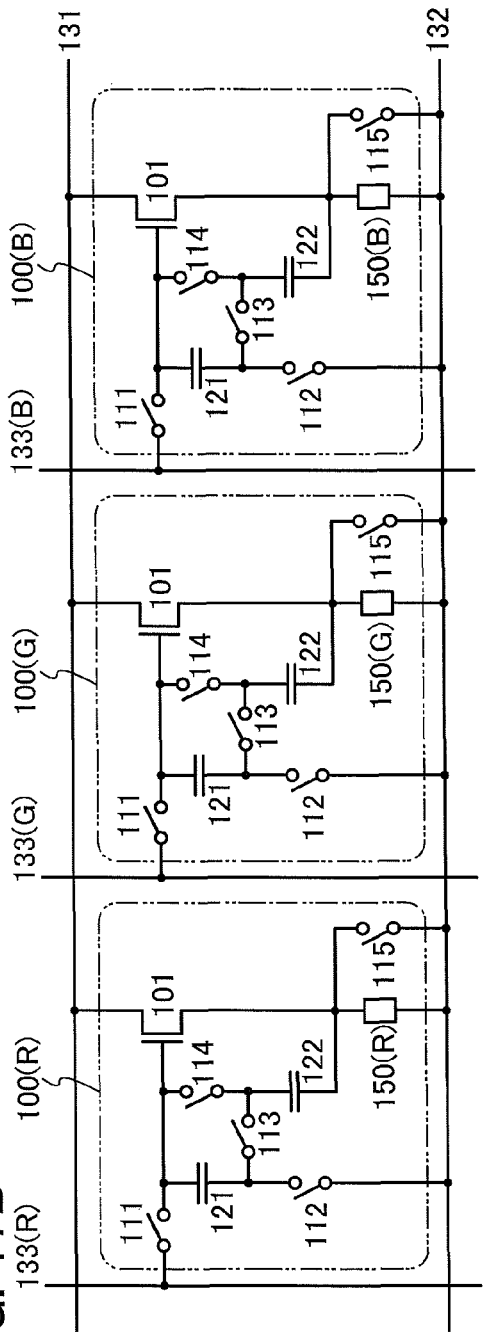

FIG. 27
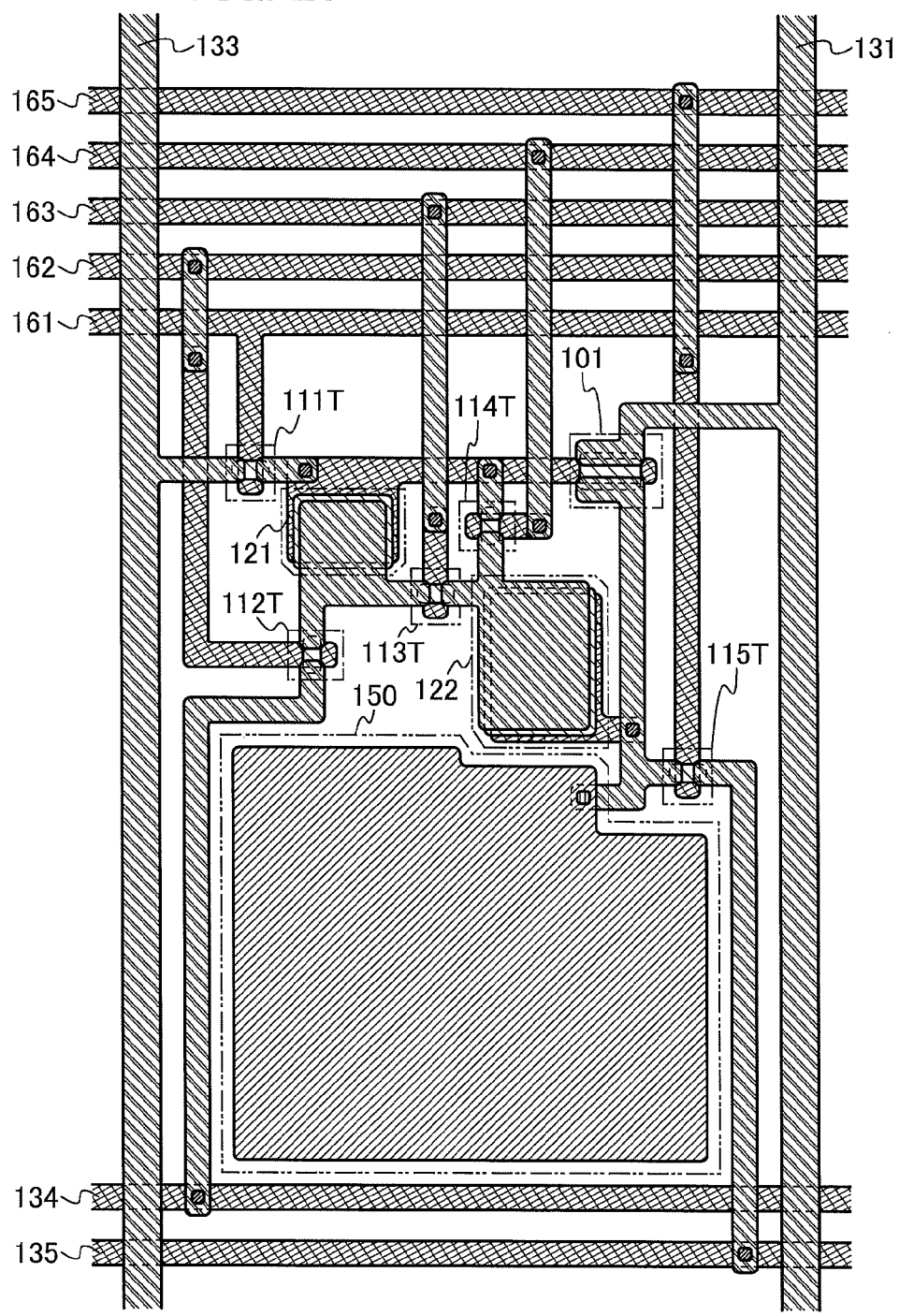
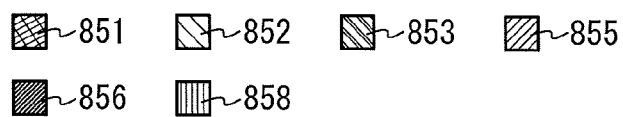

FIG. 37A  FIG. 37B
FIG. 37C
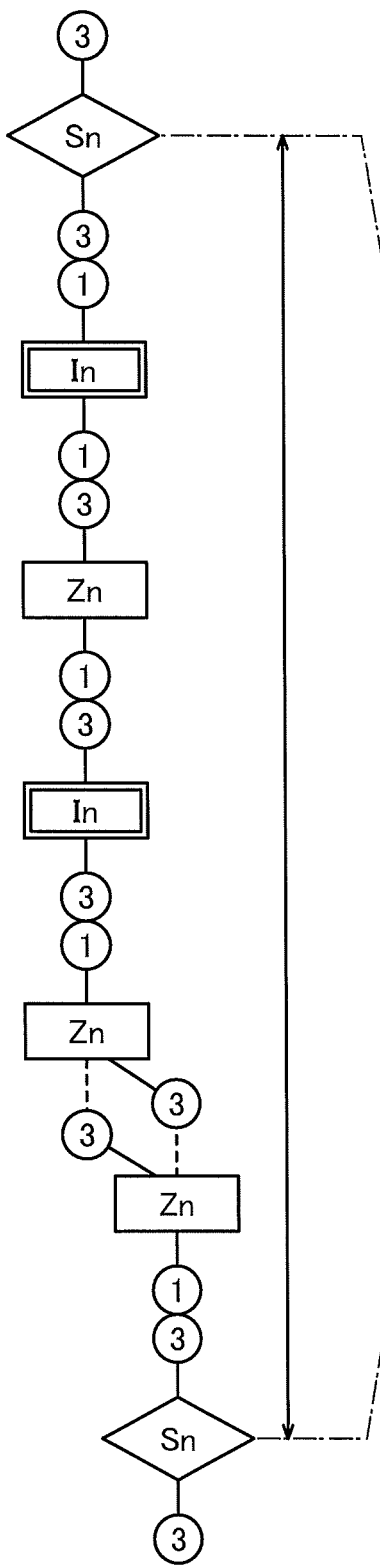
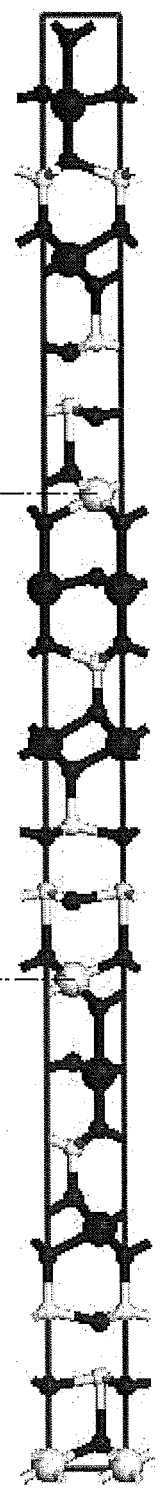
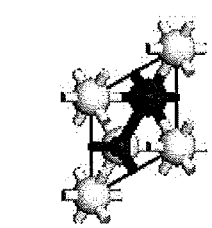
● In
○ Sn
○ Zn
● O

- In
- Ga
- Zn
- O

- In
- Ga or Zn
- O

- In
- Ga
- Zn
- O

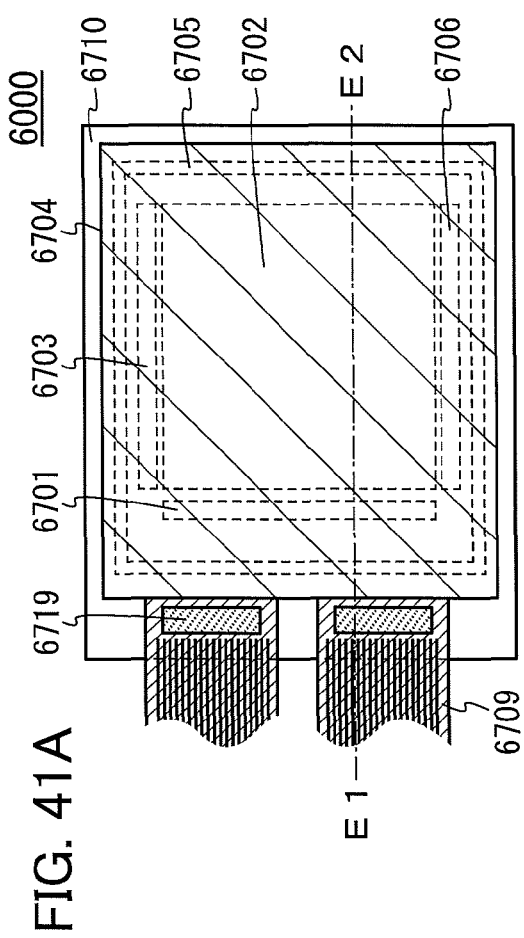
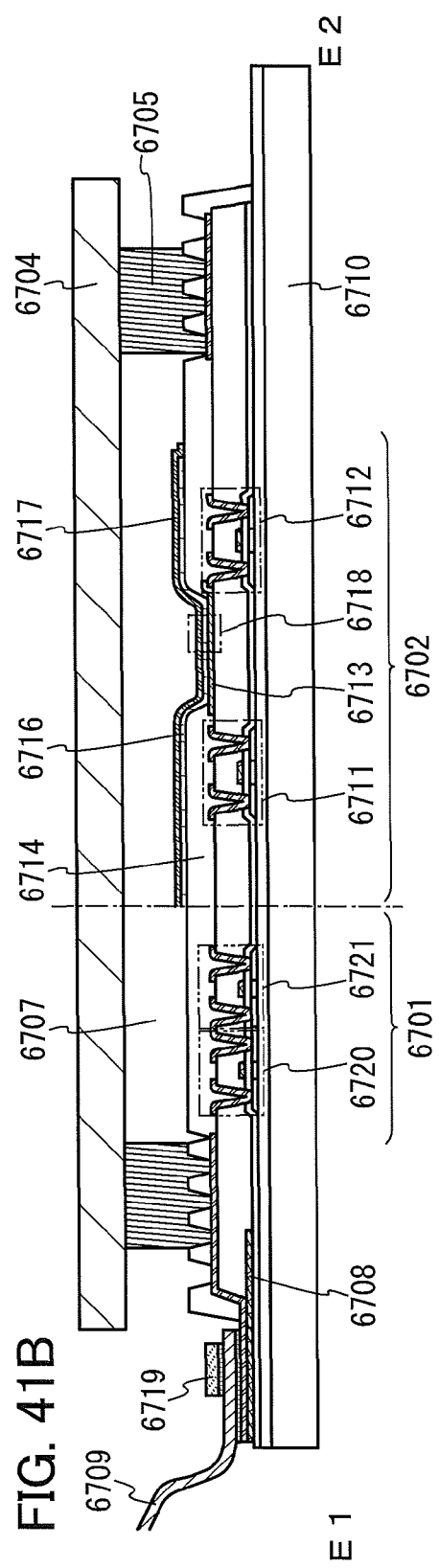
FIG. 41A
FIG. 41B

SEMICONDUCTOR DEVICE AND METHOD FOR DRIVING SEMICONDUCTOR DEVICE

BACKGROUND OF THE INVENTION

1. Field of the Invention

The present invention relates to semiconductor devices, display devices, light-emitting devices, methods for manufacturing these devices, and methods for driving these devices.

Note that a semiconductor device in this specification and the like indicates all the devices that can operate by utilizing semiconductor characteristics; and for example, electro-optical devices, display devices, light-emitting devices, semiconductor circuits, and electronic appliances are all included in the category of the semiconductor devices.

In particular, the present invention relates to a display device including a current-driving-type light-emitting element which changes in luminance depending on current. Further, the present invention relates to an electronic appliance including the display device.

2. Description of the Related Art

In recent years, flat panel displays such as liquid crystal displays (LCDs) are becoming widespread. Other than LCDs, displays (OELDs) including an organic EL element (also referred to as an electroluminescent element, an organic light-emitting diode, an OLED, or the like), which is a current-driving-type light-emitting element that changes in luminance depending on current, have been actively researched (Patent Document 1). For example, methods for correcting variations in the threshold voltage of transistors have been examined (see Patent Document 1).

REFERENCE

Patent Document

[Patent Document 1] Japanese Published Patent Application No. 2003-195810

SUMMARY OF THE INVENTION

It is an object of one embodiment of the present invention to provide a structure with which an adverse effect of variations in the threshold voltage of transistors can be reduced. Further, it is an object of one embodiment of the present invention to provide a novel structure with which an adverse effect of variations in the mobility of transistors can be reduced. Furthermore, it is an object of one embodiment of the present invention to provide a novel structure with which an adverse effect of variations in current characteristics of transistors can be reduced. Alternatively, it is an object of one embodiment of the present invention to provide a novel structure with which an adverse effect of deterioration of a transistor can be reduced. Furthermore, it is an object of one embodiment of the present invention to provide a novel structure with which an adverse effect of deterioration of a display element can be reduced. Furthermore, it is an object of one embodiment of the present invention to provide a novel structure with which display unevenness can be reduced. Furthermore, it is an object of one embodiment of the present invention to provide a novel structure with which an image can be displayed with high display quality. Furthermore, it is an object of one embodiment of the present invention to provide a novel structure with which a desired circuit can be achieved with a small number of transistors. Furthermore, it is an object of one embodiment of the present invention to provide a novel structure with which a desired circuit can be achieved with a small number of wirings. Furthermore, it is an object of one embodiment of the present invention to provide a novel structure with which a desired circuit can be manufactured at low cost. Furthermore, it is an object of one embodiment of the present invention to provide a novel structure with which an adverse effect of variations in the threshold voltage of normally-on (depletion) transistors can be reduced. Furthermore, it is an object of one embodiment of the present invention to provide a novel structure with which an adverse effect of variations in the mobility of normally-on (depletion) transistors can be reduced. Furthermore, it is an object of one embodiment of the present invention to provide a novel structure with which an adverse effect of variations in current characteristics of normally-on (depletion) transistors can be reduced. Further, it is an object of one embodiment of the present invention to provide a novel structure with which an adverse effect of deterioration of a normally-on (depletion) transistor can be reduced.

The description of these objects does not disturb the existence of other objects. There is no need to achieve all of these objects with one embodiment of the present invention. Other objects will be apparent from and can be derived from the description of the specification, drawings, claims, and the like.

One embodiment of the present invention is a semiconductor device which includes: a transistor; a load; a first capacitor; a second capacitor; a first switch; a second switch; a third switch; a fourth switch; and a fifth switch. In the semiconductor device, one of a source and a drain of the transistor is connected to one electrode of the load. The other of the source and the drain of the transistor is connected to a first wiring. The other electrode of the load is connected to a second wiring. One electrode of the first switch is connected to a third wiring, and the other electrode of the first switch is connected to a gate of the transistor. One electrode of the first capacitor is connected to the other electrode of the first switch, and the other electrode of the first capacitor is connected to one electrode of the second switch. The other electrode of the second switch is connected to a fourth wiring. One electrode of the third switch is connected to the one electrode of the second switch, the other electrode of the third switch is connected to one electrode of the second capacitor, and the other electrode of the second capacitor is connected to the one electrode of the load. One electrode of the fourth switch is connected to the gate of the transistor, the other electrode of the fourth switch is connected to the one electrode of the second capacitor, one electrode of the fifth switch is connected to the one electrode of the load, and the other electrode of the fifth switch is connected to a fifth wiring.

Another embodiment of the present invention is a method for driving a semiconductor device including a transistor, a load, a first capacitor, and a second capacitor, which includes the steps of: holding a voltage that depends on a video signal in the first capacitor; holding a voltage that depends on a threshold voltage of the transistor in the second capacitor; applying a total voltage of the voltage held in the first capacitor and the voltage held in the second capacitor between a source and a gate of the transistor; and supplying a current corresponding to the total voltage to the load.

Another embodiment of the present invention is a method for driving a semiconductor device including a transistor, a load, a first capacitor, and a second capacitor, which includes the steps of: performing an initialization operation for acquiring a threshold voltage of the transistor and an operation of writing a video signal to the first capacitor in a first period; performing an operation of writing the threshold voltage to the second capacitor in a second period after the first period; making the first capacitor and the second capacitor in a floating state in a third period after the second period; and supplying a current to the load by applying a total voltage of a voltage held in the first capacitor and a voltage held in the second capacitor between a source and a gate of the transistor in a fourth period after the third period.

The above-mentioned transistor may be either an enhancement transistor or a depletion transistor.

Further, the first switch, the second switch, the third switch, the fourth switch, and the fifth switch may be a first transistor, a second transistor, a third transistor, a fourth transistor, and a fifth transistor, respectively. The above-mentioned transistor and the first to fifth transistors may have the same conductivity type.

Note that the invention excluding a content that is not specified in the drawings and texts in this specification can be constructed. When the numerical range of a value defined by the maximum value and the minimum value is described, by appropriately narrowing the range or appropriately excluding a value in the range, the invention excluding part of the range can be constructed. In this way, the technical scope of the present invention does not include a conventional technology, for example.

As a specific example, a case where a circuit including first to fifth transistors is illustrated in a circuit diagram is considered. In that case, the invention in which the circuit does not include a sixth transistor can be constructed. The invention in which the circuit does not include a capacitor can be constructed. The invention in which the circuit does not include a sixth transistor with a particular connection structure can be constructed. The invention in which the circuit does not include a capacitor with a particular connection structure can be constructed. For example, the invention in which a sixth transistor whose gate is connected to a gate of the third transistor is not included can be constructed. Further, the invention in which a capacitor whose first electrode is connected to the gate of the third transistor is not included can be constructed.

As another specific example, a case in which a description of a value, "a voltage is preferably higher than or equal to 3 V and lower than or equal to 10 V" is provided is considered. In that case, for example, the case where the voltage is higher than or equal to −2 V and lower than or equal to 1 V can be excluded from the invention. Further, the case where the voltage is higher than or equal to 13 V can be excluded from the invention. Note that, for example, the voltage may be higher than or equal to 5 V and lower than or equal to 8 V in the invention. Note that, for example, the voltage may be approximately 9 V in the invention. Note that, for example, the voltage may be higher than or equal to 3 V and lower than or equal to 10 V and may exclude 9 V in the invention.

As another specific example, a case in which a description "a voltage is preferably 10 V" is provided is considered. In that case, for example, the case where the voltage is higher than or equal to −2 V and lower than or equal to 1 V can be excluded from the invention. Further, the case where the voltage is higher than or equal to 13 V can be excluded from the invention.

As still another specific example, a case in which a description "a film is an insulating film" is provided is considered. In that case, for example, the case where the insulating film is an organic insulating film can be excluded from the invention. Further, the case where the insulating film is an inorganic insulating film can be excluded from the invention.

As another specific example, a case in which a description of a stacked structure, "a film is provided between A and B" is provided is considered. In that case, for example, the case where the film is a stacked film of four or more layers can be excluded from the invention. Further, for example, the case where a conductive film is provided between A and the film can be excluded from the invention.

In one embodiment of the present invention, an adverse effect of variations in the threshold voltage of transistors can be reduced. Further in one embodiment of the present invention, an adverse effect of variations in the mobility of transistors can be reduced. Further in one embodiment of the present invention, an adverse effect of deterioration of a transistor can be reduced. Further in one embodiment of the present invention, an adverse effect of deterioration of a display element can be reduced. Further in one embodiment of the present invention, display unevenness can be reduced. Further in one embodiment of the present invention, an image can be displayed with high display quality. Further in one embodiment of the present invention, a desired circuit can be achieved with a small number of transistors. Further in one embodiment of the present invention, a desired circuit can be achieved with a small number of wirings. Further in one embodiment of the present invention, manufacture through a small number of steps can be achieved.

BRIEF DESCRIPTION OF THE DRAWINGS

In the accompanying drawings:

FIGS. 4A and 4B are circuit diagrams showing one embodiment of the present invention;

FIGS. 17A and 17B are circuit diagrams showing one embodiment of the present invention;

FIG. 27 is a top view illustrating one embodiment of the present invention;

FIGS. 37A to 37C illustrate a crystal structure of an oxide material;

FIGS. 41A and 41B are a top view and a cross-sectional view, respectively, illustrating one embodiment of the present invention;

DETAILED DESCRIPTION OF THE INVENTION

Figure 1:
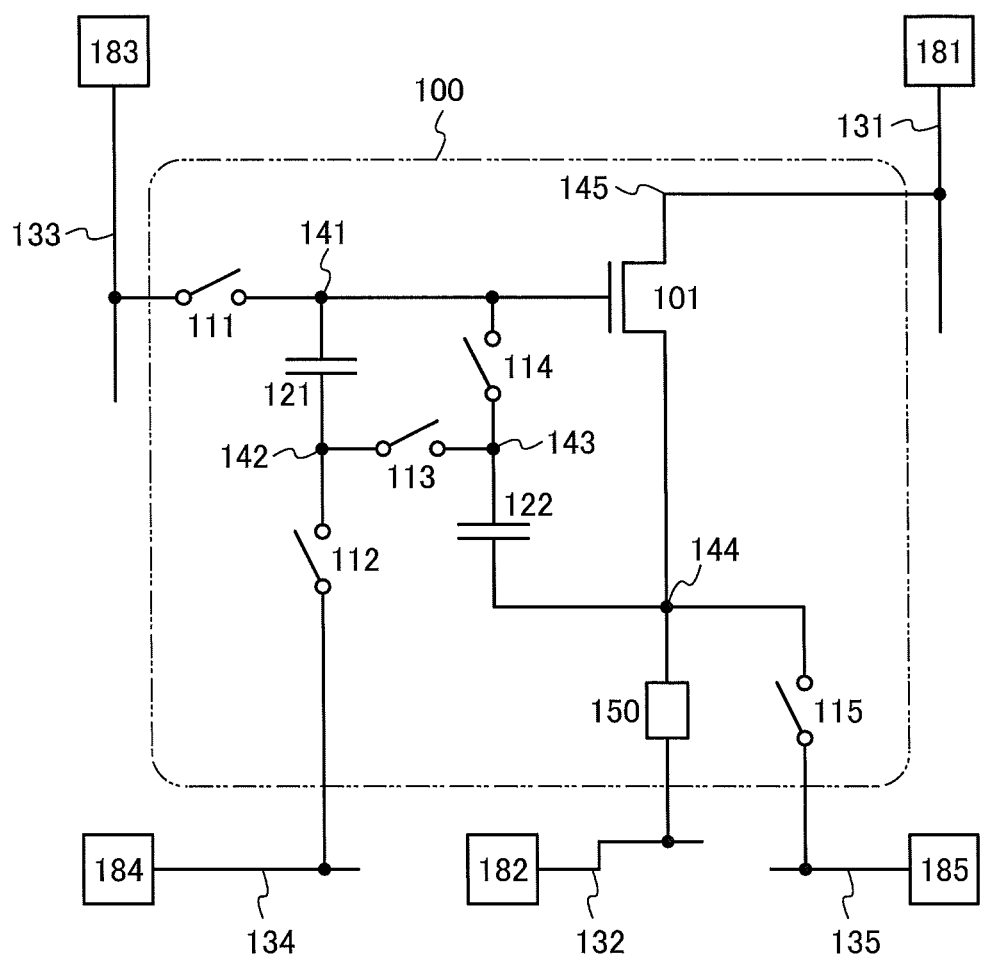
FIG. 1 is a circuit diagram illustrating one embodiment of the present invention.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Accordingly, the present invention should not be construed as being limited to the description of the embodiments below. In structures given below, the same portions or portions having similar functions are denoted by the same reference numerals in different drawings, and explanation thereof will not be repeated.

Note that what is described (or part thereof) in one embodiment can be applied to, combined with, or exchanged with another content in the same embodiment and/or what is described (or part thereof) in another embodiment or other embodiments.

Note that a structure illustrated in a drawing (or part thereof) in one embodiment can be combined with a structure of another part illustrated in the drawing, a structure illustrated in another drawing (or part thereof) in the embodiment, and/or a structure illustrated in a drawing (or part thereof) in another or other embodiments.

Note that size, thickness, or regions in the drawings are exaggerated for clarity in some cases. Thus, one aspect of an embodiment of the present invention is not limited to such scales. Further, the drawings are schematic views of ideal examples. Thus, one aspect of an embodiment of the present invention is not limited to shapes and the like illustrated in the drawings. For example, variations in shape due to a manufacturing technique or dimensional deviation can be included.

Note that an explicit description "X and Y are connected" can mean that X and Y are electrically connected, that X and Y are functionally connected, and that X and Y are directly connected. Here, each of X and Y denotes an object (e.g., a device, an element, a circuit, a wiring, an electrode, a terminal, a conductive film, or a layer). Accordingly, a connection relation other than connection relations illustrated in drawings and texts is also included, without limitation to a predetermined connection relation, for example, the connection relations illustrated in the drawings and the texts.

For example, in the case where X and Y are electrically connected, one or more elements which enable electrical connection between X and Y (e.g., a switch, a transistor, a capacitor, an inductor, a resistor, a diode, a display element, a light-emitting element, and/or a load) can be connected between X and Y. Note that a switch is controlled to be turned on or off. That is, the switch has a function of determining whether to supply a current by being turned on or off (being brought into an on state or an off state).

For example, in the case where X and Y are functionally connected, one or more circuits which enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that, for example, in the case where a signal output from X is transmitted to Y even when another circuit is interposed between X and Y, X and Y are functionally connected.

Note that an explicit description "X and Y are connected" can mean that X and Y are electrically connected, that X and Y are functionally connected, and that X and Y are directly connected. That is, when it is explicitly described that "X and Y are electrically connected", the description can have the same meaning as the explicit description "X and Y are connected."

Note that, even when independent components are electrically connected to each other in a circuit diagram, there is a case where one conductive layer has functions of a plurality of components (e.g., a wiring and an electrode), such as a case where part of a wiring also functions as an electrode. The "electrical connection" in this specification can also mean that one conductive layer has functions of a plurality of components.

Note that it might be possible for those skilled in the art to construct one embodiment of the invention even when all the portions to which terminals of an active element (e.g., a transistor or a diode), a passive element (e.g., a capacitor or a resistor), or the like are connected are not specified. In particular, in the case where the number of portions to which a terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that it might be possible for those skilled in the art to identify the invention when at least connection in a circuit is specified. Further, it might be possible for those skilled in the art to identify the invention when at least a function of a circuit is specified. Therefore, when connection in a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when the connection is not specified, and one embodiment of the invention can be constituted.

Note that a transistor is an element having at least three terminals: a gate, a drain, and a source. In addition, the transistor has a channel region between the drain (drain terminal, drain region, or drain electrode) and the source (source terminal, source region, or source electrode), and a current can flow through the drain, the channel region, and the source. Here, since the source and the drain may change depending on the structure, the operating condition, and the like of the transistor, it is difficult to define which is a source or a drain. Therefore, in this document (the specification, claims, drawings, the like), a region functioning as a source or a drain is not called the source or the drain in some cases. In that case, for example, one of the source and the drain may be referred to as a first terminal and the other thereof may be referred to as a second terminal. Alternatively, one of the source and the drain may be referred to as a first electrode and the other thereof may be referred to as a second electrode. Alternatively, one of the source and the drain may be referred to as a first region and the other thereof may be referred to as a second region. Alternatively, one of the source and the drain may be referred to as a source region and the other thereof may be referred to as a drain region.

Note that a pixel in this specification corresponds to a display unit controlling the luminance of one color element (e.g., any one of R (red), G (green), and B (blue)). Therefore, in a color display device, the minimum display unit of a color image is composed of three pixels of an R pixel, a G pixel and a B pixel. Note that the color elements for displaying a color image are not limited to three colors, and color elements of more than three colors may be used or a color other than RGB may be used.

Note that terms such as "first", "second", and "third" are used for distinguishing various elements, members, regions, layers, and areas from others. Therefore, the terms such as "first", "second", and "third" do not limit the number of elements, members, regions, layers, areas, and the like. Further, for example, "first" can be replaced with "second", "third", or the like.

Note that a switch is an element having a switching function of bringing terminals into a conduction state (ON) or a non-conduction state (OFF) and a function of determining whether to flow a current. For example, an electrical switch or a mechanical switch can be used as the switch. For example, the switch may be formed using a transistor, a diode, or a switch formed by a micro electro mechanical system (MEMS) technology, such as a digital micromirror device (DMD). Alternatively, the switch may be a logic circuit in which transistors are combined. In the case of employing a transistor as the switch, there is no particular limitation on the polarity (conductivity type) of the transistor. Note that a transistor with small off-state current is preferably used and the polarity of the transistor is preferably selected in accordance with an input potential.

Examples of the transistor with small off-state current are a transistor provided with an LDD region, a transistor with a multi-gate structure, and a transistor in which an oxide semiconductor is used for a semiconductor layer. In the case where a combination of transistors operates as a switch, a complementary switch may be employed by using both an n-channel transistor and a p-channel transistor. A complementary switch achieves appropriate operation even when a potential input to the switch is changed relative to an output potential.

Note that, when a transistor is used as a switch, the switch includes an input terminal (one of a source and a drain), an output terminal (the other of the source and the drain), and a terminal for controlling conduction (gate) in some cases. On the other hand, when a diode is used as a switch, the switch does not have a terminal for controlling conduction in some cases. Therefore, the number of wirings for controlling terminals can be reduced in the case of using a diode as a switch as compared to the case of using a transistor as a switch.

Note that, for example, a transistor with a structure where gate electrodes are provided above and below a channel can be used as a transistor. With the structure where the gate electrodes are provided above and below the channel, a circuit structure where a plurality of transistors is connected in parallel is provided. Thus, a channel region is increased, so that the amount of current can be increased. By employing the structure where the gate electrodes are provided above and below the channel, a depletion layer is easily formed; thus, subthreshold swing (S value) can be improved.

Note that, for example, a transistor with a structure where a source electrode or a drain electrode overlaps with a channel region (or part thereof) can be used as a transistor. By employing the structure where the source electrode or the drain electrode overlaps with the channel region (or part thereof), unstable operation due to electric charge accumulated in part of the channel region can be prevented.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

Embodiment 1

A circuit described in one embodiment of the present invention can be used as a pixel circuit including a light-emitting element, for example. Note that the circuit can be used for not only a pixel circuit but also a circuit functioning as a current source for supplying a current to a load. Further, one aspect of an embodiment of the present invention can also be used as an analog circuit or part of a video signal line driver circuit (source driver), for example.

Note that a current source has a function of supplying a constant current even under conditions where the voltage applied to a load (circuit) connected to the current source changes. As a power source other than the current source, a voltage source can be given. The voltage source has a function of supplying a constant voltage even under conditions where the current flowing through a load (circuit) connected to the voltage source changes. Thus, the current source and the voltage source both have a function of supplying a voltage and a current, but are different from each other in which is supplied from the power source: constant voltage or constant current.

Note that in this specification, a load, for example, refers to various objects such as an object having a rectifying property, an object having capacitance, an object having resistance, a circuit including a switch, and a pixel circuit, and is not limited to a particular object. For example, an object having a rectifying property has current-voltage characteristics showing different resistance values depending on the direction of an applied bias, and has electric characteristics which allow most current to flow only in one direction. In the circuit configuration illustrated in FIG. 1, for example, a load 150 is provided so that current flows from a transistor 101 to a wiring 132.

Since there is a possibility that the load and a circuit including a current source are made by different manufacturers, the circuit including a current source is not necessarily connected to the load.

Other examples of the load 150 are a display element (e.g., a liquid crystal element), a light-emitting element (e.g., an EL element, an inorganic LED element, an LED chip), and part of a display element or a light-emitting element (e.g., a pixel electrode, an anode electrode, a cathode electrode). In this embodiment, an example of the case of using a light-emitting element (an EL element or the like) as a load in a pixel circuit of a display device, which is one embodiment of a semiconductor device, will be described.

First, an example of a pixel circuit of the present invention will be described with reference to FIG. 1. A pixel circuit 100 illustrated in FIG. 1 includes a transistor 101, a load 150, a switch 111, a switch 112, a switch 113, a switch 114, a switch 115, a capacitor 121, and a capacitor 122.

The capacitors can be omitted when gate capacitance (parasitic capacitance) of the transistor is utilized. Therefore, the pixel circuit 100 can have a structure without the capacitors.

The pixel circuit 100 illustrated in FIG. 1 has a circuit for discharging electric charge held in a gate of the transistor in order to correct variations in current characteristics such as the threshold voltage of the transistor. In practice, the pixel circuit 100 has such a connection relation that variations in current characteristics of the transistor can be corrected by controlling the switching of a plurality of switches provided between wirings.

Further, the pixel circuit 100 has a function of a current source circuit that can supply a current to the load 150.

One electrode (terminal) of the switch 111 is connected to a wiring 133, and the other electrode (terminal) of the switch 111 is connected to one electrode (terminal) of the capacitor 121. A node where the other electrode of the switch 111 and one electrode of the capacitor 121 are connected to each other is a node 141. The other electrode of the capacitor 121 is connected to one electrode of the switch 112. A node where the other electrode of the capacitor 121 and one electrode of the switch 112 are connected to each other is a node 142. The other electrode of the switch 112 is connected to a wiring 134. One electrode of the switch 114 is connected to the node 141, and the other electrode of the switch 114 is connected to one electrode of the capacitor 122. A node where the other electrode of the switch 114 and one electrode of the capacitor 122 are connected to each other is a node 143. The other electrode of the capacitor 122 is connected to one electrode of the switch 115, and the other electrode of the switch 115 is connected to a wiring 135. A node where the other electrode of the capacitor 122 and one electrode of the switch 115 are connected to each other is a node 144. One electrode of the switch 113 is connected to the node 142, and the other electrode of the switch 113 is connected to the node 143. One (also referred to as a first electrode (terminal)) of a source and a drain of the transistor 101 is connected to the node 144, the other (also referred to as a second electrode (terminal)) of the source and the drain of the transistor 101 is connected to a wiring 131, and a gate of the transistor 101 is connected to the node 141. One electrode of the load 150 is connected to the node 144, and the other electrode of the load 150 is connected to the wiring 132. A node to which the second electrode of the transistor 101 is connected is a node 145. In FIG. 1, the second electrode of the transistor 101 and the wiring 131 are connected to each other via the node 145.

The pixel circuit 100 illustrated in FIG. 1 is connected to the wiring 131, the wiring 132, the wiring 133, the wiring 134, and the wiring 135. In FIG. 1, the wiring 131, the wiring 132, the wiring 133, the wiring 134, and the wiring 135 connected to the pixel circuit 100 are provided outside the pixel circuit 100. In an actual case, however, the wirings are electrically connected to the pixel circuit 100; therefore, in the following description, the pixel circuit 100 may be regarded as including the wirings.

For example, the wiring 131 is connected to a circuit 181 that supplies at least a high potential side power supply potential VDD (hereinafter simply referred to as VDD). Note that depending on the conductivity type of the transistor 101 or the current characteristics of the load 150, the circuit 181 supplies a low potential side power supply potential VSS (hereinafter simply referred to as VSS). Examples of the circuit 181 include a power supply circuit and an amplifier circuit. Accordingly, the wiring 131 has a function of transmitting or supplying the potential VDD. Alternatively, the wiring 131 has a function of supplying a current to the transistor 101. Alternatively, the wiring 131 functions as a power supply line. Alternatively, the wiring 131 has a function of supplying a current to the load 150. Alternatively, for example, there is a case in which a potential for making the load 150 in a reverse bias state or a potential for controlling the potential of the node 144 is supplied to the wiring 131. Note that it is preferable that a constant potential be supplied to the wiring 131. However, the potential supplied to the wiring 131 is not limited to a constant potential in one aspect of an embodiment of the present invention, and a non-constant potential such as a pulse signal may be supplied. Examples of the circuit 181 in such a case include a digital circuit, a shift register circuit, and a scan line driver circuit.

For example, the wiring 133 is connected to at least a circuit 183 having a function of supplying a video signal Vsig (hereinafter simply referred to as Vsig). An example of the circuit 183 is a source driver (a signal line driver circuit). Accordingly, the wiring 133 has a function of transmitting or supplying Vsig. Further, in some cases, a precharge signal, an initialization signal, a signal for making the load 150 in a reverse bias state, or the like may be supplied to the wiring 133.

For example, Vsig has a potential that varies in accordance with the amount of current that is to be supplied to the load 150. For example, if the current supplied to the load 150 is constant, Vsig is a constant-potential signal, and if not, Vsig is a signal with a potential which changes over time in accordance with the amount of current which is to be supplied to the load 150. Using this signal, images can be displayed.

For example, the wiring 134 is connected to at least a circuit 184 that supplies a potential V1 (hereinafter simply referred to as V1). Examples of the circuit 184 include a power supply circuit and an amplifier circuit. Accordingly, the wiring 134 has a function of transmitting or supplying V1. Alternatively, the wiring 134 has a function of supplying electric charge to the capacitor 121. Alternatively, the wiring 134 has a function of fixing the potential of the node 142 at V1. Note that it is preferable that a constant potential be supplied to the wiring 134. However, the potential supplied to the wiring 134 is not limited to a constant potential in one aspect of an embodiment of the present invention, and a non-constant potential such as a pulse signal may be supplied. Examples of the circuit 184 in such a case include a digital circuit, a shift register circuit, and a scan line driver circuit.

For example, the wiring 135 is connected to at least a circuit 185 that supplies a potential V2 (hereinafter simply referred to as V2). Examples of the circuit 185 include a power supply circuit and an amplifier circuit. Accordingly, the wiring 135 has a function of transmitting or supplying V2. Alternatively, the wiring 135 has a function of supplying electric charge to the capacitor 122. Alternatively, the wiring 135 has a function of fixing the potential of the node 144 at V2. Alternatively, the wiring 135 has a function of fixing the potential of the source of the transistor 101 at V1. Alternatively, the wiring 135 has a function of capable of initializing the transistor 101. Note that it is preferable that a constant potential be supplied to the wiring 135. However, the potential supplied to the wiring 135 is not limited to a constant potential in one aspect of an embodiment of the present invention, and a non-constant potential such as a pulse signal may be supplied. Examples of the circuit 185 in such a case include a digital circuit, a shift register circuit, and a scan line driver circuit.

For example, the wiring 132 is connected to at least a circuit 182 that supplies a potential V3 (hereinafter simply referred to as V3). Examples of the circuit 182 include a power supply circuit and an amplifier circuit. Accordingly, the wiring 132 has a function of transmitting or supplying V3. Alternatively, the wiring 132 has a function of supplying electric charge to the load 150. Alternatively, the wiring 132 has a function of fixing the potential of a cathode of the load 150 at V3. Note that it is preferable that a constant potential be supplied to the wiring 132. However, the potential supplied to the wiring 132 is not limited to a constant potential in one aspect of an embodiment of the present invention, and a non-constant potential such as a pulse signal may be supplied. Examples of the circuit 182 in such a case include a digital circuit, a shift register circuit, and a scan line driver circuit.

The capacitor 121 and the capacitor 122 may have a structure where an insulating film is sandwiched between wirings, semiconductor layers, electrodes, or the like, for example. The capacitor 121 has a function of holding a voltage that depends on Vsig, for example. The capacitor 122 has a function of holding a voltage that depends on characteristics (e.g., a voltage that depends on the threshold voltage, a voltage that depends on the mobility) of the transistor 101, for example. Alternatively, the capacitor 122 has a function of holding a voltage corresponding to the amount of current supplied to the load 150.

Next, as an example, an operation of the pixel circuit 100 in the case of using a light-emitting element typified by an electroluminescent element (EL element) as the load 150 will be described with reference to FIGS. 2A to 2C, FIG. 3, FIGS. 4A and 4B, FIGS. 5A and 5B, FIG. 6, FIGS. 7A to 7D, and FIG. 8. This operation can be similarly performed in the cases where the load 150 is an element other than the EL element.

Figure 2A:
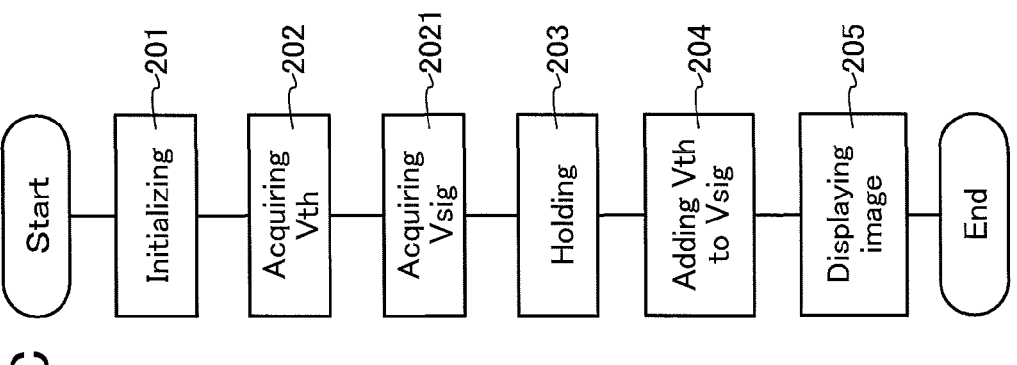
FIGS. 2A to 2C are flow charts showing one embodiment of the present invention.
Figure 2B:
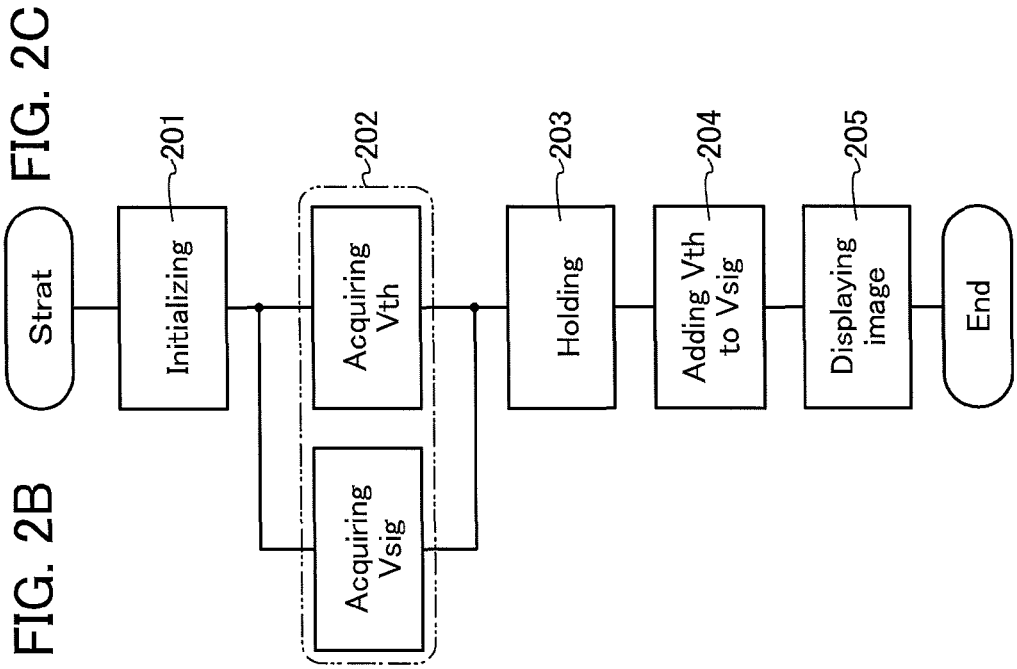
Figure 2C:
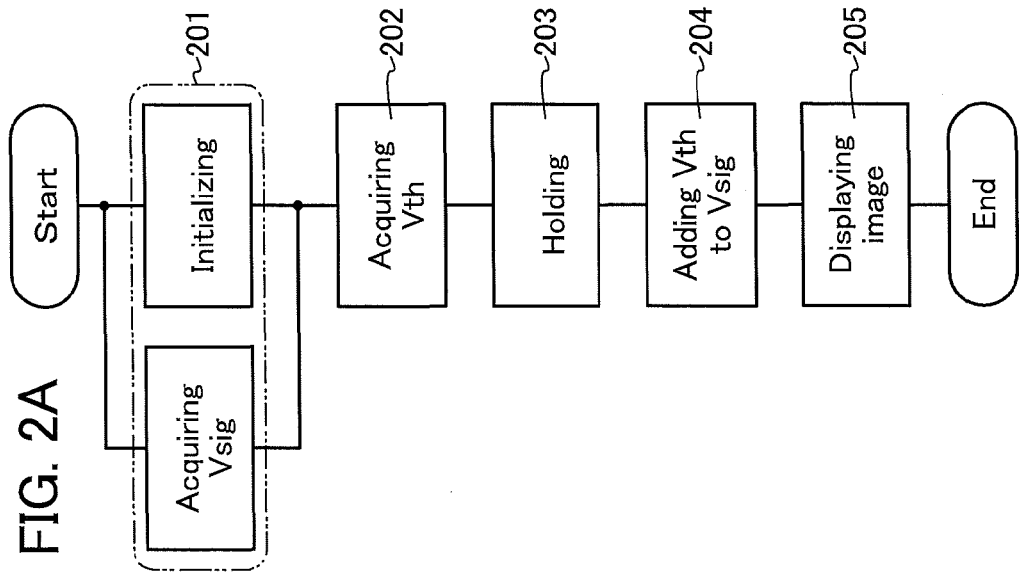

FIGS. 2A to 2C are each a flow chart showing operations from a period 201 to a period 205. FIG. 2A is a flow chart in the case of performing an initialization operation and a Vsig acquisition operation in the period 201, and FIG. 2B is a flow chart in the case of performing a Vth acquisition operation and a Vsig acquisition operation in the period 202. The period 203 may be omitted as appropriate. The Vsig acquisition operation may be performed in the period 203. Further, the period 204 and the period 205 may be performed in the same period. The Vth acquisition operation and the Vsig acquisition operation may be performed in separate periods or in the same period.

FIG. 2C is a flow chart in the case of performing a Vsig acquisition operation after a Vth acquisition operation is performed. As shown in FIG. 2C, after a Vth acquisition operation is performed in the period 202, a Vsig acquisition operation may be performed in a period 2021. Note that after a Vsig acquisition operation is performed in the period 202, a Vth acquisition operation may be performed in the period 2021. Since the Vth acquisition operation and the Vsig acquisition operation are not performed in the same period, one more operation period is necessary compared with the flows in FIGS. 2A and 2B. However, the semiconductor device can operate more precisely.

As shown in FIGS. 2A to 2C, the periods 201 to 205 are provided in separate periods. This makes it easy for each of the operations to be performed precisely. In particular, long operation periods can be ensured as the period 201, the period 202, the period 2021, the period 204, and/or the period 205, whereby the semiconductor device can operate more precisely.

Note that in the flow charts in FIGS. 2A to 2C, another operation can be additionally performed between steps or at the same time as a step.

It is preferable that the next step start after a previous step is completely finished. However, without limitation thereto, in one aspect of an embodiment of the present invention, the next step can start before a previous step is completely finished.

Further, although the periods 201 to 205 are provided in separate periods in FIGS. 2A to 2C, the provision of the periods 201 to 205 is not limited to that in this example in one aspect of an embodiment of the present invention.

Figure 3:
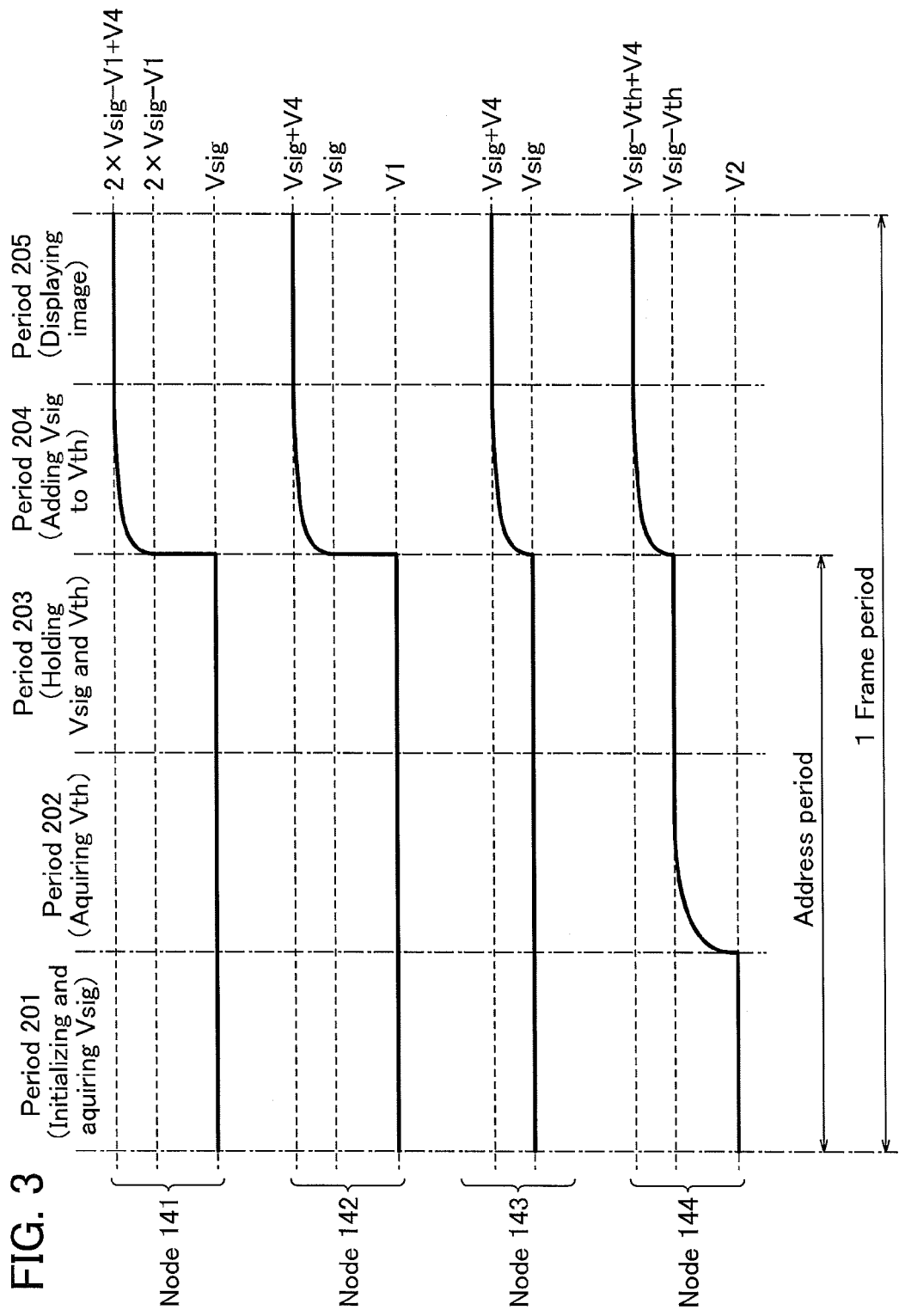
FIG. 3 is a timing chart showing one embodiment of the present invention.

FIG. 3 shows an example of a timing chart showing an operation of the pixel circuit 100 corresponding to the flow chart of FIG. 2A. Here, as an example, a case in which the potential of the wiring 131 is higher than that of the wiring 132 is described. That is, the source of the transistor 101 is the terminal connected to the node 144. In FIG. 3, one frame period includes the period 201 in which an initialization operation and a Vsig acquisition operation are performed, the period 202 in which an operation of acquiring a threshold voltage Vth of the transistor 101 (hereinafter simply referred to as Vth) is performed, the period 203 in which an operation of holding Vth and Vsig is performed, the period 204 in which Vth is added to Vsig, and the period 205 in which an image display operation is performed. However, without limitation to this, in one aspect of an embodiment of the present invention, for example, part of the periods (e.g., the period 203) can be omitted, or another period can be further added.

One frame period corresponds to a period for displaying an image for one screen, and the periods 201 to 203 or the periods 201 to 204 can be collectively referred to as an address period.

FIGS. 4A and 4B, FIGS. 5A and 5B, FIG. 6, FIGS. 7A to 7D, and FIG. 8 are circuit diagrams showing an example of the operation of the pixel circuit 100 in each operation period. FIGS. 7A to 7D and FIG. 8 are circuit diagrams which simply show the operation of the pixel circuit 100 by omitting the switches 111 to 115 illustrated in FIGS. 4A and 4B, FIGS. 5A and 5B, and FIG. 6. In this embodiment, as an example, the electrode connected to the node 144 of the electrodes included in the load 150 serves as an anode, and the electrode connected to the wiring 132 serves as a cathode. The load 150 emits light when the difference between the potential of the anode and the potential of the cathode in the load 150 exceeds $V_{EL}$ (the threshold voltage of the load 150). As an example in this embodiment, an n-channel transistor is used as the transistor 101. Accordingly, when the difference Vgs (hereinafter simply referred to as Vgs) between the potential of the gate electrode and the potential of the source electrode in the transistor 101 exceeds Vth, the source electrode and the drain electrode are electrically connected to each other (on state).

Here, Vsig is a signal which corresponds to the video signal for displaying a grayscale image in the pixel, and is in this embodiment a potential corresponding to a luminance data. Note that Vsig with which the maximum luminance is obtained is VsigH, and Vsig with which the minimum luminance is obtained is VsigL. That is, the potential of Vsig changes between VsigL and VsigH. Further, Vsig may be an analog signal having a potential that continuously changes or a digital signal having a potential that changes between discrete values.

It is preferable that V1 be a fixed potential during at least the period 201 and the period 202. For example, V1 can be set at a potential equal to that of VsigL. Note that in this specification, the term "equal" includes an error of 20% or less, preferably 10% or less, further preferably 5% or less. By adjusting the potential V1, Vgs of the transistor 101 can be changed.

It is preferable that V2 and V3 be each a fixed potential during at least the period 201. Further, V2 and V3 are preferably lower than VDD. In the case of using an n-channel transistor as the transistor 101, it is preferable that V2 and V3 be potentials lower than (VDD−Vth). For example, V2 and V3 may be a GND potential or a VSS potential. However, in one aspect of an embodiment of the present invention, V2 and V3 are not limited to the potentials described above.

Further, V3 is preferably set so as to satisfy V3≥Vsig−Vth−$V_{EL}$, according to Formula 3. However, V3 is not limited to this value in one aspect of an embodiment of the present invention. In addition, V3 is preferably determined in consideration of variations (fluctuations) in Vth and $V_{EL}$. Further, the potentials V1, V2, and V3 may be varied as necessary.

The following description in this embodiment is given on the assumption, as an example, that Vth is 2 V, $V_{EL}$ is 1 V, VsigH is 5 V, VsigL is 0 V, V1 is 0 V, V2 is −3 V, and V3 is 2V.

Figure 7A:
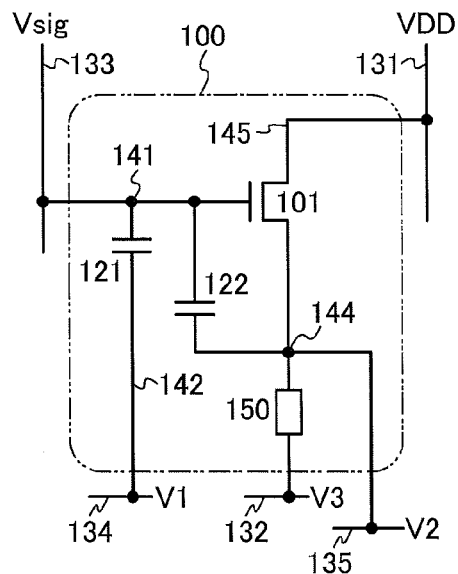
FIGS. 7A to 7D are circuit diagrams showing one embodiment of the present invention.

First, in the period 201, an initialization operation and a Vsig acquisition operation of the pixel circuit 100 are performed (see FIG. 4A and FIG. 7A). The initialization operation is an operation of accumulating electric charge necessary for turning on the transistor 101 in the capacitor 122 and turning on the transistor 101. Further, the initialization operation is also an operation of setting the potential of the node 144 so that the terminal on the node 144 side of the transistor 101 serves as a source. In the period 201, it is preferable to stop supply of electric charge to the load 150. In this embodiment, it is preferable to stop light emission from the load 150 in the period 201.

In the period 201, the switch 111, the switch 112, the switch 114, and the switch 115 are in an on state, and the switch 113 is in an off state. Under this condition, the potential of the node 141 is Vsig, and the potential of the node 142 is V1. The potential of the node 143 is Vsig, and the potential of the node 144 is V2. Since the transistor 101 is an n-channel transistor in this embodiment, by setting V2 at a potential lower than VDD, the terminal on the node 144 side of the transistor 101 serves as a source and the terminal on the wiring 131 side serves as a drain.

Further, V2 is preferably set so as to satisfy Formula 1. When V2 is set so as to satisfy Formula 1, the difference between the potential of the node 144 and the potential of the wiring 132 can become lower than or equal to $V_{EL}$, or a state in which a reverse bias is applied to the load 150 can be made. Accordingly, an increase in power consumption caused by unnecessary flow of current to the load 150 can be prevented. Since a light-emitting element is used as an example of the load 150 in this embodiment, unnecessary light emission from the load 150 can be prevented. Alternatively, the reverse bias state can reduce deterioration of the load 150 and improve the characteristics of the deteriorated load 150.

$$V2 \leq V_{EL} + V3 \quad \text{[FORMULA 1]}$$

In order to assure Vth acquisition, which is performed later, Vsig is preferably set so as to satisfy Formula 2.

$$Vsig > Vth + V2 \quad \text{[FORMULA 2]}$$

In the case of FIG. 2A, a Vsig acquisition operation is also performed in the period 201. The Vsig acquisition operation is an operation of writing a voltage that depends on Vsig in the capacitor 121. By making the switch 113 in an off state and the switches 111 and 112 in an on state, a voltage difference between Vsig and V1 is supplied to the capacitor 121. Since V1 is 0 V in this embodiment, a voltage of Vsig is input to the capacitor 121.

Vsig is a potential corresponding to luminance data and ranges from VsigH to VsigL. In this embodiment, potentials of from 5 V to 0 V corresponding to the luminance data are supplied as Vsig to the node 141 and the node 143. In addition, it is assumed that V1, V2, and V3 are 0 V, −3 V, and 2V respectively and that 0 V, −3 V, and 2V are supplied to the node 142, the node 144, and the cathode of the load 150 connected to the wiring 132, respectively. Note that it is preferable to determine V2 and Vsig in consideration of variations (fluctuations) in Vth and $V_{EL}$.

Note that in the case of not performing the Vsig acquisition operation, the switch 112 and the switch 113 may be in an off state. In such a case, the node 142 is in a floating state.

Alternatively, in such a case, the switch 112 may be in an off state and the switch 113 may be in an on state.

As shown in FIG. 2B, the Vsig acquisition operation may be performed in the period 202. In the case of performing the Vsig acquisition operation in the period 202, if the switch 112 is in an off state in the period 201, the switch 113 may be in an on state in the period 201 so that electric charge is not accumulated in the capacitor 121. That is, a video signal may or may not be written to the capacitor 121 in the period 201. In other words, instead of completely supplying a video signal to the capacitor 121 in the period 201, the video signal may start being supplied to the capacitor 121 in the period 201 and finish writing the signal in the period 202. That is, the Vsig acquisition operation may be performed through the period 201 and the period 202.

Figure 7B:
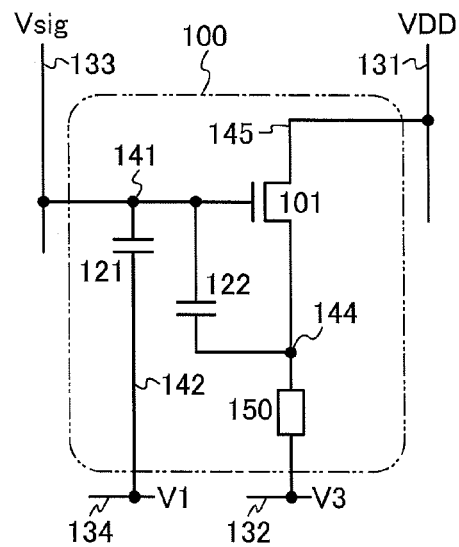

Next, in the period 202, an operation of acquiring Vth of the transistor 101 is performed (see FIG. 4B and FIG. 7B). The Vth acquisition operation is an operation of writing a voltage that depends on Vth to the capacitor 122. Note that the voltage written to the capacitor 122 is not necessarily completely equal to Vth of the transistor 101.

First, after the period 201 is finished, the switch 115 is turned off. By turning off the switch 115, the node 144 is brought into a floating state. However, since the transistor 101 is in on state in the period 201, a current flows from the wiring 131 to the node 144 through the transistor 101.

By the flow of a current to the node 144 through the transistor 101 under the condition where the node 144 is in a floating state, the potential of the node 144 is increased in accordance with the amount of the current flow. When the difference (Vgs) between the potential of the node 143 and the potential of the node 144 reaches Vth, the transistor 101 is turned off and the increase in the potential of the node 144 stops. Alternatively, when Vgs becomes close to Vth, the current flowing through the transistor 101 becomes small, leading to a gradual increase in the potential of the node 144. Thus, the potential of the node 144 increases to (Vsig–Vth) or a potential close thereto. At this time, Vgs is accumulated in the capacitor 122. That is, a potential that is substantially equal to Vth of the transistor 101 is written to the capacitor 122.

Note that in some cases, it takes a very long time until Vgs reaches the threshold voltage Vth of the transistor 101. Accordingly, in many cases, the operation of the pixel circuit 100 is performed without Vgs being completely decreased to the threshold voltage Vth. That is, since the transistor 101 is an n-channel transistor in this embodiment, the period 202 is finished in many cases when Vgs becomes a value that is slightly higher than the threshold voltage Vth. In the case of using a p-channel transistor as the transistor 101, the period 202 is finished in many cases when Vgs becomes a value that is slightly lower than the threshold voltage Vth. Therefore, the potential difference Vgs at the time when the period 202 is finished can be expressed as a voltage that depends on Vth of the transistor 101.

The potential of the node 144 is increased until the transistor 101 is turned off. Accordingly, the potential of the node 144 can become higher than the potential of the node 141. Thus, the threshold voltage Vth of the transistor 101 can be acquired in both cases in which the threshold voltage of the transistor 101 is a positive value (a normally-off or enhancement transistor) and in which the threshold voltage of the transistor 101 is a negative value (a normally-on or depletion transistor). Further, even in the case where the transistor 101 changes from a normally-off type to a normally-on type due to deterioration of the transistor, the threshold voltage of the transistor 101 can be acquired.

The time until Vgs reaches the threshold voltage Vth of the transistor 101 (the time until the transistor 101 is turned off through the increase in the potential of the node 144) varies depending on the mobility of the transistor 101. That is, the time until Vgs reaches the threshold voltage Vth is shorter in the transistor 101 having a higher mobility than in the transistor 101 having a lower mobility; in other words, the transistor 101 having a lower mobility needs longer time than the transistor 101 having a higher mobility. Accordingly, by discharging the transistor 101 having a higher mobility and the transistor 101 having a lower mobility for the same period of time, Vgs in the case of using the former transistor can be low, and Vgs in the case of using the latter transistor can be high. That is, by appropriately setting the discharging time, variations in mobility can be corrected in acquiring Vgs. As a result, variations in luminance due to the variations in mobility can be reduced. Specifically, the period 202 is finished before Vgs reaches the threshold voltage Vth of the transistor 101 having a high mobility.

Note that if the difference between the potential of the node 144 and the potential of the wiring 132 becomes larger than $V_{EL}$ by increasing the potential of the node 144, a current flows through the load 150 to prevent the difference between the potential of the node 143 and the potential of the node 144 from reaching Vth, in some cases. For this reason, Vsig is preferably set so as to satisfy the relation of Formula 3. However, Vsig is not limited to this example in one embodiment of the present invention.

$$V\text{sig} \leq V_{EL} + V3 + V\text{th} \quad \text{[FORMULA 3]}$$

In this embodiment, it is assumed that Vsig is 5 V to 0 V, $V_{EL}$ is 1 V, V3 is 2 V, and Vth is 2 V. These assumed values satisfy the relation of Formula 3.

In the period 202, the switch 112 may be either in an on state or an off state, or alternatively the state of the switch 112 may be changed in the period 202. In the case of acquiring Vsig in the period 202 as shown in the flow chart of FIG. 2B, the switch 113 is in an off state and the switch 111 and the switch 112 are in an on state in the period 202. In the case of acquiring Vsig in the period 201, the switch 112 may be in an off state in the period 202 to make the node 142 in a floating state. In other words, Vsig is written to the capacitor 121 in one of the period 201 and the period 202 or in both of the periods. In the case of writing Vsig in both of the periods, long time can be spent in inputting the signal; consequently, the signal can be input more precisely.

Figure 5A:
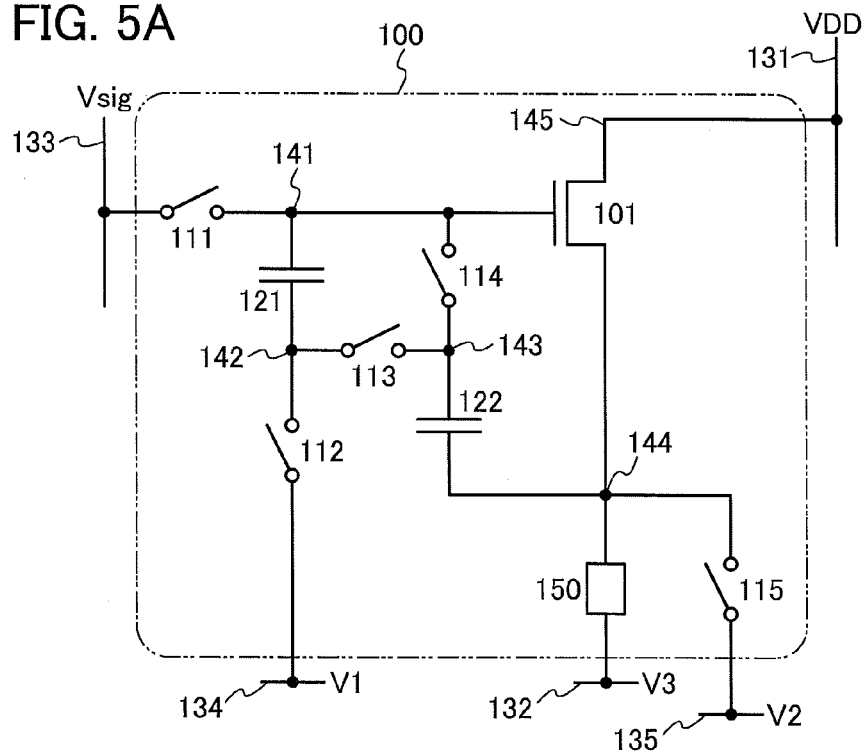
FIGS. 5A and 5B are circuit diagrams showing one embodiment of the present invention.
Figure 5B:
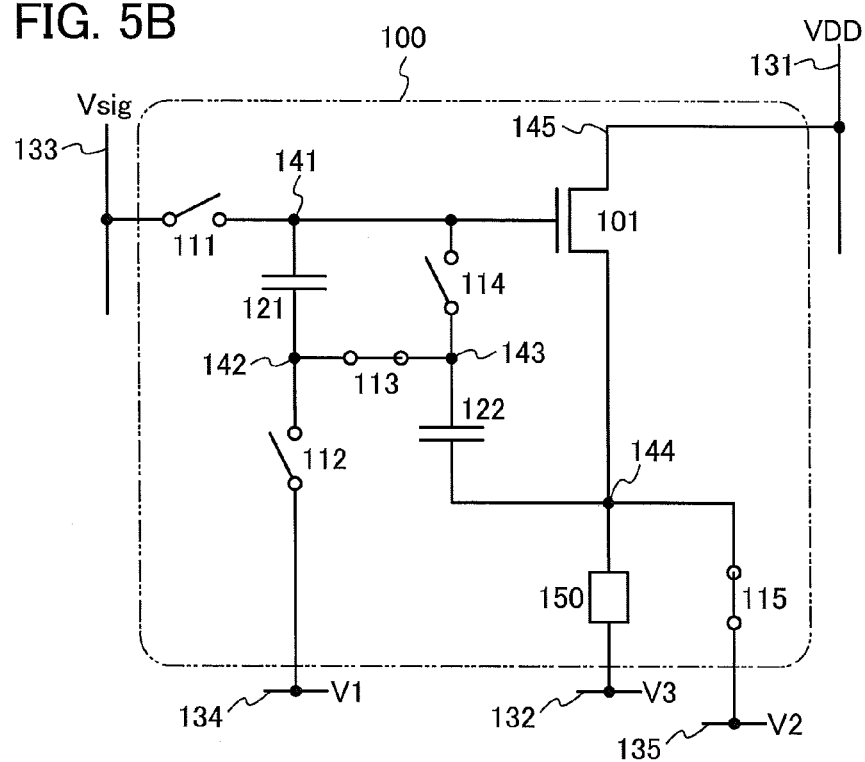
Figure 6:
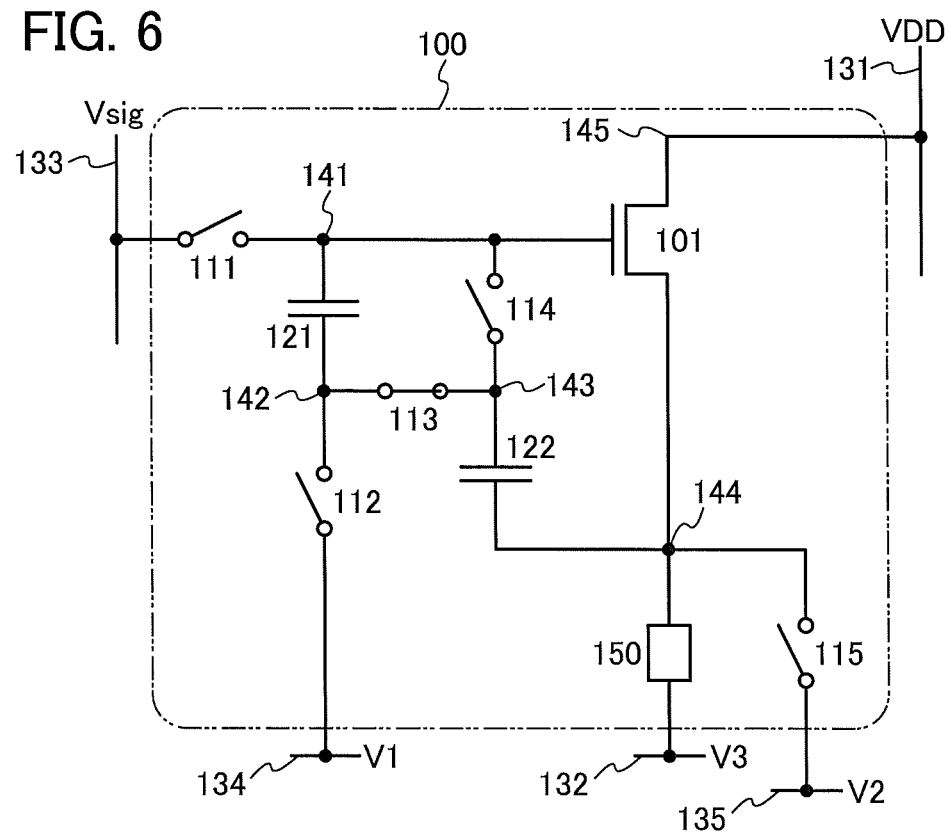
FIG. 6 is a circuit diagram showing one embodiment of the present invention.
Figure 7C:
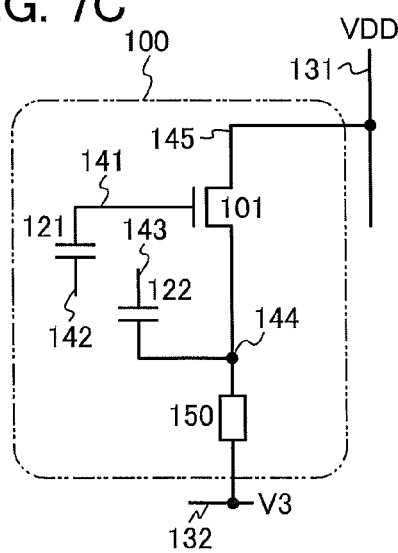
Figure 7D:
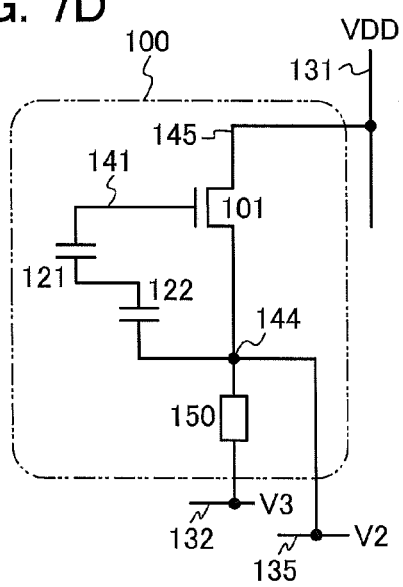
Figure 8:
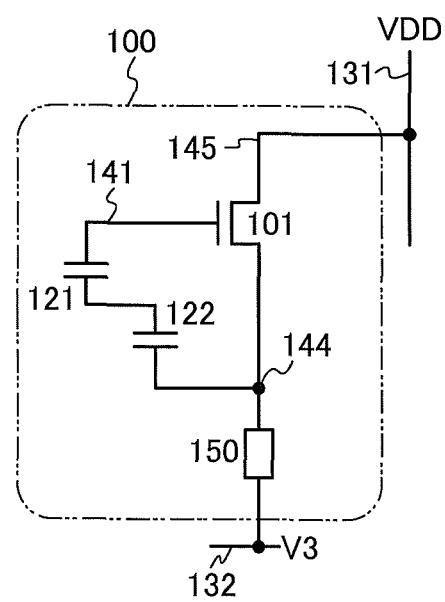
FIG. 8 is a circuit diagram showing one embodiment of the present invention.

Next in the period 203, the switches 111 to 115 are in an off state to perform an operation of holding the acquired Vsig and Vth (see FIG. 5A and FIG. 7C). At this time, a voltage (Vsig–V1) is held in the capacitor 121, and a voltage that depends on Vth is held in the capacitor 122. It is preferable that (Vsig–V1) be higher than 0 V at this time, in order to supply a current from the transistor 101 to the load 150 in the period 205. However, in the case of displaying a black image, in order to further reduce an off-state current of the transistor 101, (Vsig–V1) is set to be a negative voltage in some cases. This can further lower the luminance in displaying a black image, improving contrast.

Since the nodes 141 to 144 are in a floating state in the period 203, even when the potentials of the wirings 133 to 135 vary, the voltages written to the capacitor 121 and the capacitor 122 can be held.

Note that in the period 203, the switch 115 may be in an on state, which can suppress unnecessary light emission from the load 150.

In the period 203, the conduction between the wiring 133 and the node 141 is not established. Therefore, in the case where another pixel circuit 100 is connected to the wiring 133, the period 201 can start in the pixel circuit 100. That is, the switch 111 may be in an on state in another pixel circuit 100. In this way, even under conditions where a plurality of pixel circuits 100 is connected to the wiring 133, it is possible to provide periods enough to operate each pixel circuit 100; accordingly, a precise signal can be acquired.

In this embodiment, a voltage of 5 V to 0 V is held in the capacitor 121 and 2 V is held in the capacitor 122.

Note that the period 204 can be provided after the period 202 without providing the period 203.

Next in the period 204, an operation of adding the voltage of the capacitor 121 to the voltage of the capacitor 122 is performed. The sum of the voltages is Vgs of the transistor 101. In the period 204, the switch 111, the switch 112, and the switch 114 are turned off, and the switch 113 and the switch 115 are turned on. Then, the capacitor 121 and the capacitor 122 are connected in series, so that a sum of the voltages held in the capacitor 121 and the capacitor 122 is applied between the gate and the source of the transistor 101 (see FIG. 5B and FIG. 7D).

In this embodiment, Vsig and Vth are acquired independently, and then the operation of adding the voltages is performed. That is, the Vth acquisition operation, the Vsig acquisition operation, and the operation of adding Vth to Vsig are not performed at the same time.

At this time, it is preferable that after the switch 111, the switch 112, and the switch 114 are turned off, the switch 113 and the switch 115 are turned on. This is because when the switch 112 and the switch 113 are in an on state at the same time for example, there arises a possibility that V1 may be supplied to the node 143 to fluctuate the voltage held in the capacitor 122.

Note that when the switch 113 is in an on state in the period 204, the voltage of the capacitor 121 is added to the voltage of the capacitor 122 to make the transistor 101 in a conduction state, so that current flows. Further, by making the switch 115 in an on state, the potential of the node 144 is fixed at V2. Consequently, the aforementioned current flows to not the load 150 but the wiring 135 through the switch 115, and the load 150 does not emit light.

The potential of the node 141 at the moment in which the switch 113 is turned on can be expressed as 2×Vsig−V1. The difference between the potential of the node 141 and the potential of the node 144 corresponds to Vgs, and Vgs can be expressed as Vsig−V1+Vth. In this embodiment, since V1 is assumed to be 0 V, Vgs can be expressed as Vsig+Vth.

Next in the period 205, the switch 115 is turned off. Then, a current corresponding to Vgs flows through the transistor 101 and the load 150. The potential of the node 144 is increased in accordance with the value of the flowing current, and the load 150 (the light-emitting element in this embodiment) emits light (see FIG. 6 and FIG. 8).

If the switch 115 is turned off in the period 204, the period 205 for an image displaying operation starts right after the period 204 or in substantially the same period as the period 204.

Since the nodes 141 to 143 are in a floating state, the potentials of the nodes 141 to 143 also increase in accordance with the increase in the potential of the node 144. That is, since the gate potential of the transistor 101 increases in accordance with the increase in the potential of the source of the transistor 101, Vgs of the transistor 101 does not change. In other words, a bootstrap operation is performed.

When using the structure disclosed in this embodiment, even when Vth of the transistor 101 is changed due to deteriorations or the like, a voltage that depends on the changed Vth can be held in the capacitor 122. That is, even when Vth of the transistor 101 is changed, a current corresponding to Vsig can be precisely supplied to the load 150.

Furthermore, even when Vth of the transistor 101 varies among the plurality of pixel circuits 100, Vth of the transistor 101 can be regarded as substantially the same without variations among the pixel circuits 100. Accordingly, by employing the structure disclosed in this embodiment for a display device, the display device can have favorably high display quality.

Furthermore, Vth and Vsig of the transistor 101 can be written to different capacitors and then the voltages can be added and supplied as Vgs of the transistor 101. This method enables each of the operations of acquiring the voltages to be performed precisely, so that variations in potential due to distortion of a signal waveform can be prevented. In this embodiment, by employing the structure disclosed in this embodiment for a display device, the display device can have favorably high display quality.

Further, with the structure disclosed in this embodiment, Vth and Vsig can be held after being acquired; accordingly, it is possible to start flowing a current to the load 150 with an enough time margin. Accordingly, the load on a peripheral driver circuit can be reduced and power consumption can be reduced.

In the period 205, a current I flowing through the load 150 in the case where the transistor 101 operates in a saturation region can be expressed by Formula 4.

$$I = \frac{1}{2}\left(\frac{W}{L}\right)\mu Cox(Vsig)^2 \qquad \text{[FORMULA 4]}$$

In the period 205, the current I flowing through the load 150 in the case where the transistor 101 operates in a linear region can be expressed by Formula 5.

$$I = \left(\frac{W}{L}\right)\mu Cox\left[(Vsig)Vds - \frac{1}{2}Vds^2\right] \qquad \text{[FORMULA 5]}$$

In the formulae, W is the channel width of the transistor 101; L, the channel length; μ, the mobility; Cox, accumulated capacitance; and Vds, voltage between the drain and the source.

According to Formulae 4 and 5, the current flowing to the load 150 does not depend on Vth of the transistor 101 in both cases where the operation region of the transistor 101 is the saturation region and where the operation region is the linear region. Therefore, variations in the current I caused by variations in Vth of the transistor 101 can be suppressed and a current value corresponding to luminance data can be supplied to the load 150.

Accordingly, variations in the luminance of the load 150 caused by variations in Vth of the transistor 101 can be suppressed.

Furthermore, when the transistor 101 is operated in the saturation region, it is also possible to suppress variations in luminance caused by deterioration of the load 150 or variations in characteristics of the load 150. When the load 150 deteriorates, $V_{EL}$ of the load 150 and voltage-current characteristics of the load 150 vary, whereby the potential of the node 144 also varies. That is, the potential of the source of the transistor 101 varies. At this time, the gate of the transistor 101 is connected to the node 141, and the gate of the transistor 101 is in a floating state. Therefore, in accordance with the variations in the potential of the source, the potential of the gate of the transistor 101 also variations by the same amount as the variations in the potential of the source. Accordingly, since Vgs of the transistor 101 does not change in accordance with the change in $V_{EL}$, a current flowing to the transistor 101 and the load 150 is not affected even if the load 150 deteriorates. Note that it is found also in Formula 4 that the current I flowing to the load 150 does not depend on the potential of the source and the potential of the drain.

Accordingly, in the case of operating the transistor 101 in a saturation region, variations in the current flowing through the transistor 101 caused by deteriorations and variations in characteristics of the transistor 101 and the load 150 can be suppressed.

Note that in the case of operating the transistor 101 in the saturation region, as the channel length L is shorter, a larger amount of current easily flows by avalanche breakdown when a drain voltage is extremely increased.

When the drain voltage is increased to exceed a pinch-off voltage, a pinch-off point moves to the source side and an effective channel length which substantially functions as a channel decreases. This increases a current value, and such a phenomenon is called channel length modulation or the kink effect. Note that the pinch-off point is a boundary portion at which the channel disappears and the thickness of the channel below the gate in that portion is 0. In addition, the pinch-off voltage means a voltage at the time when the pinch-off point is at the drain edge. This phenomenon will also occur more easily as the channel length L is shorter.

Accordingly, in the case of operating the transistor 101 in the saturation region, the current I with respect to Vds is preferably as constant as possible. Thus, the channel length L of the transistor 101 is preferably longer. For example, the channel length L of the transistor is preferably larger than the channel width W. In addition, the channel length L is preferably more than or equal to 10 μm and less than or equal to 50 μm, and further preferably more than or equal to 15 μm and less than or equal to 40 μm. It is preferable that the transistor 101 have a longer channel length L than other transistors included in the pixel circuit 100 (e.g., the switches 111 to 115 in the case of using transistors as the switches 111 to 115) or transistors included in the circuits 181 to 185. However, the channel length L and the channel width W of the transistor 101 are not limited to the ranges described here.

Note that since the number of minority carriers is remarkably small in a channel formation region of the transistor including an oxide semiconductor, the pinch-off phenomenon is unlikely to occur. Thus, by using a transistor including an oxide semiconductor in a channel formation region as the transistor 101, influence of the deterioration of the load 150 can be made small.

Note that since variations of the current value caused by variations in Vth of the transistor can be suppressed as described above, a supply destination of current controlled by the transistor in the present invention is not particularly limited. Therefore, an EL element (an organic EL element, an inorganic EL element, or an EL element including both an organic material and an inorganic material) can be typically used as the load 150. Alternatively, an electron emitter, a liquid crystal element, electronic ink, or the like can be used.

Note that it is only necessary for the transistor 110 to have a function of controlling a current or voltage supplied to the load 150, so that various types of transistors can be used as the transistor 101 without a particularly limitation. For example, a thin film transistor (TFT) using a crystalline semiconductor film, a thin film transistor using a non-single crystal semiconductor film typified by amorphous silicon or polycrystalline silicon, a transistor formed using a semiconductor substrate or an SOI substrate, a MOS transistor, a junction transistor, a bipolar transistor, a transistor using a compound semiconductor such as GaAS or CdTe, a transistor using an oxide semiconductor such as ZnO or InGaZnO, a transistor using an organic semiconductor or a carbon nanotube, or the like can be used as the transistor 101.

Note that by using parasitic capacitance generated in the pixel circuit 100 or the gate capacitance of the transistor 101 as the capacitor 121 and the capacitor 122, the capacitor 121 and the capacitor 122 can be omitted. The pixel configuration disclosed in this embodiment is only an example; therefore, one or more of the transistor 101, the load 150, the switch 111, the switch 112, the switch 113, the switch 114, the switch 115, the capacitor 121, and the capacitor 122 can be omitted or connection relations of these components can be changed within the scope of technical idea of the present invention. Further, part of or all of the configuration may be provided with another element or wiring.

Thus, one embodiment of the present invention can be rephrased as a semiconductor device which includes or does not include the transistor 101, which includes or does not include the load 150, which includes or does not include the switch 111, which includes or does not include the switch 112, which includes or does not include the switch 113, which includes or does not include the switch 114, which includes or does not include the switch 115, which includes or does not include the capacitor 121, and which includes or does not include the capacitor 122.

Further, although an example of the operation of the pixel circuit 100 has been described using the periods 201 to 205 here, the example of the operation disclosed in this embodiment is only an example; therefore, one or more of the periods 201 to 205 can be omitted. The order of the periods can be changed, or another period can be newly added within the scope of technical idea of the present invention. Furthermore, part or all of the periods 201 to 205 may be provided with an operation that is not disclosed in this embodiment.

Thus, one embodiment of the present invention can be rephrased as a method for driving a semiconductor device which includes or does not include the period 201, which includes or does not include the period 202, which includes or does not include the period 203, which includes or does not include the period 204, and which includes or does not include the period 205.

The formulae used in the above description are strictly for describing an example of the operation conditions. Therefore, it is needless to say that in one embodiment of the present invention, the above formulae may or may not be used.

Further, configurations illustrated in FIG. 9, FIG. 10, FIG. 11, FIG. 12, FIG. 13, and FIG. 14 can be used. In these circuits, Vth of the transistor 101 can be acquired.

Figure 9:
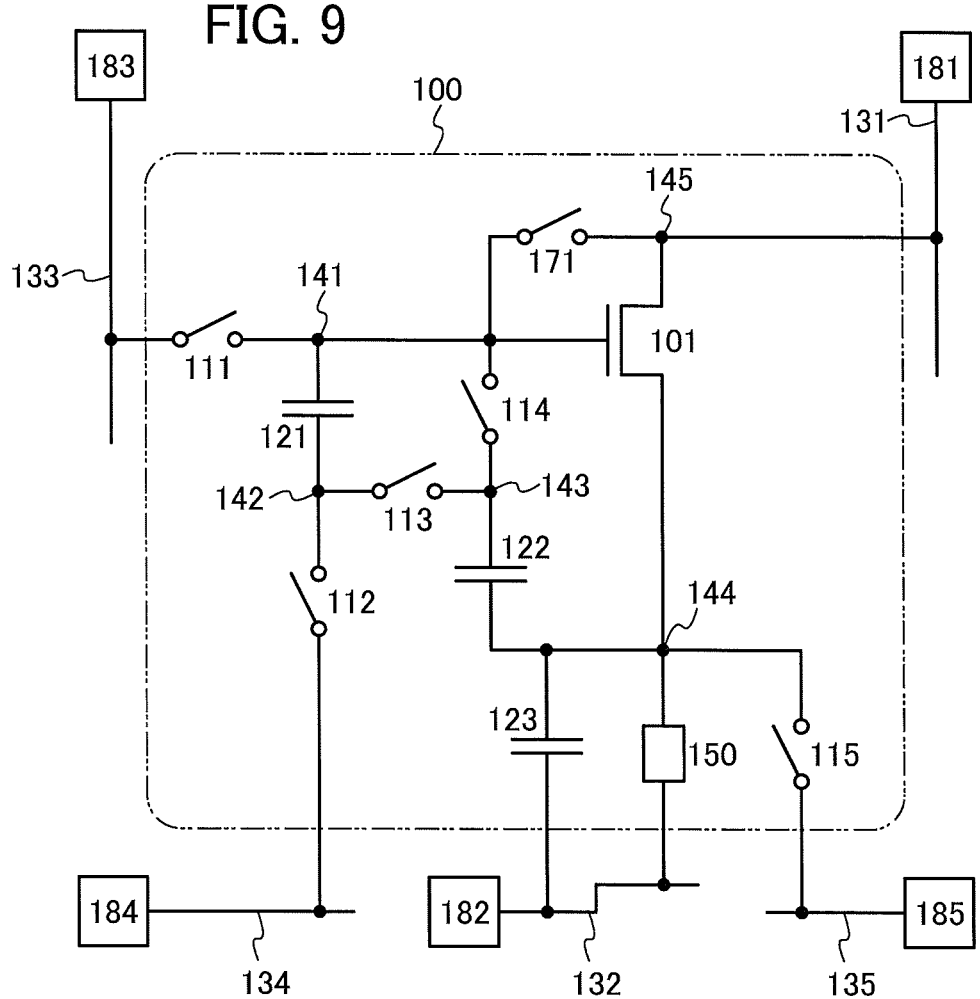
FIG. 9 is a circuit diagram showing one embodiment of the present invention.

The pixel circuit 100 illustrated in FIG. 9 has a configuration in which a switch 171 is provided between the node 141 and the node 145 and a capacitor 123 is provided between the node 144 and the wiring 132 in the pixel circuit 100 illustrated in FIG. 1. The Vth acquisition in the pixel circuit 100 illustrated in FIG. 9 can be performed in the following manner. First, as an initialization operation, the switch 111 and the switch 113 are turned off, and then the switch 171, the switch 114, and the switch 115 are turned on. When the switch 113 is in an off state, the switch 112 may be either in an on state or an off state. When the switch 113 is in an on state, it is preferable to set the switch 112 in an off state. Further, because electric charge of the capacitor 121 is released when the switch 113 is in an on state, the switch 113 is preferably set in an off state when prevention of the release is desired, although the switch 113 may be in an on state. The potentials of the node 141 and the node 145 are VDD, and the potential of the node 144 is V2. At this time, the transistor 101 is in an on state, so that a current flows between the node 145 and the node 144. The potential of the node 144 is kept at V2, and a current does not flow through the load 150. Next, as a Vth acquisition operation, the switch 115 is turned off, so that the potential of the node 144 is increased until the difference between the potential of the node 141 and the potential of the node 144 reaches a voltage that is substantially equal to Vth. Then, the switch 114 is turned off, whereby the voltage that is substantially equal to Vth is held in the capacitor 122. After the Vth acquisition operation, it is preferable to turn off the switch 171.

In the pixel circuit 100 illustrated in FIG. 9, after adding the voltage of the capacitor 121 to the voltage of the capacitor 122 in the period 204, a period 2041 (not illustrated) for turning off the switch 111, the switch 112, and the switch 114 and turning on the switch 113 and the switch 171 may be provided. Note that in the period 2041, the switch 115 may be either in an on state or an off state.

In the period 2041, the voltage between the gate and the source of the transistor 101 is decreased by dVx in accordance with the length of the period 2041. Note that dVx is the amount of potential change that changes in accordance with the length of the period 2041 and electric characteristics of the transistor such as mobility.

By setting the length of the period 2041 as appropriate and setting the voltage between the gate and the source of the transistor 101 to a desired value, variations in the mobility of the transistors 101 among pixels can be reduced and degradation of display quality due to the variations in the mobility of the transistors 101 can be suppressed. Further, by adjusting the capacitance of the capacitor 123, dVx can be changed. Although one terminal of the capacitor 123 is connected to the wiring 132 in FIG. 9, the connection relation of one terminal of the capacitor 123 is not limited to this as long as one terminal of the capacitor 123 is at least connected to a wiring that supplies a fixed potential in the period 2041. For example, one terminal of the capacitor 123 may be connected to the wiring 134, the wiring 135, or a wiring that supplies a common potential (not illustrated).

Note that the capacitor 123 can be provided in the pixel circuit 100 having a configuration other than that illustrated in FIG. 9. Further, the period 2041 can also be applied in the pixel circuit 100 having a configuration other than that illustrated in FIG. 9, to reduce variations in the mobility of the transistors 101.

Even when the period 2041 is not employed, the capacitor 123 can be provided in the pixel circuit 100. On the other hand, the period 2041 can be provided without provision of the capacitor 123.

Figure 10:
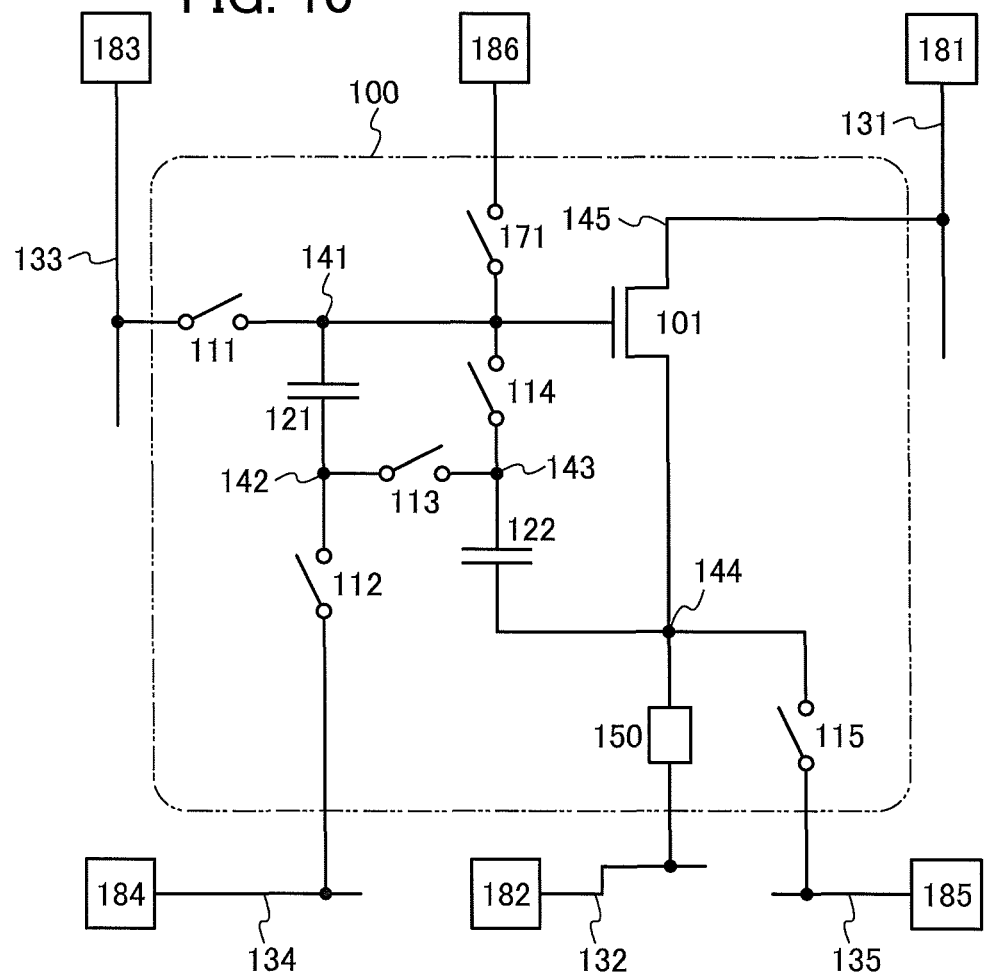
FIG. 10 is a circuit diagram showing one embodiment of the present invention.

The pixel circuit 100 illustrated in FIG. 10 has a configuration in which one terminal of the switch 171 is connected to the node 141 in the pixel circuit 100 illustrated in FIG. 1. The other terminal of the switch 171 is connected to a circuit 186. The circuit 186 can have a configuration similar to those of the circuits 181 to 185. The circuit 186 supplies a potential that turns on the transistor 101 to the node 141 through the switch 171. The Vth acquisition in the pixel circuit 100 illustrated in FIG. 10 can be performed in a manner similar to that of the pixel circuit 100 illustrated in FIG. 9. Note that in this case, the potential of the gate of the transistor 101 at the time when the switch 171 is in an on state can be controlled using the circuit 186. Accordingly, by setting the potential of the gate of the transistor 101 low, the potential of the node 141 can be adjusted so as not to become excessively high at the Vth acquisition operation. Since the potential of the node 141 does not become excessively high, a current does not easily flow to the load 150. Further, since the potential of the gate of the transistor 101 can be controlled, even when the transistor 101 is a normally-on (depletion) transistor, Vth can be acquired without fault.

Figure 11:
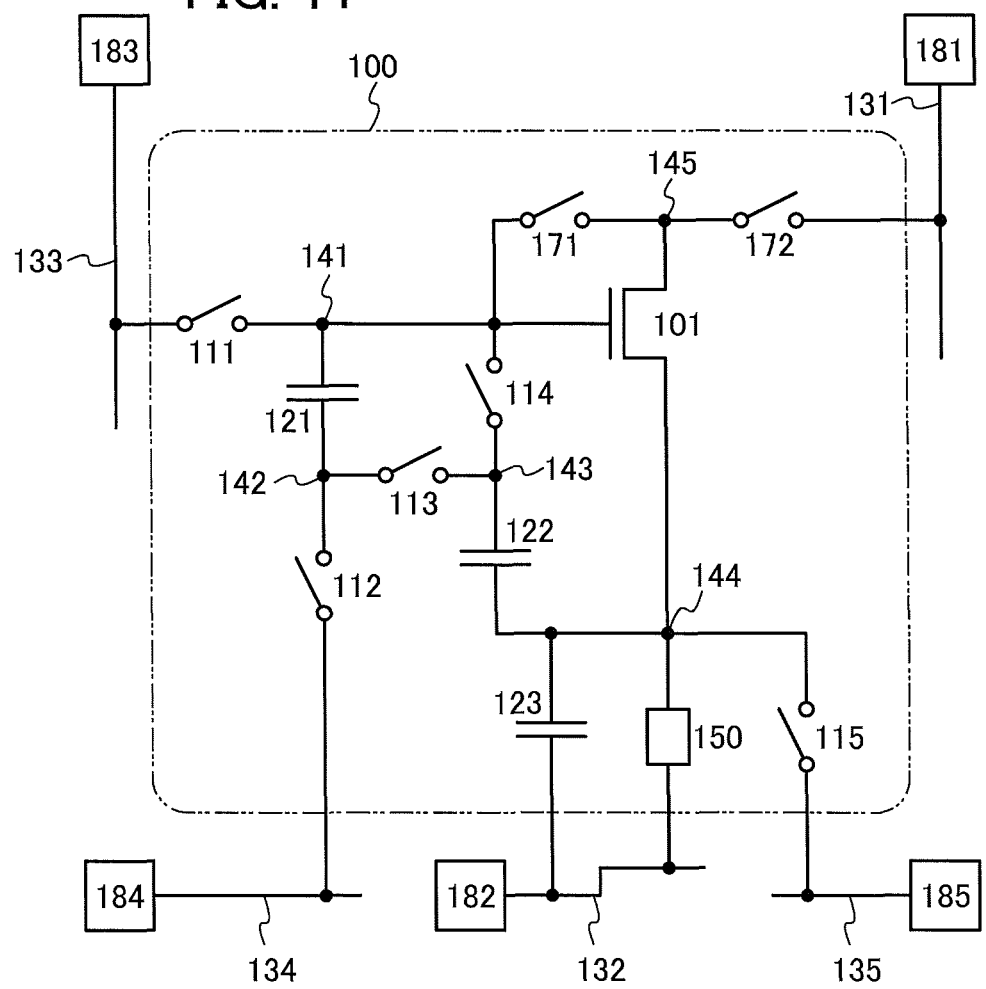
FIG. 11 is a circuit diagram showing one embodiment of the present invention.

The pixel circuit illustrated in FIG. 11 has a configuration in which a switch 172 is provided between the node 145 and the wiring 131 in the pixel circuit 100 illustrated in FIG. 9. The Vth acquisition in the pixel circuit 100 illustrated in FIG. 11 can be performed in the following manner. First, as an initialization operation, the switch 111 and the switch 113 are turned off, and then the switch 171, the switch 172, the switch 114, and the switch 115 are turned on. When the switch 113 is in an off state, the switch 112 may be either in an off state or an off state. When the switch 113 is in an on state, it is preferable to set the switch 112 in an off state. Further, because electric charge of the capacitor 121 is released when the switch 113 is in an on state, the switch 113 is preferably set in an off state when prevention of the release is desired, although the switch 113 may be in an on state. The potentials of the node 141 and the node 145 are VDD, and the potential of the node 144 is V2. At this time, the transistor 101 is in an on state, so that a current flows between the node 145 and the node 144. The potential of the node 144 is kept at V2, and a current does not flow through the load 150. Next, as a Vth acquisition operation, the switch 172 is turned off, so that electric charge accumulated in the capacitor 122 moves in the initialization operation and the potential of the node 145 is increased until when the difference between the potential of the node 141 and the potential of the node 144 reaches a voltage that is substantially equal to Vth. Then, the switch 114 is turned off, whereby the voltage that is substantially equal to Vth is held in the capacitor 122. After the Vth acquisition operation, it is preferable to turn off the switch 171. In the Vth acquisition operation, the switch 115 may be either in an on state or an off state. However, it is preferable to set the switch 115 in an on state in order to stabilize the potential of the node 144.

Figure 12:
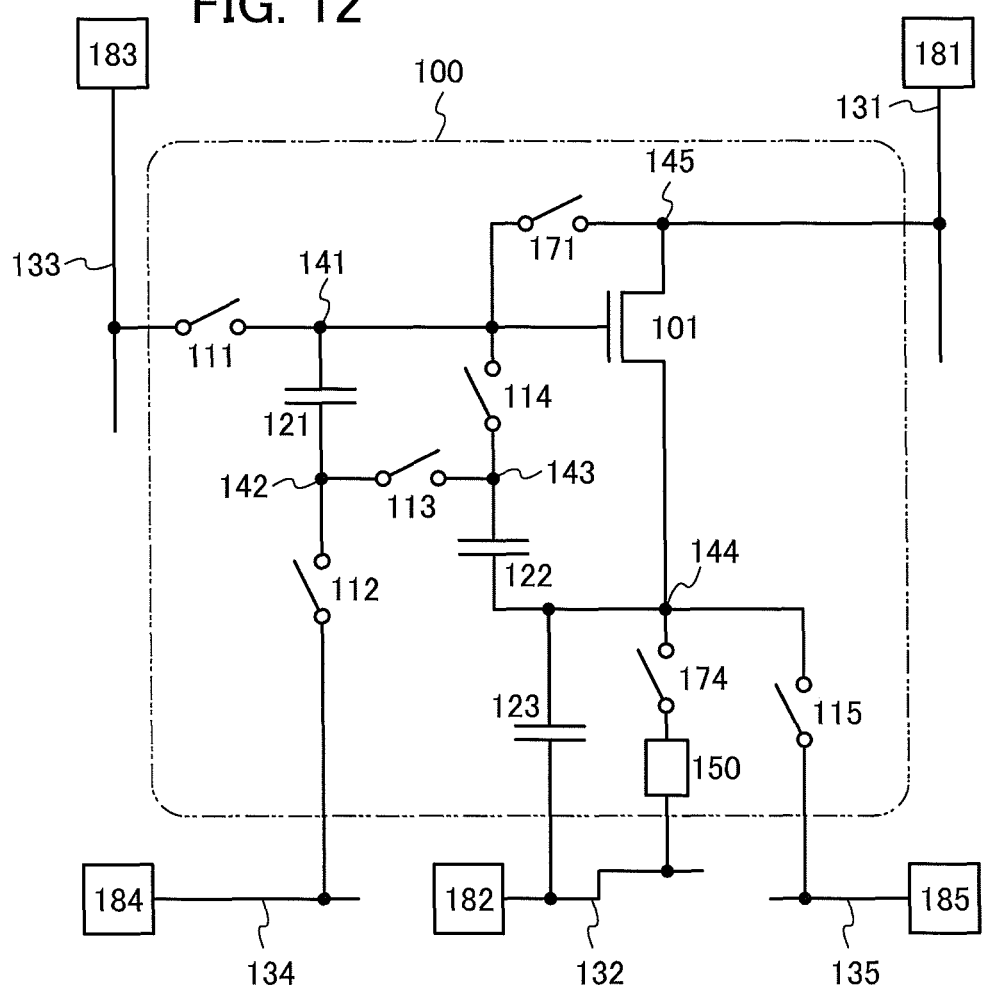
FIG. 12 is a circuit diagram showing one embodiment of the present invention.

The pixel circuit 100 illustrated in FIG. 12 has a configuration in which a switch 174 is provided between the node 144 and the load 150 in the pixel circuit 100 illustrated in FIG. 9. The Vth acquisition in the pixel circuit 100 illustrated in FIG. 12 can be performed in a manner similar to that in the pixel circuit 100 illustrated in FIG. 9. When the switch 174 is in an off state in the initialization operation and the Vth acquisition operation, unnecessary current flow to the load 150 can be prevented even if Formula 1 is not satisfied. Accordingly, the degree of freedom in setting the potentials for the pixel circuit 100 can be increased.

Figure 13:
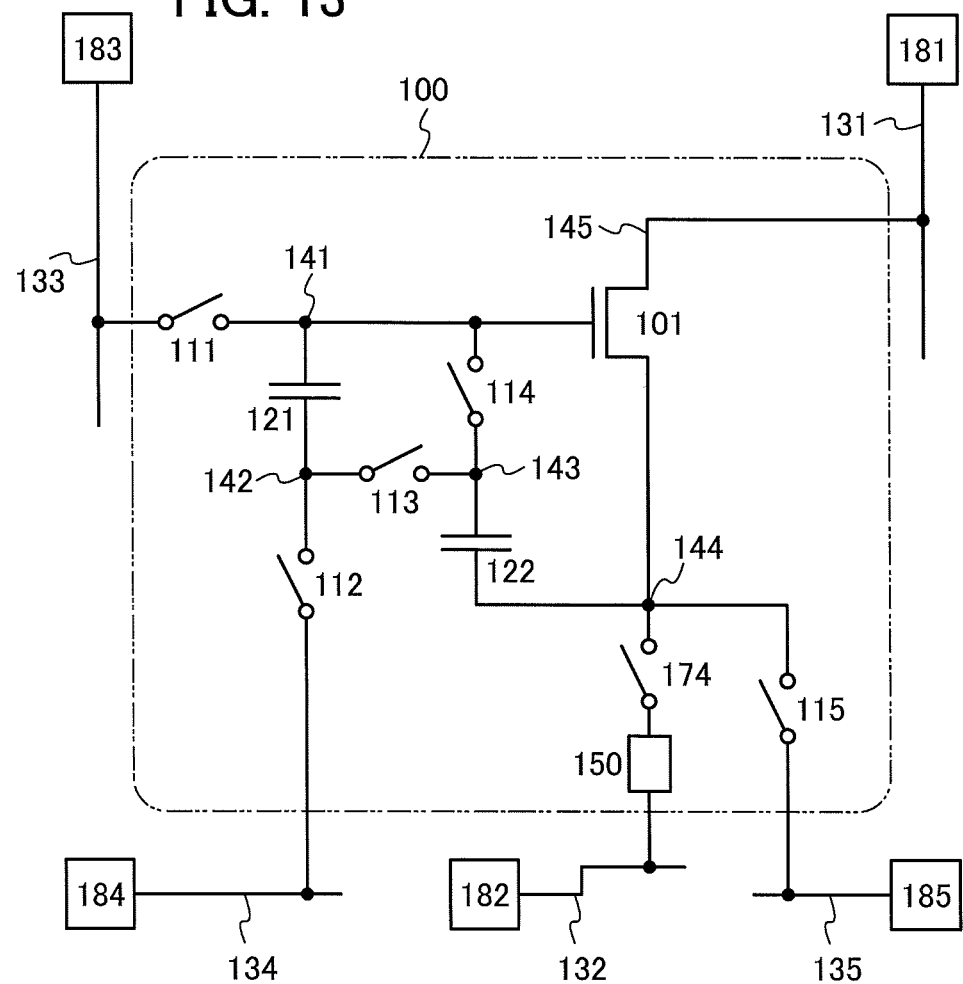
FIG. 13 is a circuit diagram showing one embodiment of the present invention.

The pixel circuit 100 illustrated in FIG. 13 has a configuration in which the switch 174 is provided between the node 144 and the load 150 in the pixel circuit 100 illustrated in FIG. 1. The Vth acquisition in the pixel circuit 100 illustrated in FIG. 13 can be performed in a manner similar to that in the pixel circuit 100 illustrated in FIG. 1. When the switch 174 is in an off state in the initialization operation and the Vth acquisition operation, unnecessary current flow to the load 150 can be prevented even if Formula 1 is not satisfied. Accordingly, the degree of freedom in setting the potentials for the pixel circuit 100 can be increased. Further, by setting the switch 174 in an off state, current flow through the transistor 101 and the load 150 can be prevented. In the case of providing a period in which a current does not flow through the load 150, the provision of such a period can be achieved by controlling the switch 174.

Figure 14:
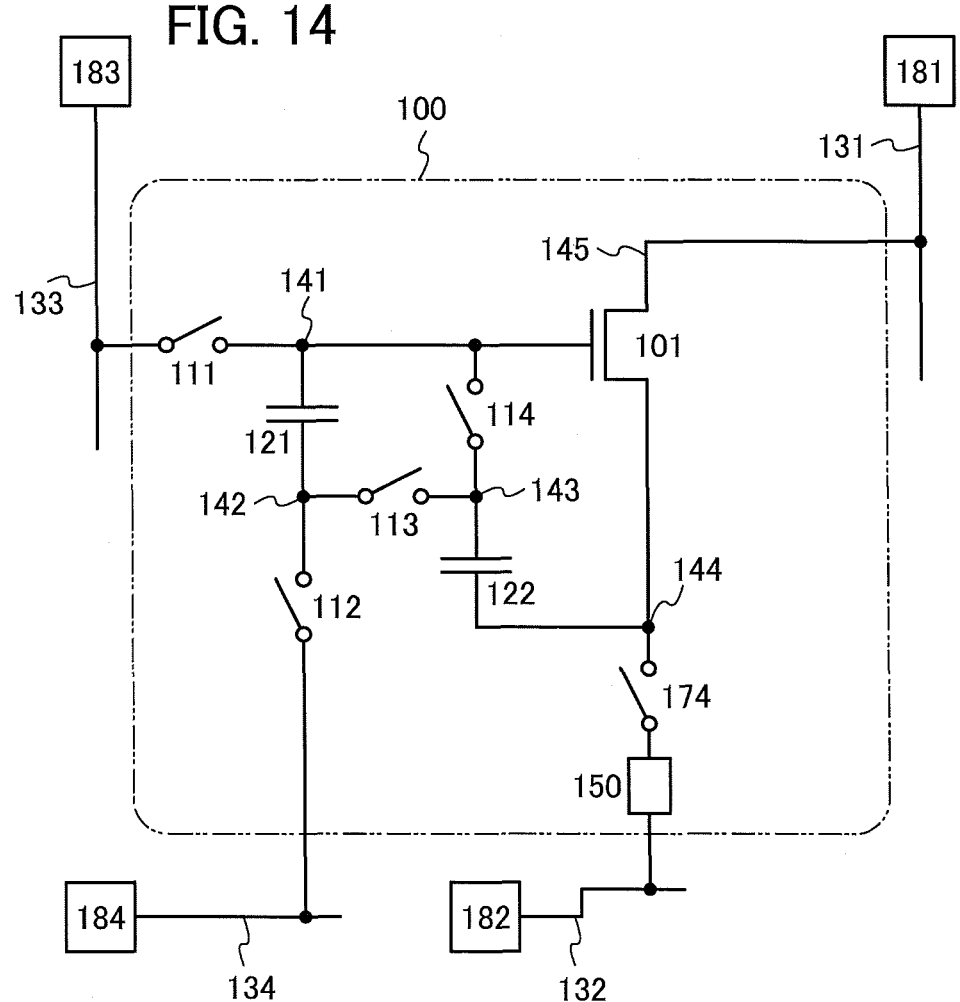
FIG. 14 is a circuit diagram showing one embodiment of the present invention.

The pixel circuit 100 illustrated in FIG. 14 has a configuration in which the switch 115 is removed from the pixel circuit 100 illustrated in FIG. 13. The Vth acquisition in the pixel circuit 100 illustrated in FIG. 14 can be performed in a manner similar to that in the pixel circuit 100 illustrated in FIG. 1 except the point that the operation of the switch 115 is unnecessary. The Vth acquisition in the pixel circuit 100 illustrated in FIG. 14 can be performed by turning off the switch 174 in the Vth acquisition operation. In the periods for operations other than the Vth acquisition operation, the switch 174 is in an on state. Accordingly, the conduction between the node 144 and the wiring 132 is established in the initialization operation; thus, a current flows through the load 150. In other words, in the case of using a light-emitting element as the load 150, light emission is obtained at the initialization period; however, the initialization period is performed in an extremely short time, so that substantial degradation of display quality is not caused.

In the pixel circuits 100 illustrated in FIG. 9, FIG. 10, FIG. 11, FIG. 12, FIG. 13, and FIG. 14, when the switch 113 is in an off state in the initialization period and the Vth acquisition operation, the switch 112 may be either in an on state or an off state. In the pixel circuit 100 illustrated in FIG. 9, FIG. 10, FIG. 11, FIG. 12, FIG. 13, and FIG. 14, Vsig is acquired in the periods for the operations other than the initialization and the Vth acquisition operations; accordingly, Vsig need not satisfy Formula 2. Accordingly, the degree of freedom in setting the potentials for the pixel circuit 100 can be increased. Further, since the initialization operation and the Vth acquisition operation are performed during the time when the switch 111 is in an off state, the initialization operation and the Vth acquisition operation can be performed regardless of the potential of the wiring 133. Accordingly, adequately long periods for the initialization operation and the Vth acquisition operation can be ensured. In the pixel circuits 100 illustrated in FIG. 12, FIG. 13, and FIG. 14, the provision of the switch 174 between the node 144 and the load 150 eliminates the need to consider the conditions in Formula 3. Thus, the degree of freedom in setting the potentials for the pixel circuit 100 can be increased.

Figure 15:
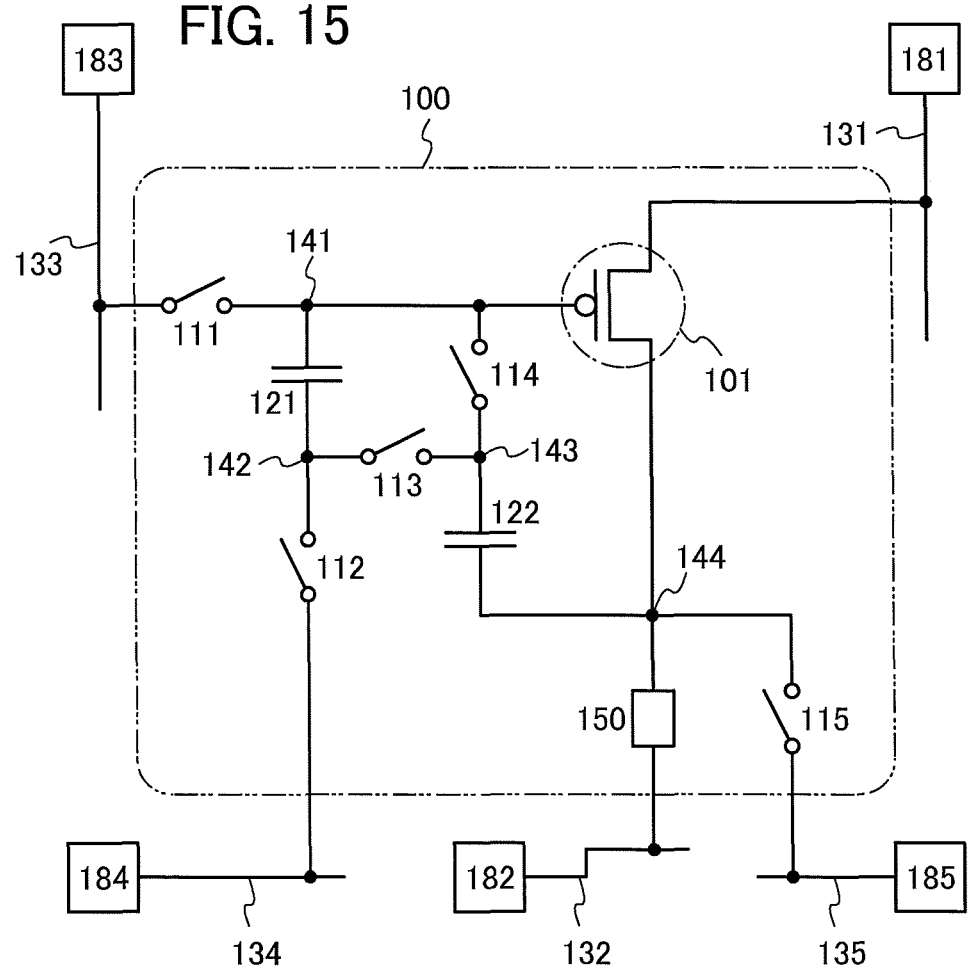
FIG. 15 is a circuit diagram showing one embodiment of the present invention.

In this embodiment, an example in which an n-channel transistor is used as the transistor 101 has been described; however, a p-channel transistor may be used as the transistor 101. FIG. 15 illustrates an example of a pixel circuit in which a p-channel transistor is used as the transistor 101. In the case of using a p-channel transistor as the transistor 101, the potential supplied to the wiring 131 is set lower than V2 and V3, for example, the potential VSS (hereinafter simply referred to as VSS). Of electrode included in the load 150, the electrode connected to the wiring 132 serves as an anode, and the electrode connected to the node 144 serves as a cathode. Further, Formulae 1 to 3 can be applied to the configuration example disclosed in FIG. 15 by reversing the inequality signs in Formulae 1 to 3.

Alternatively, p-channel transistors may be used as the switches 111 to 115, and an n-channel transistor may be used as the transistor 101. Furthermore, the switches included in the pixel circuit 100 may have different conductivity types. For example, the switch 111 may be a p-channel transistor, the switch 112 may be an n-channel transistor, the switch 113 may be a p-channel transistor, the switch 114 may be an n-channel transistor, and the switch 115 may be a p-channel transistor.

Figure 16:
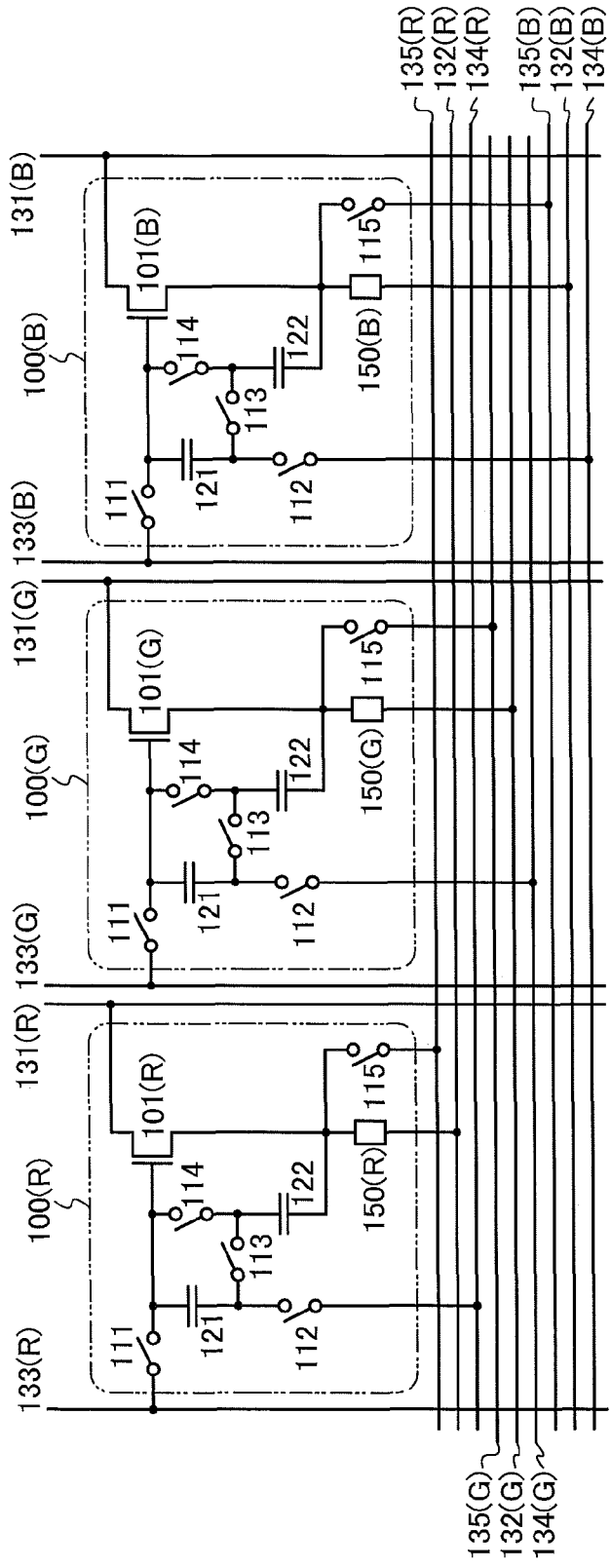
FIG. 16 is a circuit diagram showing one embodiment of the present invention.

FIG. 16 illustrates an arrangement example of the pixel circuits 100 illustrated in FIG. 1. In FIG. 16, the pixel circuit 100(R) corresponds to a pixel for red (R), the pixel circuit 100(G) corresponds to a pixel for green (G), and the pixel circuit 100(B) corresponds to a pixel for blue (B). In one embodiment of the present invention, at least one of a transistor 101(R) in the pixel circuit 100(R), a transistor 101(G) in the pixel circuit 100(G), and a transistor 101(B) in the pixel circuit 100B may differ from the others in the ratio between the channel width and the channel length. With the above structure, currents supplied to a load 150(R) in the pixel circuit 100(R), a load 150(G) in the pixel circuit 100(G), and a load 150(B) in the pixel circuit 100(B) can be set at different values. As the load 150(R), the load 150(G), and the load 150(B), light-emitting elements for the respective colors may be used.

The pixel circuit 100(R) is connected to a wiring 131(R), a wiring 132(R), a wiring 133(R), a wiring 134(R), and a wiring 135(R). The pixel circuit 100(G) is connected to a wiring 131(G), a wiring 132(G), a wiring 133(G), a wiring 134(G), and a wiring 135(G). The pixel circuit 100(B) is connected to a wiring 131(B), a wiring 132(B), a wiring 133(B), a wiring 134(B), and a wiring 135(B).

FIG. 17A illustrates another arrangement example, which is different from that in FIG. 16. FIG. 17A illustrates an example in which a common wiring 131 is used to serve as the wiring 131(R), the wiring 131(G), and the wiring 131(B), to which the corresponding pixels are connected in FIG. 16. The wiring 131 is arranged so as to intersect with the wiring 133(R), the wiring 133(G), and the wiring 133(B).

FIG. 17A illustrates an example in which a common wiring 135 is used to serve as the wiring 135(R), the wiring 135(G), and the wiring 135(B), to which the corresponding pixels are connected in FIG. 16. In addition, FIG. 17A illustrates an example in which a common wiring 132 is used to serve as the wiring 132(R), the wiring 132(G), and the wiring 132(B), to which the corresponding pixels are connected in FIG. 16. Furthermore, FIG. 17A illustrates an example in which a common wiring 134 is used to serve as the wiring 134(R), the wiring 134(G), and the wiring 134(B), to which the corresponding pixels are connected in FIG. 16.

When the configuration illustrated in FIG. 17A is used, the area occupied by wirings in the region where the pixels are provided can be reduced by the space for the removed wirings. Accordingly, higher integration is easy, and a display device with favorable display quality can be obtained. In addition, integration of the semiconductor device can be easy. Further, since the number of peripheral circuits can be reduced in accordance with the removal of the wirings, the number of components constituting the display device can be reduced, leading to improvements in productivity and reliability of the display device.

FIG. 17B illustrates a configuration example in which the wiring 134 and the wiring 135 connected to the pixel circuits 100 illustrated in FIG. 17A are omitted and the terminals connected to the wiring 134 and the wiring 135 in FIG. 17A are connected to the wiring 132. With the configuration illustrated in FIG. 17B, the area occupied by wirings in the region where the pixels are provided can be further reduced.

Part of or the whole of the wirings 131 to 135 in FIG. 16 and FIGS. 17A and 17B may be arranged so as to cross each other or run parallel to each other.

Figure 18:
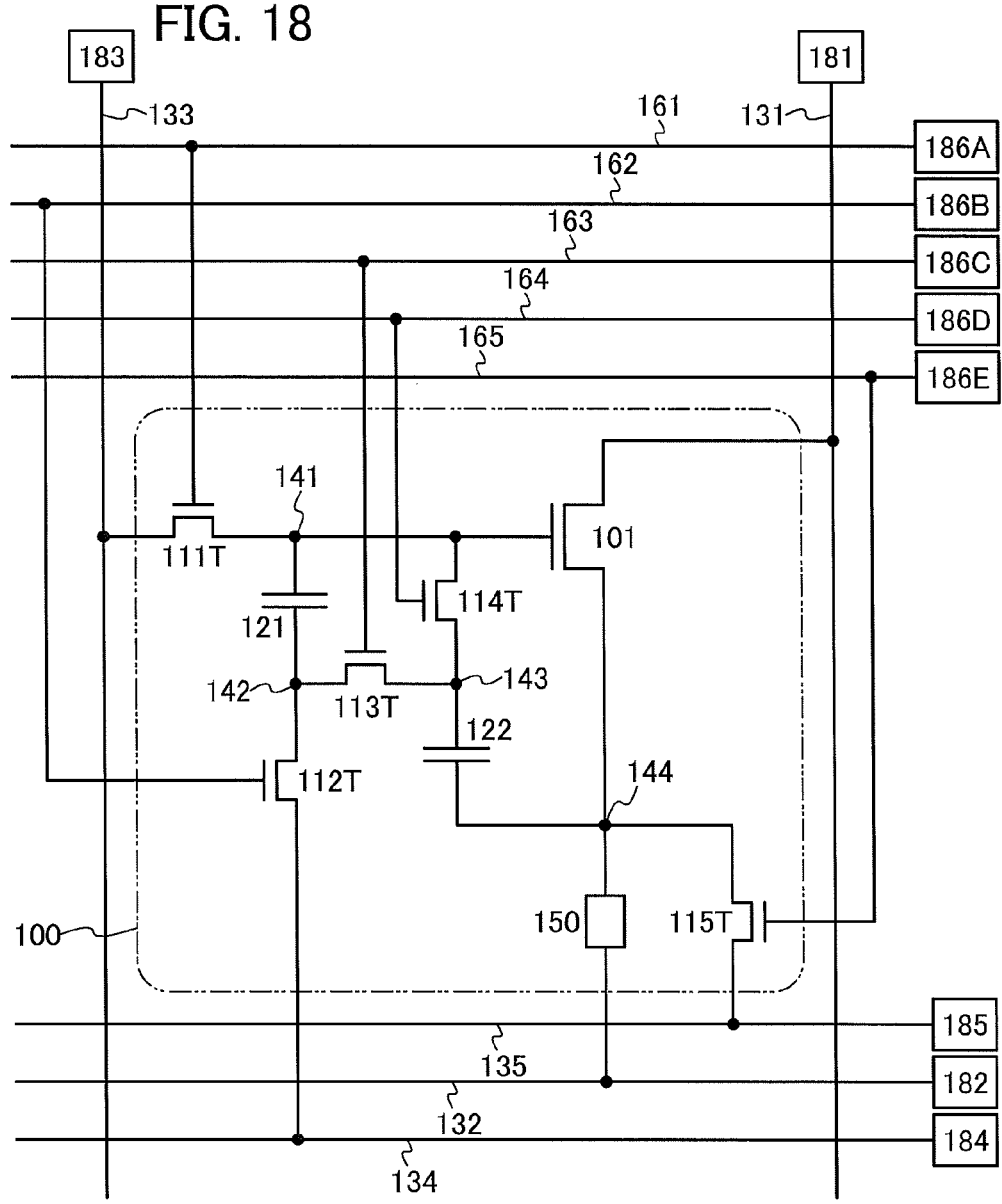
FIG. 18 illustrates a pixel circuit in one embodiment of the present invention.

Note that the switch 111, the switch 112, the switch 113, the switch 114, and the switch 115 in FIG. 1 can be transistors, for example. FIG. 18 is a circuit diagram illustrating an example where n-channel transistors are used as the switch 111, the switch 112, the switch 113, the switch 114, and the switch 115. Note that the components which are the same as those in the configuration in FIG. 1 are denoted by common reference numerals, and thus description thereof is omitted. By using the transistors all having the same conductivity type as illustrated in FIG. 18, the semiconductor device can be manufactured through a smaller number of steps, whereby manufacturing cost can be reduced. Note that a p-channel transistor can be used as at least one of the switch 111, the switch 112, the switch 113, the switch 114, and the switch 115.

In FIG. 18, a transistor 111T corresponds to the switch 111. A transistor 112T corresponds to the switch 112. A transistor 113T corresponds to the switch 113. A transistor 114T corresponds to the switch 114. A transistor 115T corresponds to the switch 115.

A gate of the transistor 111T is connected to a wiring 161, a first terminal thereof is connected to the wiring 133, and a second terminal thereof is connected to the node 141. Therefore, the transistor 111T is in a conduction state when the potential of the wiring 161 is at an H level, and the transistor 111T is in a non-conduction state when the potential of the wiring 161 is at an L level.

A gate of the transistor 112T is connected to a wiring 162, a first terminal thereof is connected to the wiring 134, and a second terminal thereof is connected to the node 142. Therefore, the transistor 112T is in a conduction state when the potential of the wiring 162 is at an H level, and the transistor 112T is in a non-conduction state when the potential of the wiring 162 is at an L level.

Further, a gate of the transistor 113T is connected to a wiring 163, a first terminal thereof is connected to the node 142, and a second terminal thereof is connected to the node 143. Therefore, the transistor 113T is in a conduction state when the potential of the wiring 163 is at an H level, and the transistor 113T is in a non-conduction state when the potential of the wiring 163 is at an L level.

A gate of the transistor 114T is connected to a wiring 164, a first terminal thereof is connected to the node 141, and a second terminal thereof is connected to the node 143. Therefore, the transistor 114T is in a conduction state when the potential of the wiring 164 is at an H level, and the transistor 114T is in a non-conduction state when the potential of the wiring 164 is at an L level.

A gate of the transistor 115T is connected to a wiring 165, a first terminal thereof is connected to the wiring 135, and a second terminal thereof is connected to the node 144. Therefore, the transistor 115T is in a conduction state when the potential of the wiring 165 is at an H level, and the transistor 115T is in a non-conduction state when the potential of the wiring 165 is at an L level.

For example, the wiring 161 is connected to a circuit 186A, the wiring 162 is connected to a circuit 186B, the wiring 163 is connected to a circuit 186C, the wiring 164 is connected to a circuit 186D, and the wiring 165 is connected to a circuit 186E. For example, the circuits 186A to 186E each have a function of supplying at least a signal at an H level or an L level. Note that the circuits 186A to 186E may each be an individual circuit, or some of them may form one circuit collectively. An example of each of the circuits 186A to 186E is a gate driver (scan line driver circuit) or the like. Accordingly, the wiring 161 has a function of transmitting or supplying a signal at an H level or an L level. Alternatively, the wiring 161 has a function of controlling the conduction state of the switch 111 or the transistor 111T. Further, the wiring 162 has a function of controlling the conduction state of the switch 112 or the transistor 112T. The wiring 163 has a function of controlling the conduction state of the switch 113 or the transistor 113T. Further, the wiring 164 has a function of controlling the conduction state of the switch 114 or the transistor 114T. Further, the wiring 165 has a function of controlling the conduction state of the switch 115 or the transistor 115T.

Note that the wiring 161, the wiring 162, the wiring 163, the wiring 164, and the wiring 165 can be provided as different wirings. However, the structure of the wirings is not limited to this structure in one aspect of an embodiment of the present invention, and one wiring can serve as the plurality of wirings. Thus, the circuit can be formed with a smaller number of wirings.

In many cases, the transistor 101 operates in a saturation region at the time of passing current. Therefore, the transistor 101 preferably has a longer channel length or gate length than the transistor 111T, the transistor 112T, the transistor 113T, the transistor 114T, and the transistor 115T. When the channel length or the gate length is increased, characteristics in a saturation region have a flat slope; accordingly, a kink effect can be reduced. Note that in one aspect of an embodiment of the present invention, the structure of the transistor 101 is not limited to this example.

In many cases, the transistor 101 operates in a saturation region at the time of passing current. Therefore, the transistor 101 preferably has a longer channel width or gate width than any of or all of the transistor 111T, the transistor 112T, the transistor 113T, the transistor 114T, and the transistor 115T. When the channel width or the gate width is increased, a large amount of current can flow even when the transistor 101 operates in a saturation region. Note that in one aspect of an embodiment of the present invention, the channel width or gate width of the transistor 101 is not limited to this example, and may be the same as or shorter than any of or all of the channel widths or gate width of the transistor 111T, the transistor 112T, the transistor 113T, the transistor 114T, and the transistor 115T.

Figure 19:
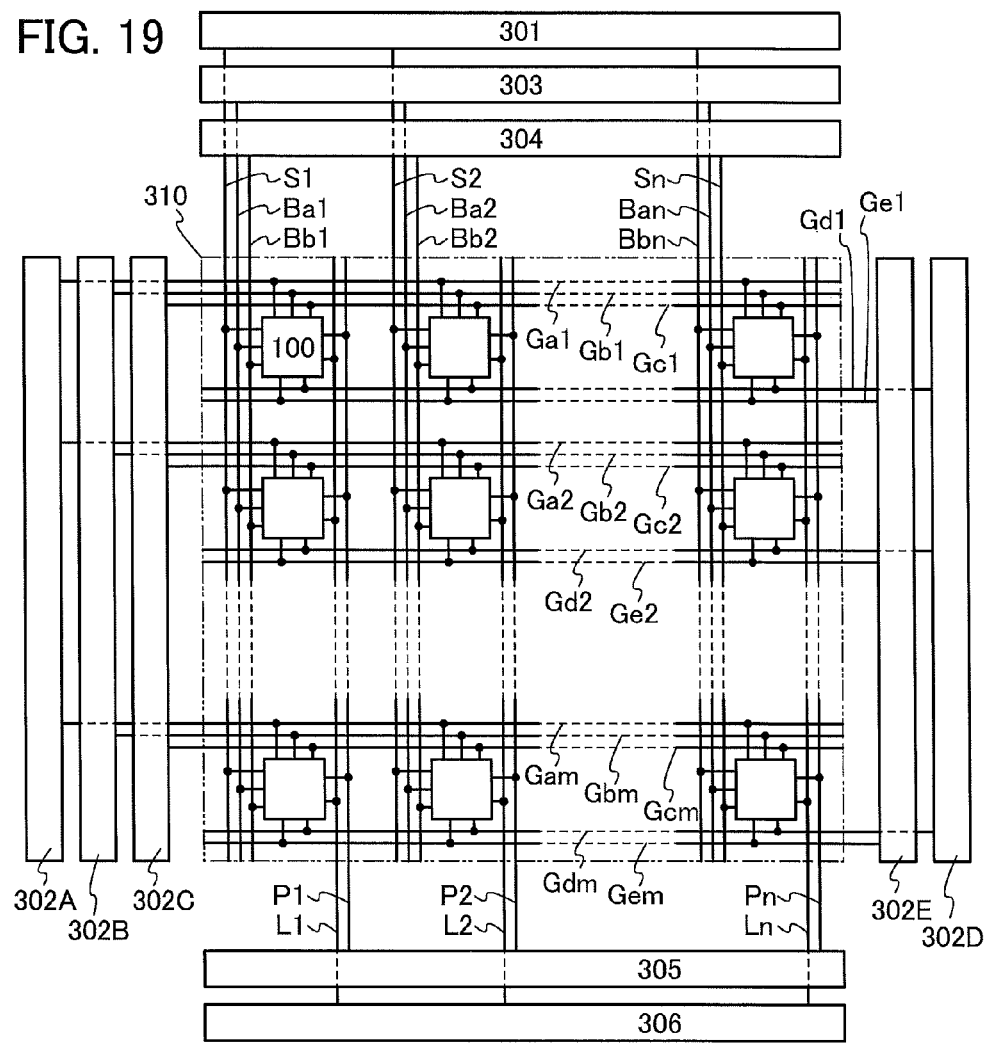
FIG. 19 illustrates a structural example of a display device.

FIG. 19 is a block diagram illustrating a configuration example of a display device to which the pixel circuit 100 illustrated in FIG. 18 is applied.

For example, the display device includes a signal line driver circuit 301, a scan line driver circuit 302A, a scan line driver circuit 302B, a scan line driver circuit 302C, a scan line driver circuit 302D, a scan line driver circuit 302E, a potential supply circuit 303, a potential supply circuit 304, a potential supply circuit 305, a potential supply circuit 306, and a pixel region 310. The pixel region 310 is provided with a plurality of signal lines S1 to Sn extended in the column direction from the signal line driver circuit 301. The pixel region 310 is further provided with a plurality of scan lines Ga1 to Gam extended in the row direction from the scan line driver circuit 302A. The pixel region 310 is further provided with a plurality of scan lines Gb1 to Gbm extended in the row direction from the scan line driver circuit 302B. The pixel region 310 is further provided with a plurality of scan lines Gc1 to Gcm extended in the row direction from the scan line driver circuit 302C. The pixel region 310 is further provided with a plurality of scan lines Gd1 to Gdm extended in the row direction from the scan line driver circuit 302D. The pixel region 310 is further provided with a plurality of scan lines Ge1 to Gem extended in the row direction from the scan line driver circuit 302E.

The pixel region 310 is provided with a plurality of wirings Ba1 to Ban extended in the column direction from the potential supply circuit 303. The pixel region 310 is provided with a plurality of wirings Bb1 to Bbn extended in the column direction from the potential supply circuit 304. The pixel region 310 is provided with a plurality of wirings P1 to Pn extended in the column direction from the potential supply circuit 305. The pixel region 310 is provided with a plurality of wirings L1 to Ln extended in the column direction from the potential supply circuit 306.

The pixel region 310 is provided with a plurality of pixel circuits 100 arranged in a matrix. Each of the pixel circuits 100 is connected to the signal line Sj (one of the signal lines S1 to Sn), the scan line Gai (one of the scan lines Ga1 to Gam), the scan line Gbi (one of the scan lines Gb1 to Gbm), the scan line Gci (one of the scan lines Gc1 to Gcm), the scan line Gdi (one of the scan lines Gd1 to Gdm), the scan line Gei (one of the scan lines Ge1 to Gem), the wiring Baj (one of the wirings Ba1 to Ban), the wiring Bbj (one of the wirings Bb1 to Bbn), the wiring Pj (one of the wirings P1 to Pn), and the wiring Lj (one of the wirings L1 to Ln).

The scan line Gai corresponds to the wiring 161 in FIG. 18. The scan line Gbj corresponds to the wiring 132 in FIG. 18. The scan line Gcj corresponds to the wiring 163 in FIG. 18. The scan line Gdj corresponds to the wiring 164 in FIG. 18. The scan line Gej corresponds to the wiring 165 in FIG. 18. The signal line Sj corresponds to the wiring 133 in FIG. 18. The wiring Pj corresponds to the wiring 131 in FIG. 18. The wiring Lj corresponds to the wiring 132 in FIG. 18.

Note that the wiring Pj can be shared by pixels horizontally adjacent to each other. For example, one wiring is provided for two pixels; thus, the number of wirings can be reduced. Further, the wiring Lj can be shared by pixels horizontally adjacent to each other. For example, one wiring is provided for two pixels; thus, the number of wirings can be reduced.

Note that the wiring Pj can be extended in the row direction to be parallel to the scan line Gai and the like. In that case, the wiring Pj can be shared by pixels vertically adjacent to each other. For example, one wiring is provided for two pixels; thus, the number of wirings can be reduced. Further, the wiring Lj can be extended in the row direction to be parallel to the scan line Gai and the like. In that case, the wiring Lj can be shared by pixels vertically adjacent to each other. For example, one wiring is provided for two pixels; thus, the number of wirings can be reduced.

Figure 20:
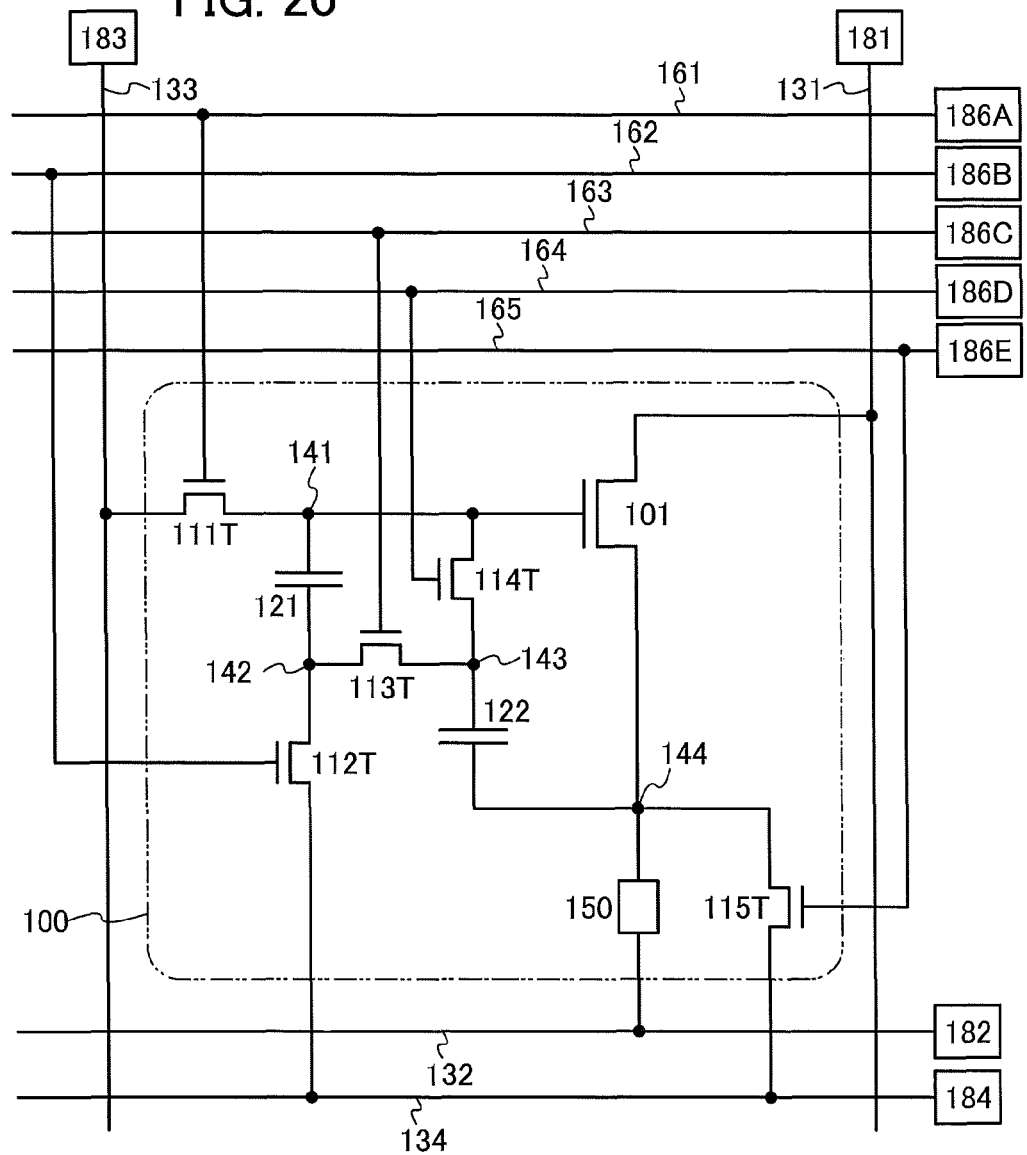
FIG. 20 is a circuit diagram showing one embodiment of the present invention.

FIG. 20 illustrates a configuration example in which the wiring 135 connected to the pixel circuit 100 illustrated in FIG. 18 is omitted and the first terminal of the transistor 112T and the first terminal of the transistor 115T are connected to the wiring 134. With this configuration, the area occupied by wirings in the region where the pixel is provided can be reduced by the space for the removed wiring 135. Further, since the circuit 185 is unnecessary, the number of components constituting the display device can be reduced, leading to improvements in productivity and reliability of the display device.

Figure 45:
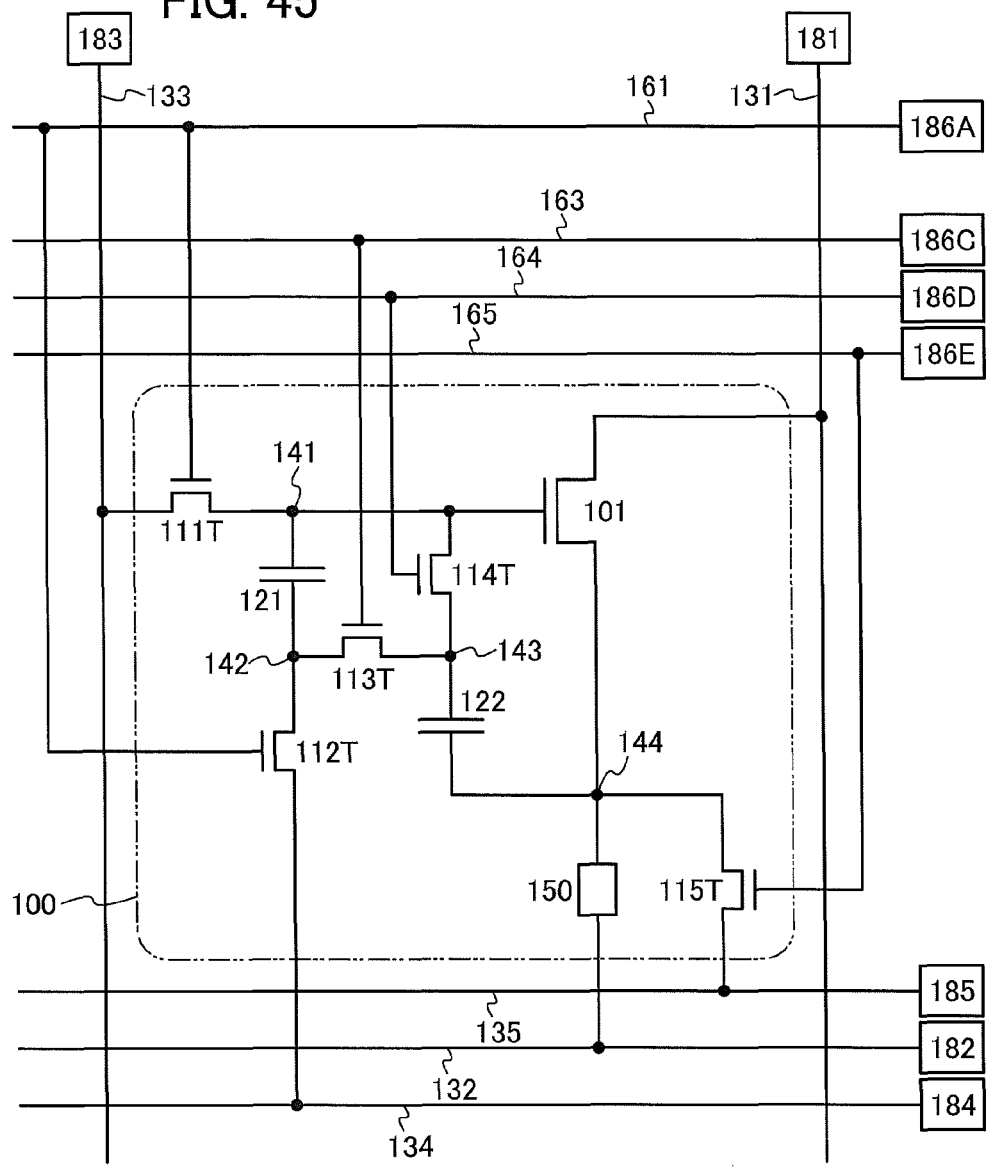
FIG. 45 illustrates a pixel circuit of one embodiment of the present invention.

FIG. 45 illustrates a configuration example in which the wiring 162 connected to the pixel circuit 100 illustrated in FIG. 18 is omitted and the gate of the transistor 112T is connected to the wiring 161. With this configuration, the area occupied by wirings in the region where the pixel is provided can be reduced by the space for the removed wiring 162. Further, since the circuit 186B is unnecessary, the number of components constituting the display device can be reduced, leading to improvements in productivity and reliability of the display device.

Figure 46:
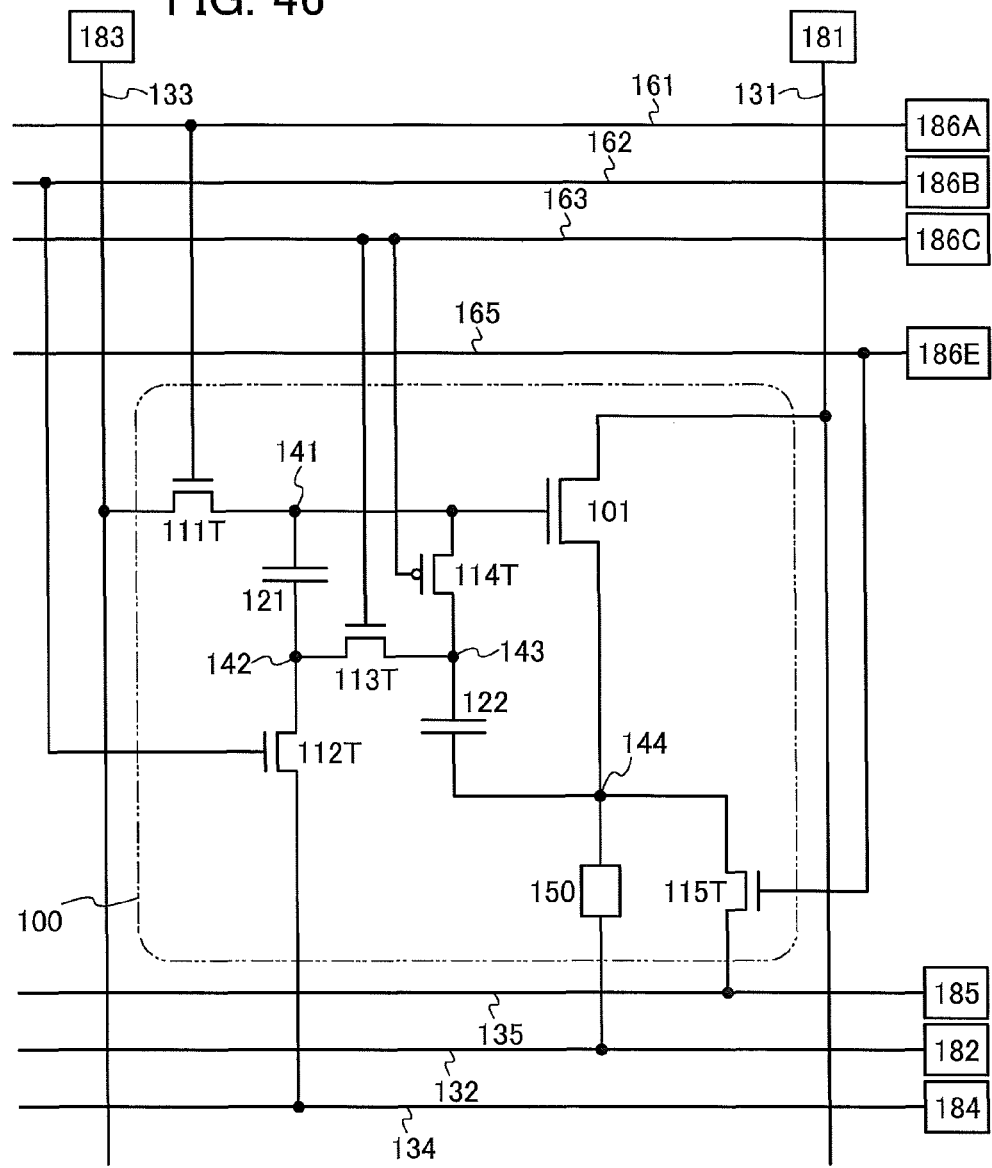
FIG. 46 illustrates a pixel circuit of one embodiment of the present invention.

FIG. 46 illustrates a configuration example in which the transistor 114T in the pixel circuit 100 illustrated in FIG. 18 is a p-channel transistor, the wiring 164 connected to the pixel circuit 100 is omitted, and the gate of the transistor 114T is connected to the wiring 163. With this configuration, the area occupied by wirings in the region where the pixel is provided can be reduced by the space for the removed wiring 164. Further, since the circuit 186D is unnecessary, the number of components constituting the display device can be reduced, leading to improvements in productivity and reliability of the display device.

Figure 47:
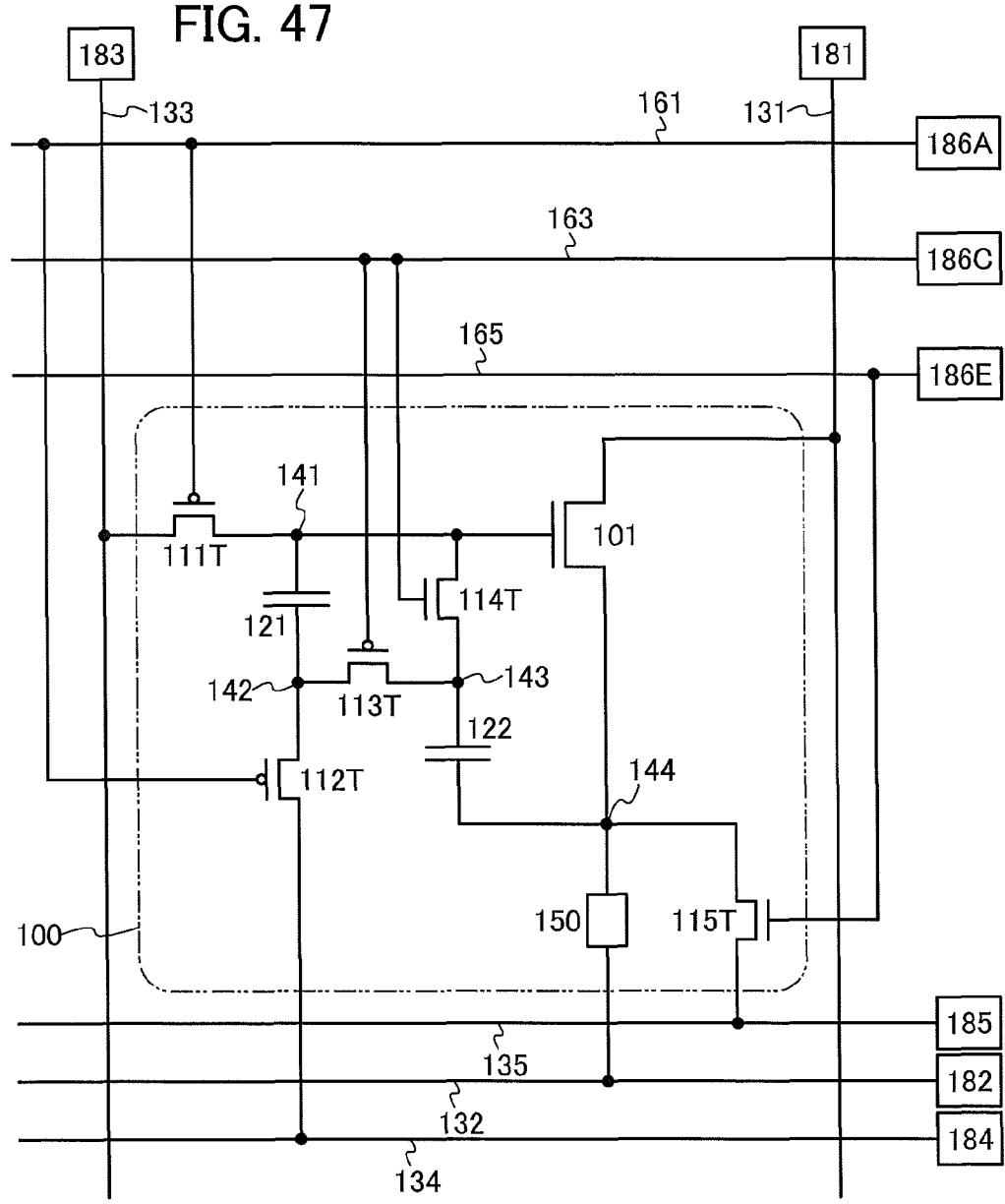
FIG. 47 illustrates a pixel circuit of one embodiment of the present invention.

FIG. 47 illustrates a configuration example in which the transistor 111T, the transistor 112T, and the transistor 113T in the pixel circuit 100 illustrated in FIG. 18 are p-channel transistors, the wiring 162 and the wiring 164 connected to the pixel circuit 100 are omitted, the gate of the transistor 112T is connected to the wiring 161, and the gate of the transistor 114T is connected to the wiring 163. With this configuration, the area occupied by wirings in the region where the pixel is provided can be reduced by the space for the removed wirings 162 and 164. Further, since the circuit 186B and the circuit 186D are unnecessary, the number of components constituting the display device can be reduced, leading to improvements in productivity and reliability of the display device.

Figure 48:
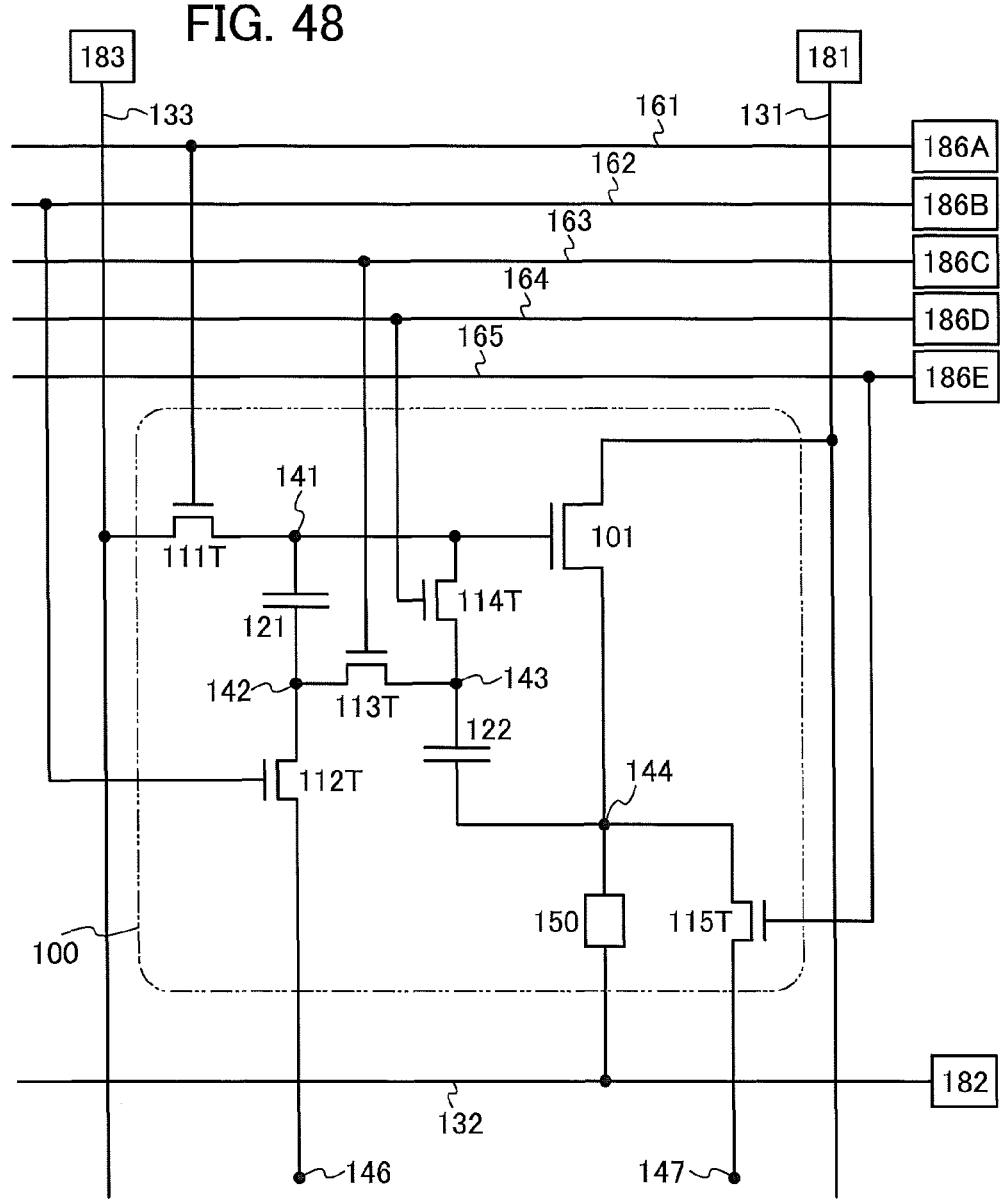
FIG. 48 illustrates a pixel circuit of one embodiment of the present invention.

FIG. 48 illustrates a configuration example in which the wiring 134 and the wiring 135 connected to the pixel circuit 100 illustrated in FIG. 18 are omitted, the first terminal of the transistor 112T is connected to a node 146, and the first terminal of the transistor 115T is connected to a node 147. The node 146 and the node 147 are connected to any of the wirings 161 to 165 which control the conduction states of the transistors in a row different from the row of the pixel circuit 100. With this configuration, the area occupied by wirings in the region where the pixel is provided can be reduced by the space for the removed wirings 134 and 135. Further, since the circuit 184 and the circuit 185 are unnecessary, the number of components constituting the display device can be reduced, leading to improvements in productivity and reliability of the display device.

Figure 49:
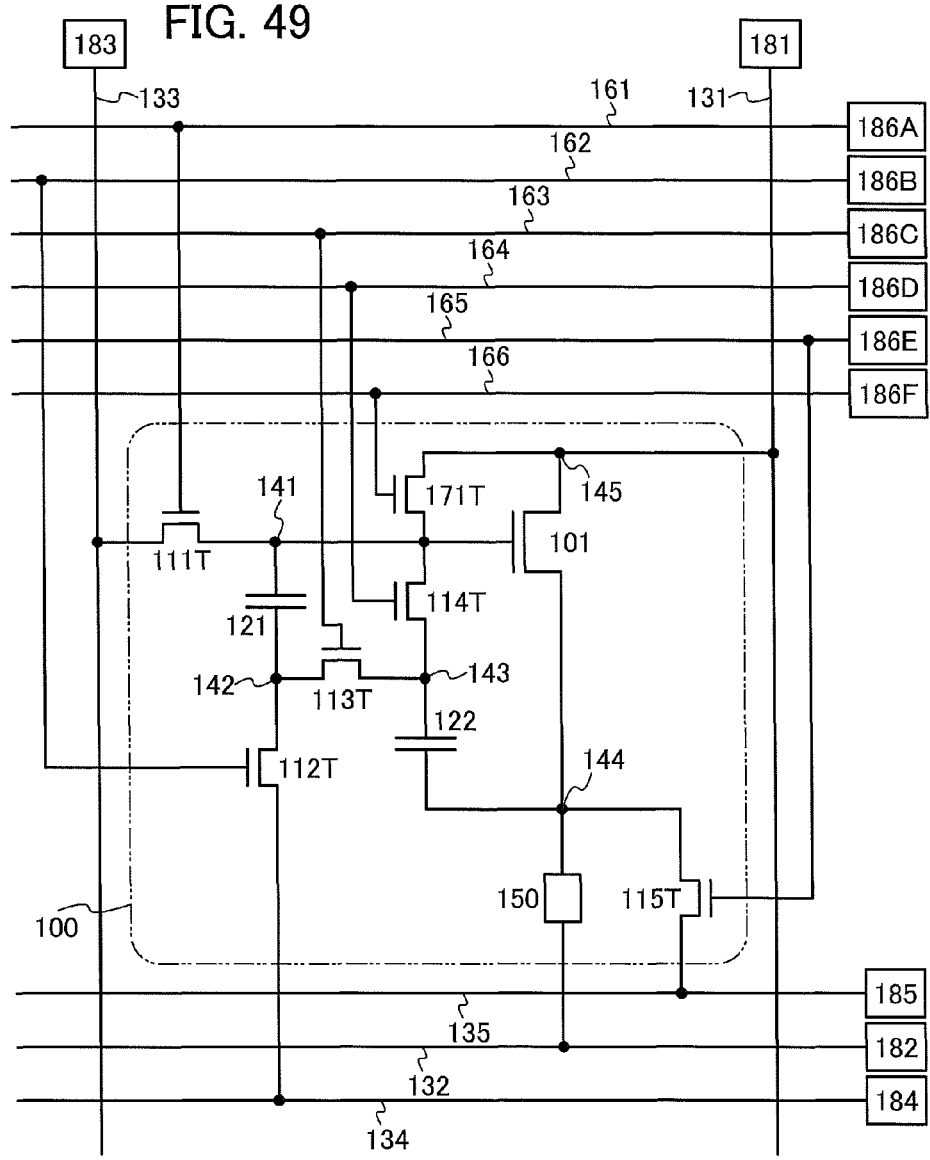
FIG. 49 illustrates a pixel circuit of one embodiment of the present invention.

FIG. 49 illustrates a configuration example in which an n-channel transistor is used as the switch 171 of the pixel circuit 100 illustrated in FIG. 9. The description of the components which are the same as those in the configuration described with reference to other drawings is omitted. In FIG. 49, a transistor 171T corresponds to the switch 171 in FIG. 9. A gate of the transistor 171T is connected to a wiring 166, one of a source and a drain thereof is connected to the node 141, and the other of the source and the drain thereof is connected to the node 145. The wiring 166 is connected to a circuit 186F. The circuit 186F has a function similar to those of the circuits 186A to 186E. For example, the circuit 186F has a function of supplying at least a signal at an H level or an L level to the wiring 166. Further, the wiring 166 has a function of controlling the conduction state of the switch 171 or the transistor 171T.

Figure 50:
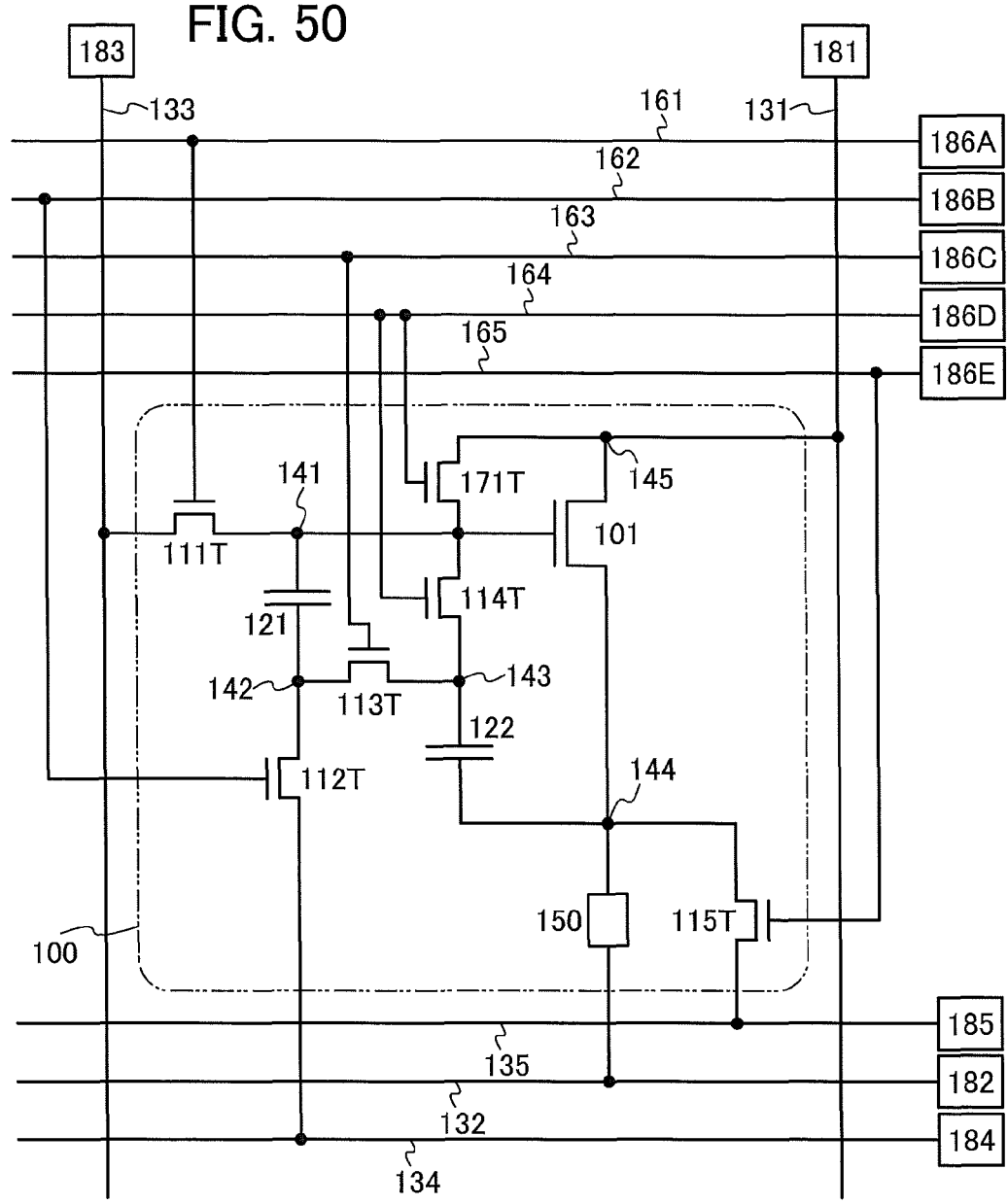
FIG. 50 illustrates a pixel circuit of one embodiment of the present invention.

FIG. 50 illustrates a configuration example in which the wiring 166 connected to the pixel circuit 100 illustrated in FIG. 49 is omitted and the gate of the transistor 171T included in the pixel circuit 100 is connected to the wiring 164. With this configuration, the area occupied by wirings in the region where the pixel is provided can be reduced by the space for the removed wiring 166. Further, since the circuit 186F is unnecessary, the number of components constituting the display device can be reduced, leading to improvements in productivity and reliability of the display device. Further, the gate of the transistor 171T may be connected to the wiring 161 or the wiring 162 in one row before the row in which the transistor 171T is provided.

Figure 51:
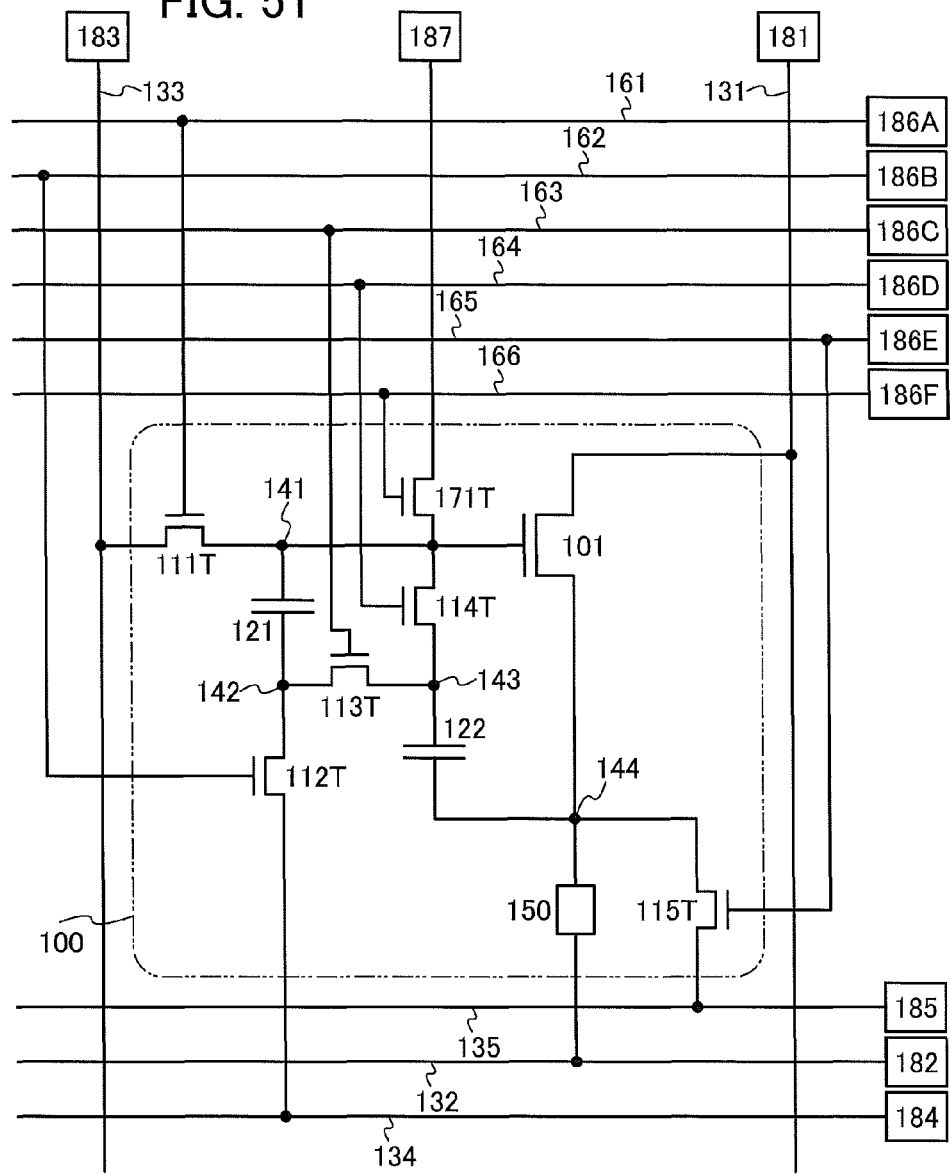
FIG. 51 illustrates a pixel circuit of one embodiment of the present invention.

FIG. 51 illustrates a configuration example in which the other of the source and the drain of the transistor 171T included in the pixel circuit 100 illustrated in FIG. 49 is connected to a circuit 187. Examples of the circuit 187 include a power supply circuit, an amplifier circuit, and the like. The circuit 187 is not limited to a circuit that outputs only a constant potential, and a circuit that outputs an inconstant potential, for example, a pulsed signal may be used. Examples of the circuit 187 in such a case include a digital circuit, a shift register circuit, a scan line driver circuit, and the like.

Figure 52:
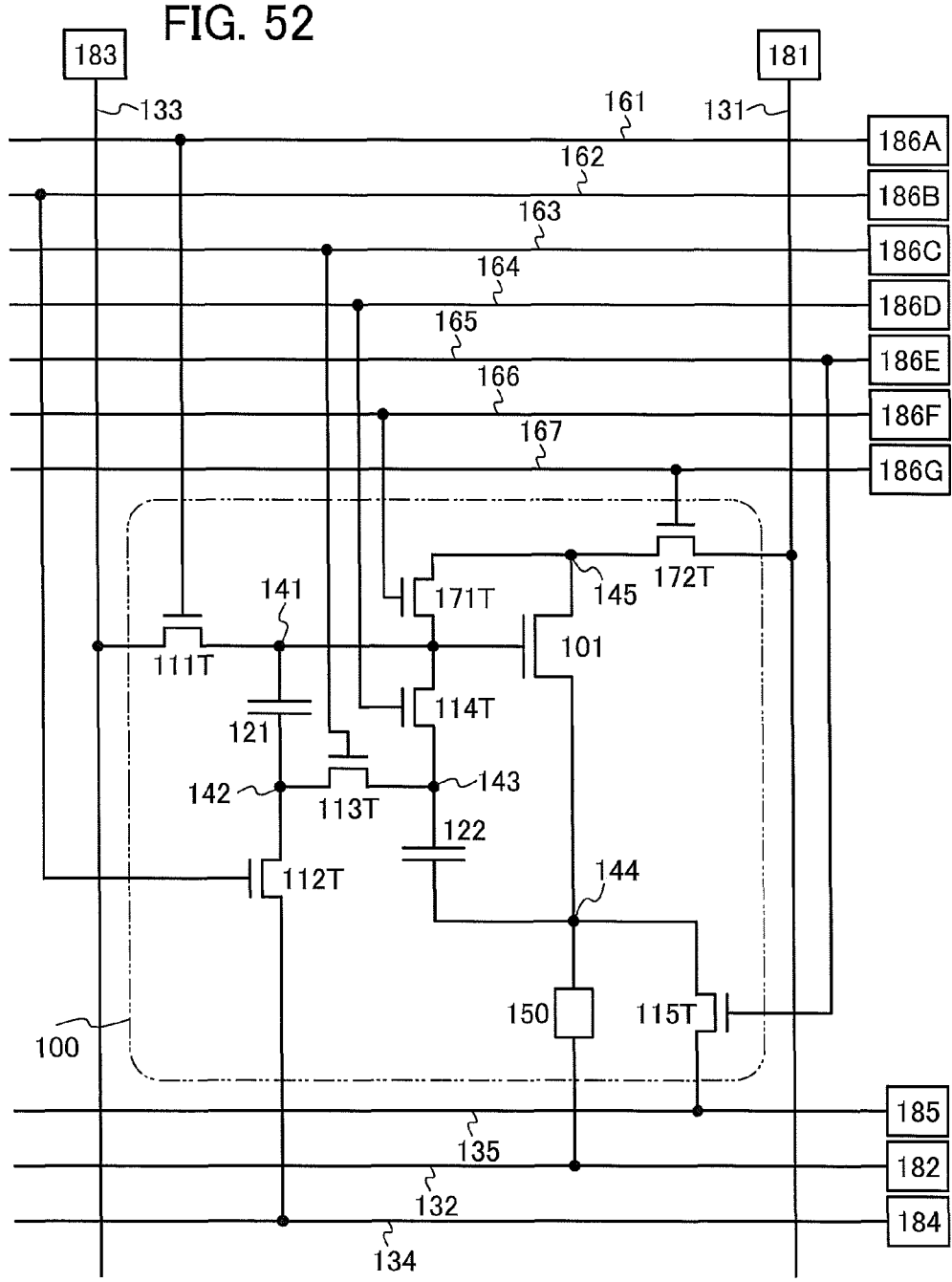
FIG. 52 illustrates a pixel circuit of one embodiment of the present invention.

FIG. 52 illustrates a configuration example in which an n-channel transistor is used as the switch 172 included in the pixel circuit 100 illustrated in FIG. 11. The description of the components which are the same as those in the configuration described with reference to other drawings is omitted. In FIG. 52, a transistor 172T corresponds to the switch 172 in FIG. 11. A gate of the transistor 172T is connected to a wiring 167, one of a source and a drain thereof is connected to the node 145, and the other of the source and the drain thereof is connected to the wiring 131. The wiring 167 is connected to a circuit 186G. The circuit 186G has a function similar to those of the circuits 186A to 186F. For example, the circuit 186G has a function of supplying at least a signal at an H level or an L level to the wiring 167. Further, the wiring 167 has a function of controlling the conduction state of the switch 172 or the transistor 172T.

Figure 53:
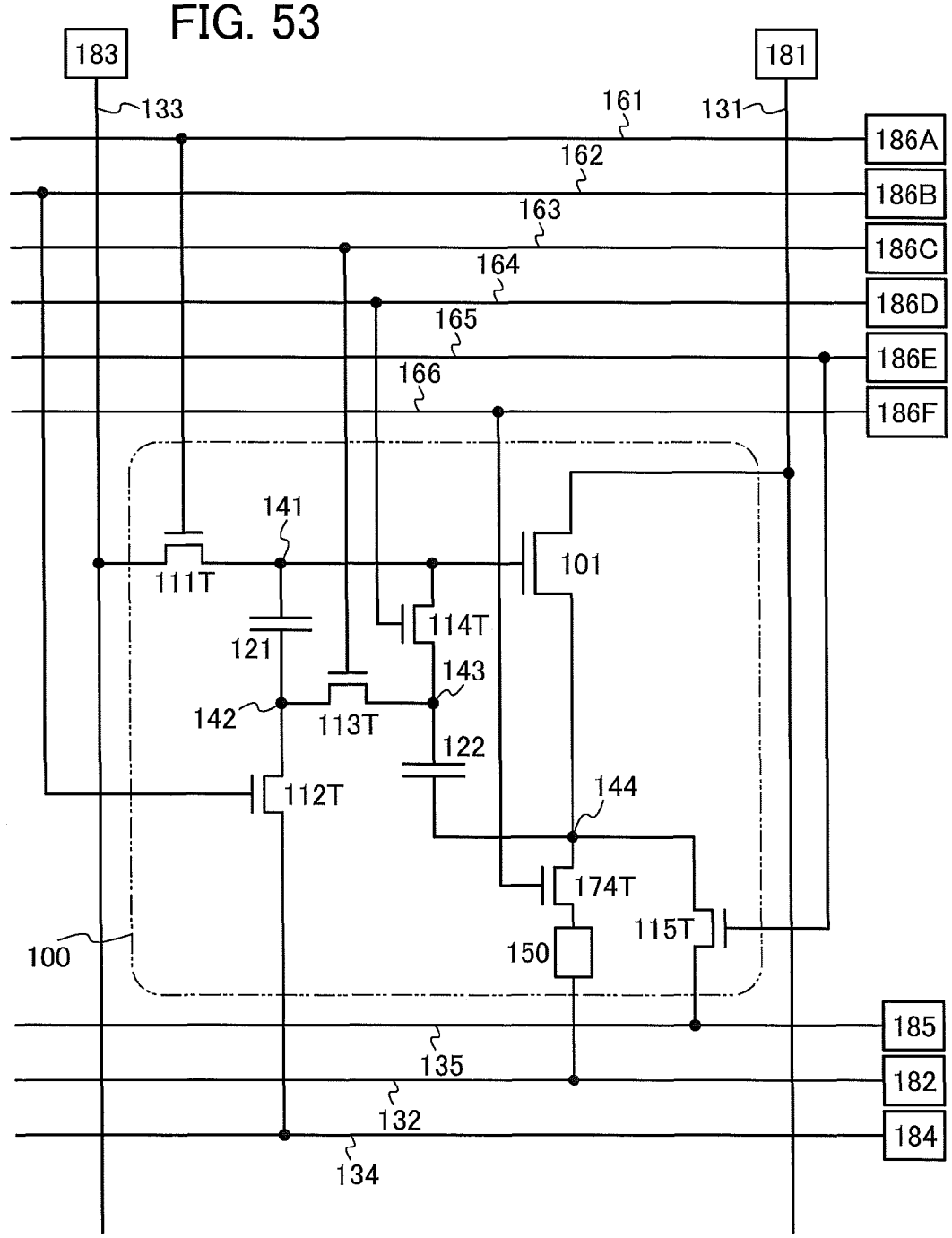
FIG. 53 illustrates a pixel circuit of one embodiment of the present invention.

FIG. 53 illustrates a configuration example in which an n-channel transistor is used as the switch 174 included in the pixel circuit 100 illustrated in FIG. 13. The description of the components which are the same as those in the configuration described with reference to other drawings is omitted. In FIG. 53, a transistor 174T corresponds to the switch 174. A gate of the transistor 174T is connected to the wiring 166, one of a source and a drain thereof is connected to the load 150, and the other of the source and the drain is connected to the node 144.

Note that the operation of correcting variations in threshold voltage or the like of a transistor is performed in this embodiment; however, such an operation is not necessarily performed in one embodiment of the present invention. For example, without performing the operation of correcting variations in threshold voltage, current can be supplied to the load 150 to operate the semiconductor device.

This embodiment is obtained by performing change, addition, modification, removal, application, superordinate conceptualization, or subordinate conceptualization on part or the whole of another embodiment. Thus, part of or the whole of this embodiment can be freely combined with or replaced with part of or the whole of another embodiment.

Embodiment 2

In this embodiment, configuration examples in which any of the pixel circuits described in the above embodiment is used as a current source for supplying a current to a load in part of a signal line driver circuit of a display device are described with reference to FIG. 21, FIG. 22, FIG. 23, and FIG. 24.

Figure 21:
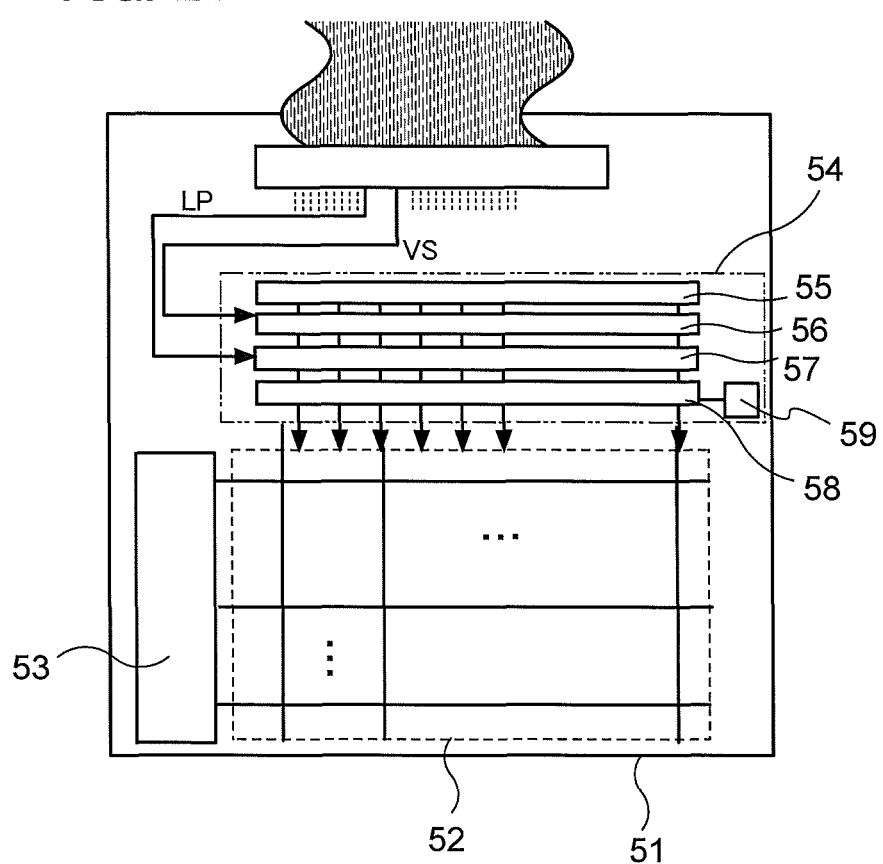
FIG. 21 illustrates one embodiment of the present invention.

A display device 51 illustrated in FIG. 21 includes a pixel region 52, a gate line driver circuit 53, and a signal line driver circuit 54. The gate line driver circuit 53 sequentially outputs a selection signal to the pixel region 52. The signal line driver circuit 54 sequentially outputs a video signal to the pixel region 52. The pixel region 52 includes a plurality of pixels and displays an image by controlling the state of light in accordance with the video signal. The video signal input from the signal line driver circuit 54 to the pixel region 52 is a current. That is, the states of a display element and an element for controlling the display element disposed in each pixel are changed by the video signal (current) input from the signal line driver circuit 54. Examples of the display element disposed in a pixel include an EL element, an element used in a field emission display (FED), a liquid crystal element, electronic ink, an electrophoretic element, and a grating light valve (GLV). Examples of a display device using a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device using electronic ink or an electrophoretic element include electronic paper.

Note that a plurality of gate line driver circuits 53 and a plurality of signal line driver circuits 54 may be provided.

The structure of the signal line driver circuit 54 can be divided into a plurality of portions. For example, the signal line driver circuit 54 can be roughly divided into a shift register 55, a first latch circuit (LAT1) 56, a second latch circuit (LAT2) 57, and a digital-analog converter circuit 58. The digital-analog converter circuit 58 has a function of converting a voltage into a current, and it may also have a function of performing gamma correction. In other words, the digital-analog converter circuit 58 has a circuit which outputs a current (video signal) to a pixel, that is, a current source circuit. As the current source circuit, any of the pixel circuits described in the above embodiment can be used.

The operation of the signal line driver circuit 54 is briefly described. The shift register 55 is formed using a plurality of columns of flip-flop circuits (FFs) and the like, and a clock signal (S-CLK), a start pulse (SP), and an inverted clock signal (S-CLKb) are input to the shift register 55. Sampling pulses are sequentially output in accordance with the timing of these signals.

The sampling pulses output from the shift register 55 are input to the first latch circuit (LAT1) 56. A video signal VS is input to the first latch circuit (LAT1) 56 from a video signal line. The first latch circuit 56 holds the video signal in each column in accordance with the timing at which the sampling pulse is input. Note that the video signal has a digital value in the case where the digital-analog converter circuit 58 is provided. Further, the video signal at this stage is a voltage in many cases.

However, in the case where the first latch circuit 56 and the second latch circuit 57 are circuits which can store analog values, the digital-analog converter circuit 58 can be omitted in many cases. In that case, the video signal is a current in many cases. Further, in the case where data output to the pixel region 52 has a binary value, that is, a digital value, the digital-analog converter circuit 58 can be omitted in many cases.

After holding of video signals is completed up to the last column in the first latch circuit (LAT1) 56, a latch pulse (LP) is input from a latch control line in a horizontal retrace period, and the video signals which have been held in the first latch circuit (LAT1) 56 are transferred to the second latch circuit (LAT2) 57 all at once. After that, the video signals held in the second latch circuit (LAT2) 57 for one row are input to the digital-analog converter circuit 58 at a time. Then, signals output from the digital-analog converter circuit 58 are input to the pixel region 52.

While the video signals held in the second latch circuit (LAT2) 57 are input to the digital-analog converter circuit 58 and then input to the pixel region 52, sampling pulses are output from the shift register 55 again. In other words, two operations are performed concurrently. Accordingly, line sequential driving can be performed. Hereafter, the above operation is repeated.

In the case where the current source circuit in the digital-analog converter circuit 58 is a circuit which performs setting operation and output operation, a circuit for supplying a current to the current source circuit is needed. In that case, a reference current source circuit 59 is provided.

Note that the signal line driver circuit or part thereof may be formed using, for example, an external IC chip instead of being provided over the same substrate as the pixel region 52. In that case, the IC chip and the substrate are connected by chip on glass (COG) or tape automated bonding (TAB) or using a printed board or the like.

Note that the structure of the display device, the signal line driver circuit, or the like is not limited to that in FIG. 21.

Figure 22:
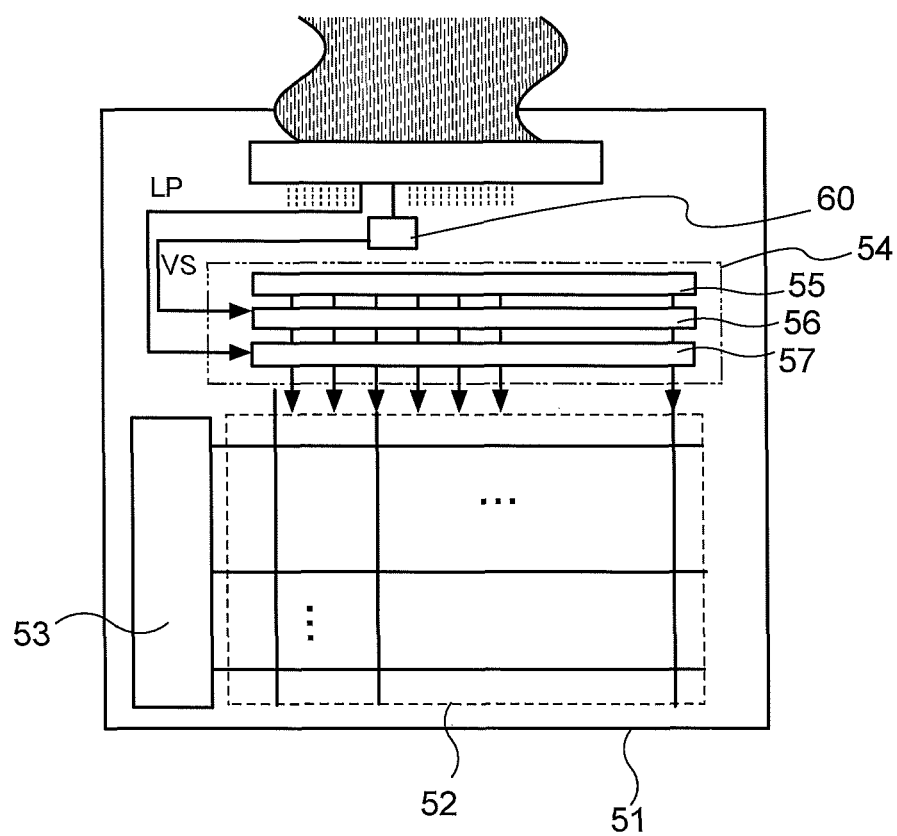
FIG. 22 illustrates one embodiment of the present invention.

For example, in the case where the first latch circuit 56 and the second latch circuit 57 can store analog values, the video signal VS (analog current) is input to the first latch circuit (LAT1) 56 from a reference current source circuit 60 as illustrated in FIG. 22 in some cases. Further, the second latch circuit 57 is not provided in FIG. 22 in some cases.

Next, a specific configuration where any of the pixel circuits described in the above embodiment is used as a current source circuit in the signal line driver circuit 54 is described.

Figure 23:
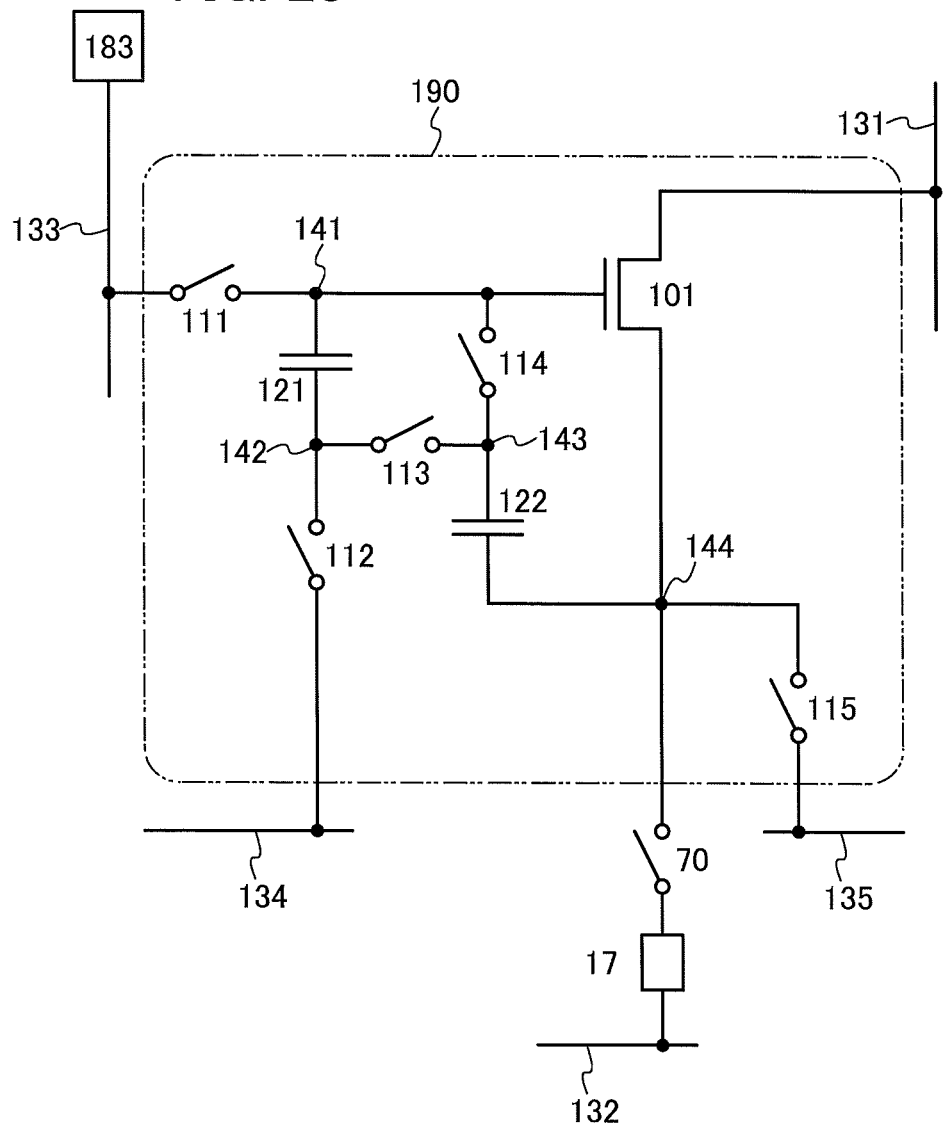
FIG. 23 is a circuit diagram showing one embodiment of the present invention.

First, FIG. 23 illustrates an example of a circuit configuration of the current source circuit applied to the signal line driver circuit. A circuit 190 illustrated in FIG. 23 has almost the same configuration as the pixel circuit 100 described with reference to FIG. 1 in Embodiment 1. Note that components in common with those in the pixel circuit 100 are denoted by common reference numerals, and description thereof is omitted. In accordance with the potential Vsig supplied from the circuit 183, the circuit 190 illustrated in FIG. 23 can output a current which is less affected by variations in the threshold voltage of the transistor 101.

Supply of the current which is less affected by variations in the threshold voltage set in the circuit 190 is controlled by the switching of a switch 70 provided between the circuit 190 and the load 17. In that case, for example, it is possible to provide a plurality of circuits 190 and a plurality of switches 70 and to control the amount of current flowing to the load 17 with the plurality of switches 70.

Figure 24:
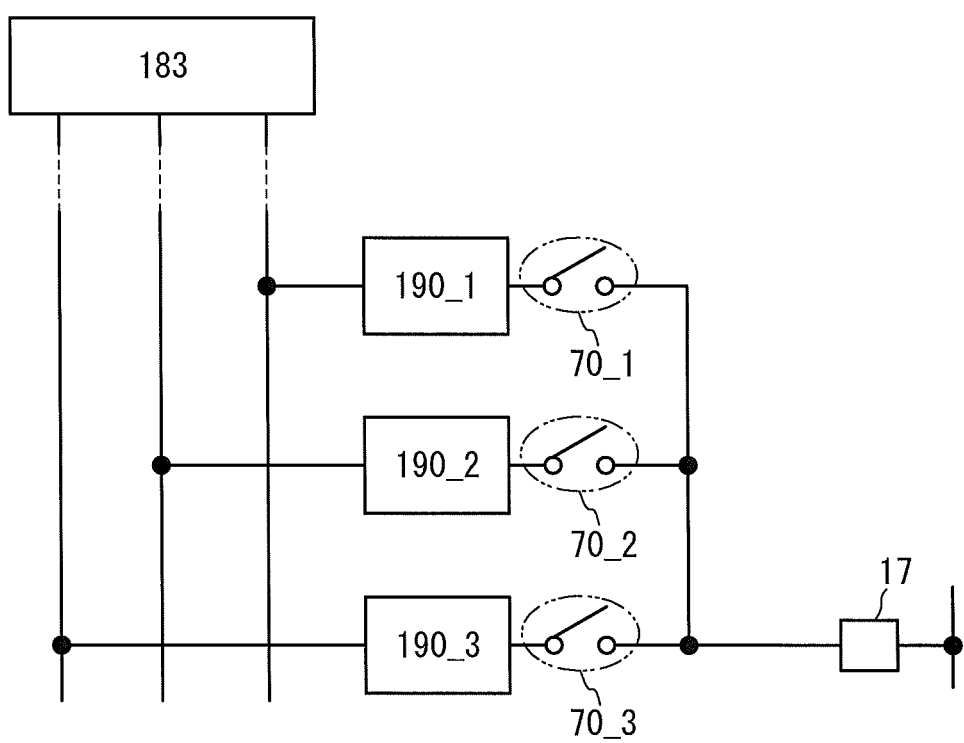
FIG. 24 illustrates one embodiment of the present invention.

For example, a configuration illustrated in FIG. 24 can be employed. In the configuration, circuits 190_1 to 10_3 are provided as the plurality of circuits 190; a switch 70_1, a switch 70_2, and a switch 70_3 are provided as the plurality of switches 70; and the amount of current flowing to the load 17 is controlled by the switch 70_1, the switch 70_2, and the switch 70_3. The potential Vsig may be set by the circuit 183 so that the amount of current supplied from the circuit 190 varies or is equal among the circuits 190_1 to 190_3, and the amount of current flowing to the load 17 may be controlled by switching of the switches.

This embodiment is obtained by performing change, addition, modification, removal, application, superordinate conceptualization, or subordinate conceptualization on part or the whole of another embodiment. Thus, part of or the whole of this embodiment can be freely combined with or replaced with part of or the whole of another embodiment.

Embodiment 3

In this embodiment, configuration examples of the pixel circuit illustrated in FIG. 18 is described with reference to FIG. 25, FIGS. 26A and 26B, FIG. 27, FIG. 28, FIG. 29, FIG. 30, FIG. 31, FIG. 32, FIGS. 33A and 33B, and FIG. 34.

Figure 25:
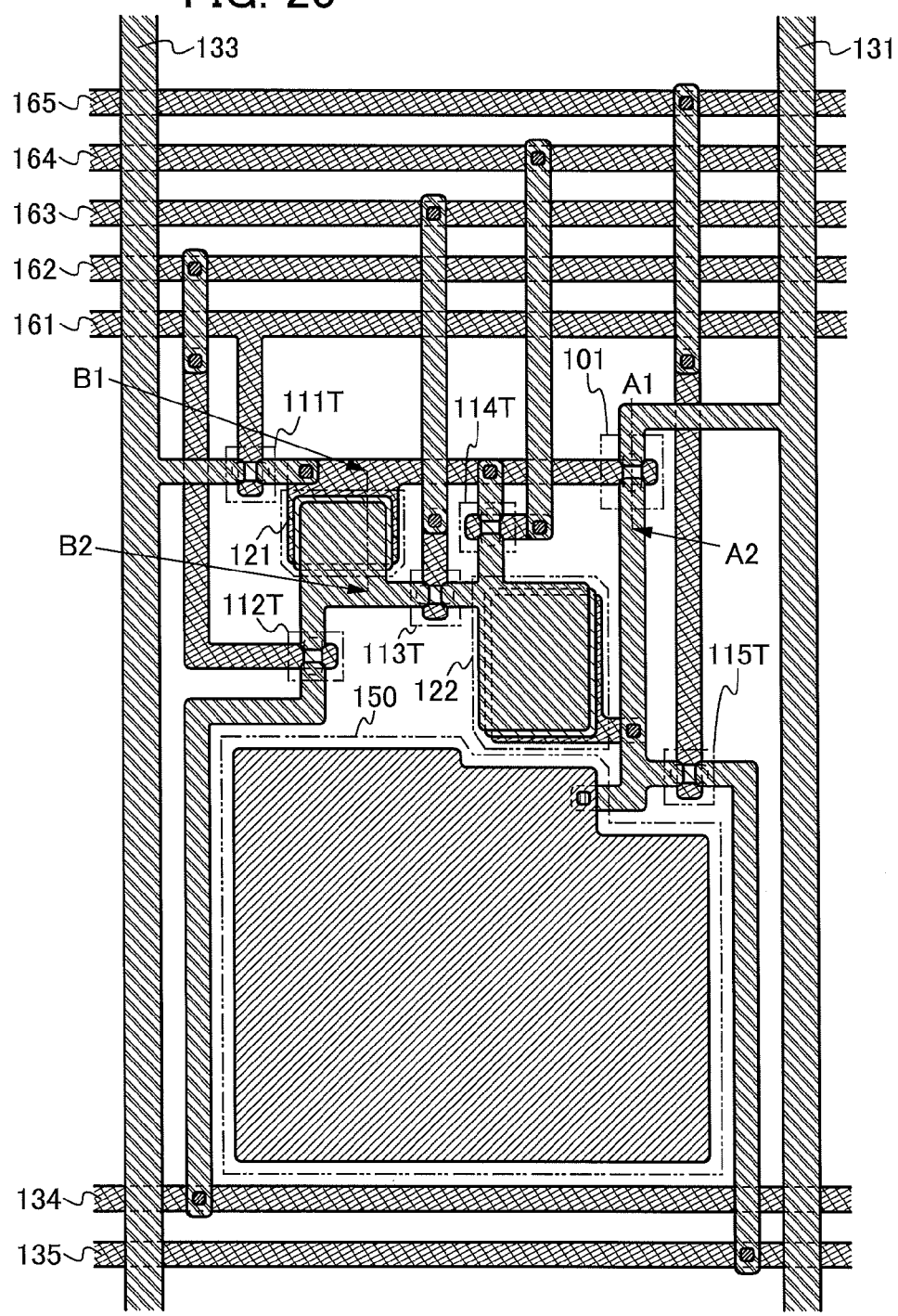
FIG. 25 is a top view illustrating one embodiment of the present invention.
Figure 26A:
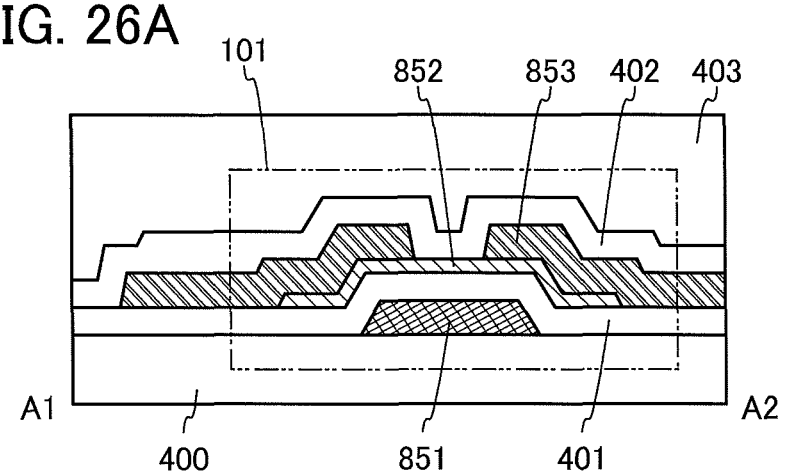
FIGS. 26A and 26B are cross-sectional views illustrating one embodiment of the present invention.
Figure 26B:
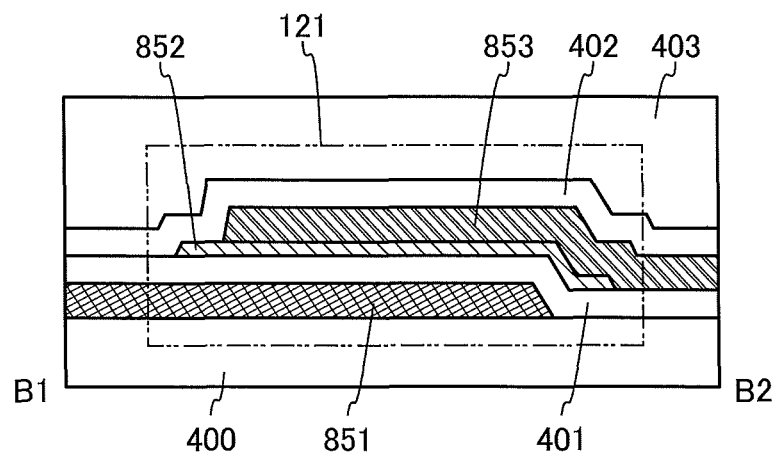

FIG. 25 is a top view illustrating the configuration corresponding to the pixel circuit illustrated in FIG. 18. FIG. 26A is a cross-sectional view taken along two-dot chain line A1-A2 in FIG. 25, and FIG. 26B is a cross-sectional view taken along two-dot chain line B1-B2 in FIG. 25.

In FIG. 25, components corresponding to those in FIG. 18, that is, the transistor 101, the transistor 111T, the transistor 112T, the transistor 113T, the transistor 114T, the transistor 115T, the load 150 (only one of the electrodes is illustrated), the capacitor 121, the capacitor 122, the wiring 109, the wiring 161, the wiring 162, the wiring 163, the 164, the wiring 165, the wiring 132, the wiring 134, and the wiring 135 are illustrated. In the example described in this embodiment, the load 150 is a light-emitting element (e.g., EL element).

The components illustrated in FIG. 25 includes a conductive layer 851, a semiconductor layer 852, a conductive layer 853, a conductive layer 854, a conductive layer 855, a contact hole 856, and a contact hole 858. In the top views used in this embodiment, a substrate and insulating layers are not illustrated.

The conductive layer 851 has regions functioning as a gate electrode and a scan line. Note that the conductive layer 851 is formed over a substrate over which elements such as the transistors are provided.

Although there is no particular limitation on a substrate used as the substrate, a glass substrate is preferably used. Examples of the substrate include a semiconductor substrate (e.g., a single crystal substrate or a silicon substrate), an SOI substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. As an example of the glass substrate, there are a barium borosilicate glass substrate, an aluminoborosilicate glass substrate, soda lime glass substrate, and the like. For the flexible substrate, a flexible synthetic resin such as plastics typified by polyethylene terephthalate (PET), polyethylene naphthalate (PEN), and polyether sulfone (PES), or acrylic can be used, for example. Examples of the attachment film are polypropylene, polyester, polyvinyl fluoride, polyvinyl chloride, and the like. Examples of the base film are polyester, polyamide, polyimide, inorganic vapor deposition film, paper, and the like. Specifically, when a transistor is formed using a semiconductor substrate, a single crystal substrate, an SOI substrate, or the like, a transistor with few variations in characteristics, size, shape, or the like, high current supply capability, and a small size can be formed. By forming a circuit using such transistors, power consumption of the circuit can be reduced or the circuit can be highly integrated.

Note that a transistor may be formed using one substrate, and then, the transistor may be transferred to another substrate. Example of a substrate to which a transistor is transferred are, in addition to the above-described substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. By using such a substrate, transistors with excellent properties or transistors with low power consumption can be formed, a device with high durability or high heat resistance can be formed, or reduction in weight or thickness can be achieved.

A base insulating layer may be sandwiched between the substrate and the conductive layer 851. The base insulating layer is preferably formed with a single layer or a stacked layer using a material selected from silicon nitride, silicon oxide, silicon nitride oxide, silicon oxynitride, aluminum nitride, aluminum oxide, aluminum nitride oxide, and aluminum oxynitride. The base insulating layer formed using any of these materials can prevent diffusion of an impurity element from the substrate.

In this specification, a nitride oxide refers to a material containing a larger amount of nitrogen than oxygen, and an oxynitride refers to a material containing a larger amount of oxygen than nitrogen. The content of each element can be measured by Rutherford backscattering spectrometry (RBS), for example.

The conductive layer 851 can be formed to have a single-layer structure or a stacked structure using one or more of metal materials such as molybdenum (Mo), titanium (Ti), chromium (Cr), tantalum (Ta), tungsten (W), aluminum (Al), magnesium (Mg), copper (Cu), neodymium (Nd), and scandium (Sc) and an alloy material containing any of these metal materials as a main component.

The semiconductor layer 852 has regions in which channels are formed.

The semiconductor layer 852 may include amorphous silicon. The semiconductor layer 852 may include polycrystalline silicon. Alternatively, the semiconductor layer 852 may include an organic semiconductor, an oxide semiconductor, or the like.

The conductive layer 853 has regions functioning as wirings and sources and drains of the transistors.

The conductive layer 853 can be formed using an element selected from Mo, Ti, Cr, Ta, W, Al, Mg, or Cu, an alloy including any of these elements as a component, an alloy film including a combination of any of these elements, or the like. Alternatively, a structure may be employed in which a high-melting-point metal layer of Ti, Mo, W, or the like is stacked over one of or both of the upper side and lower side of a metal layer of Al, Cu, or the like. In addition, heat resistance can be improved by using an Al material to which an element (Si, Nd, Sc, or the like) which prevents generation of a hillock or a whisker in an Al film is added.

Alternatively, the conductive layer 853 may be formed using a conductive metal oxide. As the electrically conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials in which silicon oxide is contained can be used.

The conductive layer 855 has a region functioning as one of the electrodes of the load 150 (in this embodiment, a light-emitting element). The conductive layer 855 is formed using a material having a function of reflecting light in the case where light emitted from the load 150 is extracted from the counter substrate side. The conductive layer 855 is formed using a material having a function of transmitting light in the case where light emitted from the light-emitting element is extracted from the element substrate side.

The contact hole 856 has a function of connecting the conductive layer 851 to the conductive layer 853. An insulating layer 401 functioning as a gate insulating layer is sandwiched between the conductive layer 851 and the conductive layer 853.

The insulating layer 401 can be formed with a single-layer structure or a stacked-layer structure using silicon oxide, silicon nitride, silicon oxynitride, silicon nitride oxide, aluminum oxide, aluminum nitride, aluminum oxynitride, aluminum nitride oxide, or hafnium oxide by plasma CVD, sputtering, or the like.

The contact hole 858 has a function of connecting the conductive layer 853 to the conductive layer 855. An insulating layer 403 providing the planarity of a surface is sandwiched between the conductive layer 853 and the conductive layer 855. For the insulating layer providing the planarity of the surface, an organic material such as polyimide, acrylic resin, or benzocyclobutene-based resin can be used. Other than such organic materials, it is also possible to use a low-dielectric constant material (a low-k material) or the like.

An insulating layer 402 functioning as a passivation layer may be provided between the conductive layer 853 and the conductive layer 855. For the passivation layer, an inorganic insulator such as silicon nitride, aluminum nitride, silicon nitride oxide, or aluminum nitride oxide can be used. As illustrated in FIG. 26A, the insulating layer 402 functioning as a passivation layer and the insulating layer 403 providing the planarity of a surface may be stacked between the conductive layer 853 and the conductive layer 855.

Next, a cross-sectional structure of the transistor 101 and the capacitor 121, which are illustrated in the top view of FIG. 25, is described with reference to FIGS. 26A and 26B.

In the example illustrated in FIG. 25 and FIG. 26A, the transistor 101 is a bottom-gate transistor. The bottom-gate transistor 101 illustrated in FIG. 25 and FIG. 26A is also called an inverted staggered transistor. Note that there is no particular limitation on the structure of the transistor; for example, a staggered transistor or a planar transistor having a top-gate structure or a bottom-gate structure can be employed. The transistor may have a single gate structure including one channel formation region in a semiconductor layer, a double gate structure including two channel formation regions in a semiconductor layer, or a triple gate structure including three channel formation regions in a semiconductor layer. Alternatively, the transistor may have a dual-gate structure including two gate electrode layers positioned over and below a channel formation region with a gate insulating layer provided therebetween.

The transistor 101 illustrated in FIG. 26A includes, over a substrate 400, the conductive layer 851 serving as a gate, the insulating layer 401 functioning as a gate insulating layer, the semiconductor layer 852, and the conductive layer 853 serving as a source and a drain. The insulating layer 402 functioning as a passivation layer is formed to cover the transistor 101. The insulating layer 403 providing the planarity of a surface is provided over the insulating layer 402.

The capacitor 121 illustrated in the cross-sectional view of FIG. 26B includes, over the substrate 400, the conductive layer 851 serving as one electrode, the insulating layer 401, the semiconductor layer 852, and the conductive layer 853 serving as the other electrode. The insulating layer 402 functioning as a passivation layer is provided so as to cover the capacitor 121. An insulating layer 403 providing the planarity of the surface is formed over the insulating layer 402.

The pixel configuration that can be applied to the display device is not limited to the configuration illustrated in the top view of FIG. 25 and may be other configurations.

A top view of a pixel having a configuration different from that in FIG. 25 is illustrated in FIG. 27. FIG. 27 is different from FIG. 25 in that the size of the transistor 101 which allows the circuit to function as a current source is larger than the size of the transistor functioning as a switch. With this structure, the amount of current flowing through the transistor 101 which allows the circuit to function as a current source can be increased.

Figure 28:
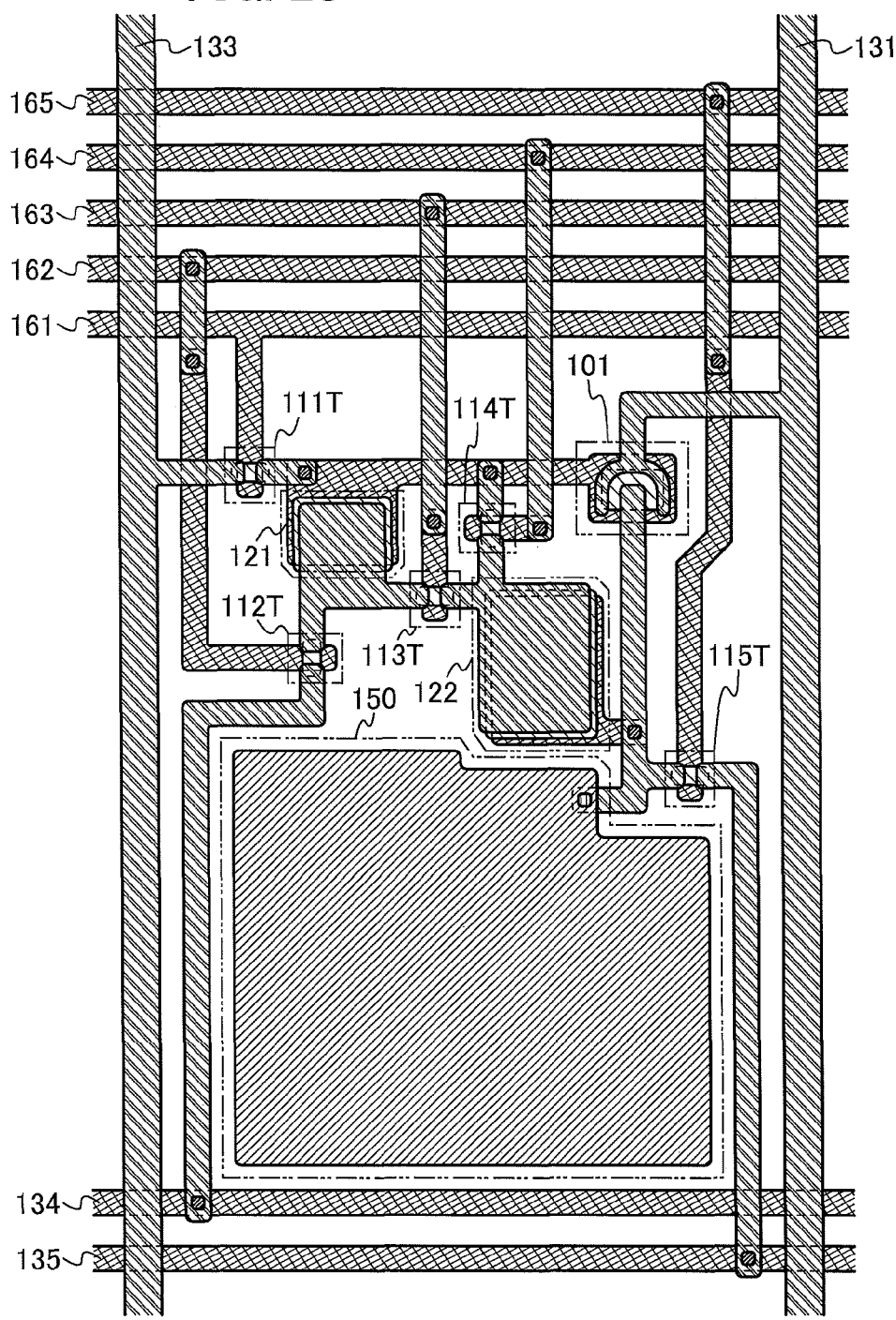
FIG. 28 is a top view illustrating one embodiment of the present invention.
Figure 29:
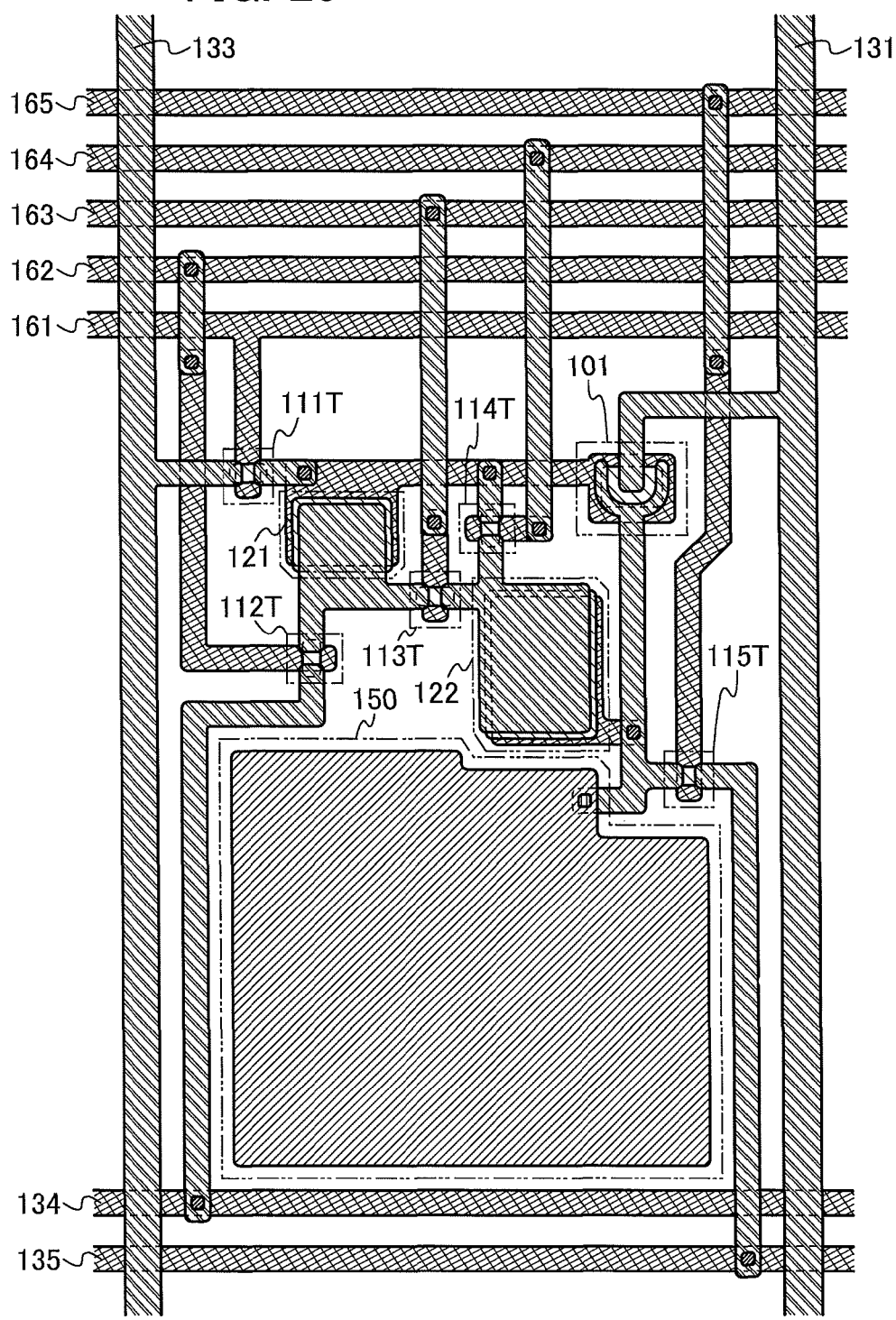
FIG. 29 is a top view illustrating one embodiment of the present invention.

FIG. 28 and FIG. 29 are top views of pixels each having a different configuration from those in FIG. 25 and FIG. 27. FIG. 28 and FIG. 29 are different from FIG. 25 and FIG. 27 in that the electrode serving as the other terminal of the transistor 101 has a U-shape to surround the electrode serving as the one terminal. This structure enables the channel width to be set long even when the area of the transistor is small; accordingly, the amount of current flowing through the transistor 101 which allows the circuit to function as a current source can be increased. Further, a parasitic capacitance generated at the U-shaped electrode serving as the other terminal can be higher than a parasitic capacitance generated at the electrode serving as the one terminal of the transistor 101.

Figure 30:
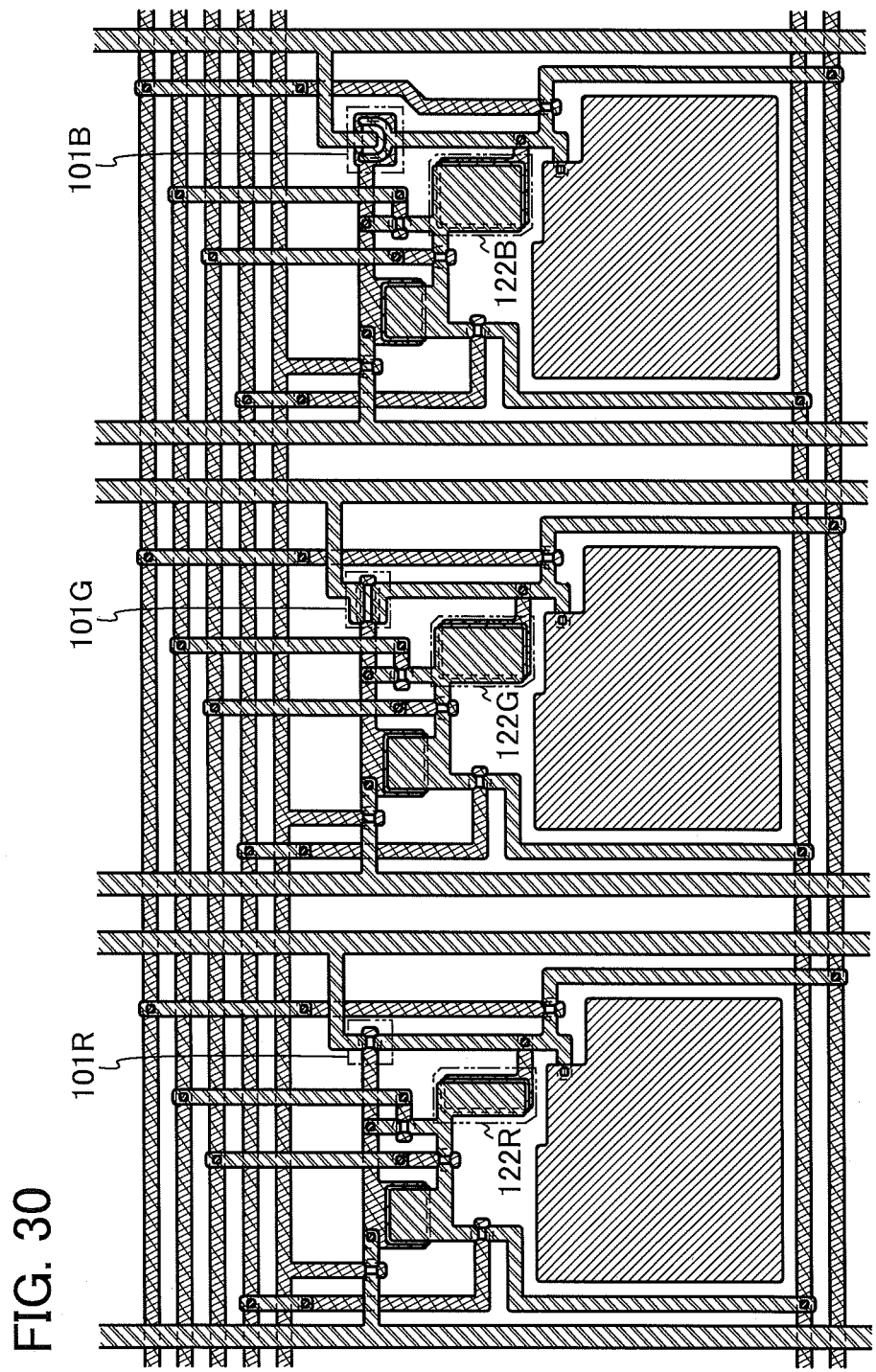
FIG. 30 is a top view illustrating one embodiment of the present invention.

Note that, in the case where pixel circuits (pixels) of FIG. 18 including light-emitting elements of different colors as the loads 150 are arranged in parallel, the pixel circuits may have different sizes of the capacitor 122 or the transistor 101 which allows the circuit to function as a current sources depending on the color. The top view of FIG. 30 illustrates a configuration example of the pixel circuit in which the size of the transistor 101 which allows the circuit to function as a current source is varied depending color. A transistor 101R in FIG. 30 is a transistor which allows the circuit to function as a current source, in a pixel including a red light emitting load 150. A transistor 101G in FIG. 30 is a transistor which allows the circuit to function as a current source, in a pixel including a green light emitting load 150. A transistor 101B in FIG. 30 is a transistor which allows the circuit to function as a current source, in a pixel including a blue light emitting load 150. A capacitor 122R in FIG. 30 is a capacitor in the pixel including the red light emitting load 150. A capacitor 122G in FIG. 30 is a capacitor in the pixel including the green light emitting load 150. A capacitor 122B in FIG. 30 is a capacitor in the pixel including the blue light emitting load 150. With this structure, a proper amount of current can be supplied to the loads 150 of each color.

Figure 31:
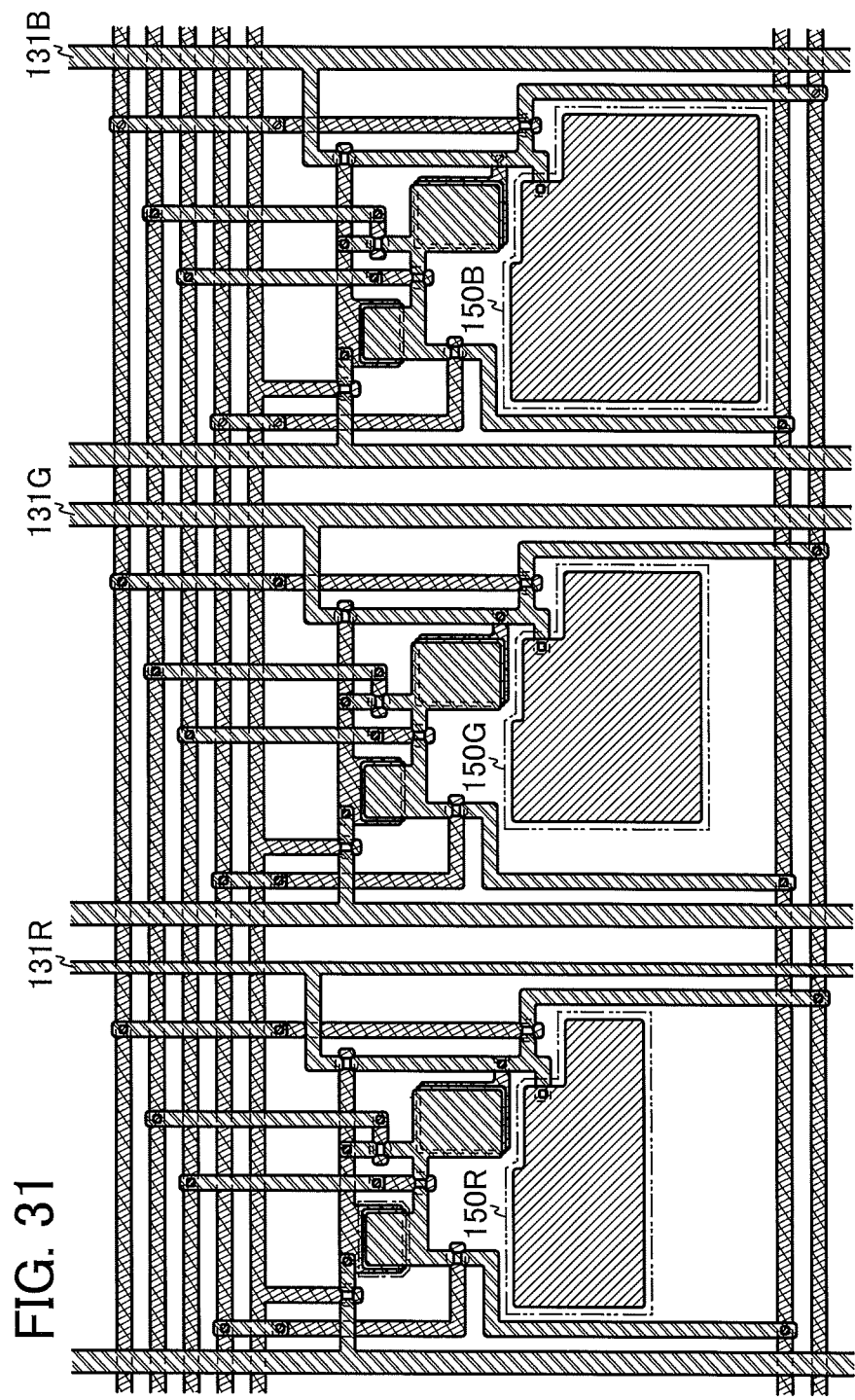
FIG. 31 is a top view illustrating one embodiment of the present invention.

Note that, in the case where pixel circuits (pixels) of FIG. 18 including light-emitting elements of different colors as the loads 150 are arranged in parallel, the pixel circuits may have different widths of the wiring 131 functioning as a power supply line depending on the color. The top view of FIG. 31 illustrates a configuration in which the width of the wiring 131 functioning as a power supply line is varied depending color. A wiring 131R in FIG. 31 is a wiring for supplying a current to the red light emitting load 150. A wiring 131G in FIG. 31 is a wiring for supplying a current to the green light emitting load 150. A wiring 131B in FIG. 31 is a wiring for supplying a current to the blue light emitting load 150. With this structure, a proper amount of current can be supplied to the loads 150 of each color.

In the case where the pixel circuits (pixels) in FIG. 18 including light-emitting elements of different colors as the loads 150 are arranged in parallel, the pixel circuits may have different areas of the electrode of the load 150 depending on the color. A configuration in which the area of the electrode of the load 150 is varied depending color is illustrated also in the top view of FIG. 31. The load 150R in FIG. 31 is the red light emitting load 150. The load 150G in FIG. 31 is the green light emitting load 150. The load 150B in FIG. 31 is the blue light emitting load 150. With this structure, the balance of the luminance among the colors can be adjusted.

Figure 32:
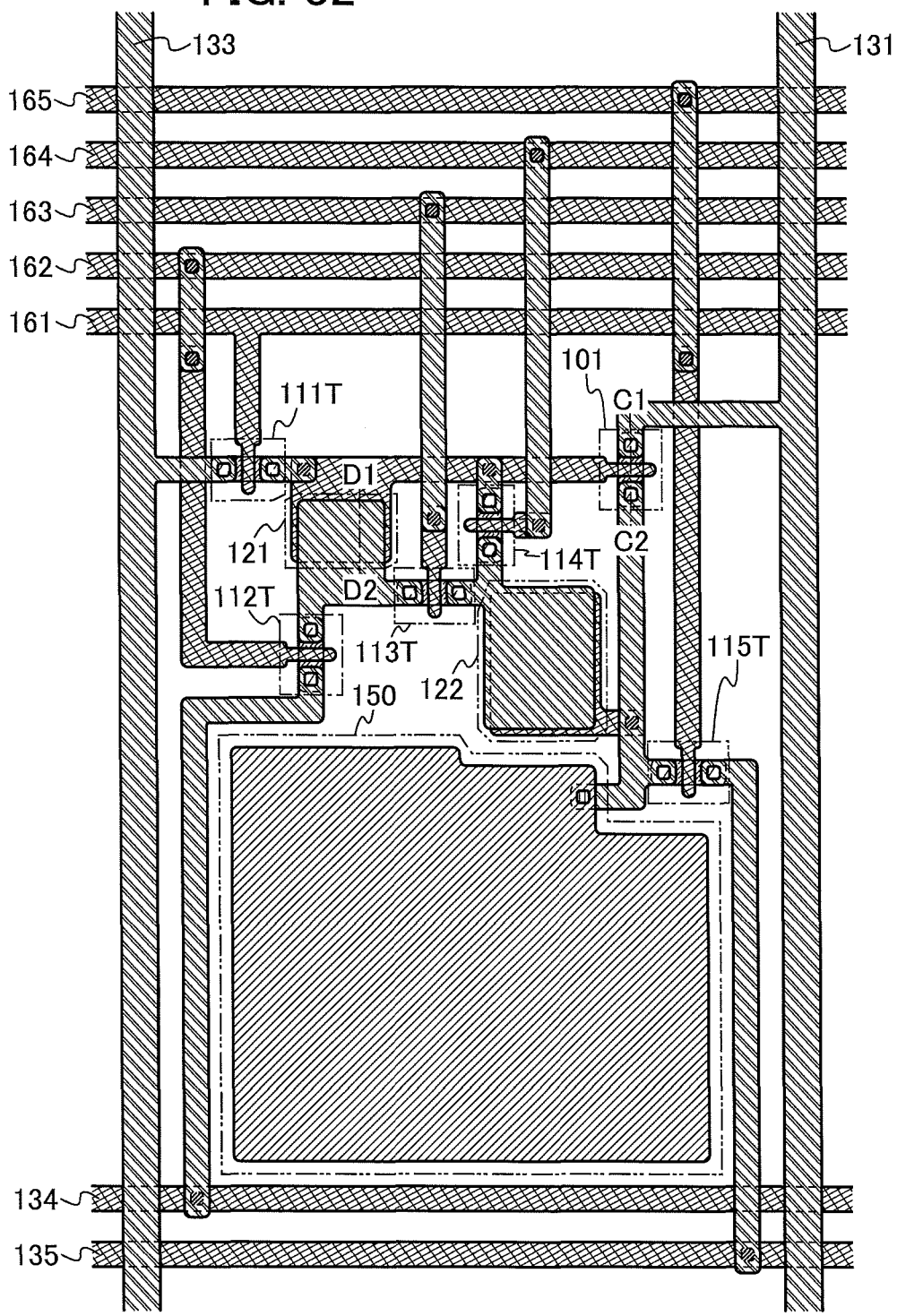
FIG. 32 is a top view illustrating one embodiment of the present invention.
Figure 33A:
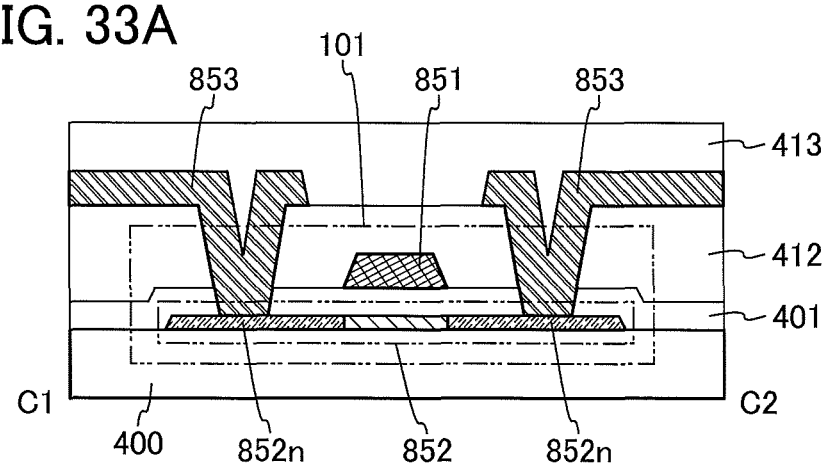
FIGS. 33A and 33B are cross-sectional views illustrating one embodiment of the present invention.
Figure 33B:
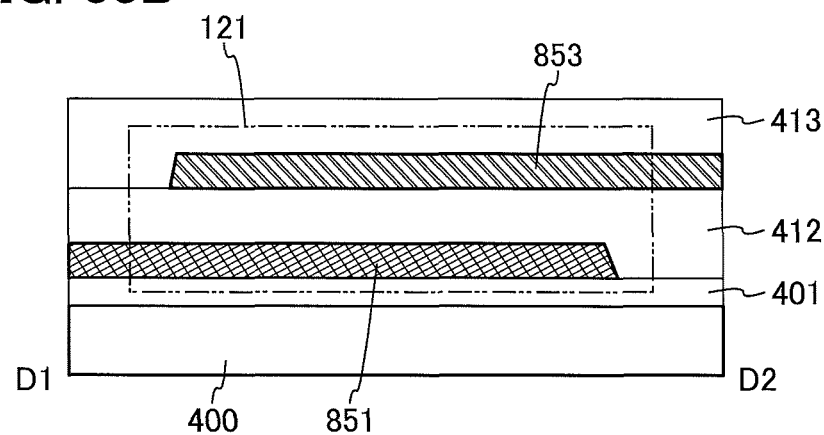

The above top views illustrate an inverted staggered transistor as each transistor, but the transistors may be top-gate transistors. FIG. 32 is a top view where each transistor included in a pixel circuit is a top-gate transistor. FIG. 33A is a cross-sectional view taken along two-dot chain line C1-C2 in FIG. 32, and FIG. 33B is a cross-sectional view taken along two-dot chain line D1-D2 in FIG. 32. Compared with FIG. 25 in the points other than the structure of the transistors, FIG. 32 has more contact holes 859.

The contact holes 859 are provided in the insulating layer 401 and the insulating layer 412 and have a function of connecting the semiconductor layer 852 to the conductive layer 853.

In the case where the transistors included in the pixel circuit are top-gate transistors as illustrated in FIG. 32, semiconductor layers of the transistors are preferably formed using amorphous silicon or polycrystalline silicon. With this structure, the semiconductor layer can be used as a wiring between transistors in such a manner that an impurity element such as phosphorus or boron is introduced into the semiconductor layer to increase conductivity thereof.

Here, a cross-sectional structure of the transistor 101 and the capacitor 121, which are illustrated in the top view of FIG. 32, is described with reference to FIGS. 33A and 33B.

FIG. 33A illustrates an example of a cross-sectional structure of a top-gate transistor that can be applied to the transistor 101. FIG. 33B illustrates an example of a cross-sectional structure that can be applied to the capacitor 121.

The top-gate transistor 101 illustrated in FIG. 32 and FIG. 33A is also called a planar transistor. The transistor may have a single gate structure including one channel formation region, a double gate structure including two channel formation regions, or a triple gate structure including three channel formation regions. Alternatively, the transistor may have a dual gate structure including two gate electrode layers positioned over and below a channel region with a gate insulating layer provided therebetween.

The transistor 101 illustrated in the cross-sectional view of FIG. 33A includes, over the substrate 400, the semiconductor layer 852 including impurity regions 852n into which an impurity is introduced to improve conductivity, the insulating layer 401 functioning as a gate insulating layer, the conductive layer 851 serving as a gate, the insulating layer 412 functioning as an interlayer insulating layer, and the conductive layer 853 functioning as a source and a drain. An insulating layer 413 providing the planarity of the surface is formed to cover the insulating layer 412 and the conductive layer 853.

The capacitor 121 illustrated in the cross-sectional view of FIG. 33B includes, over the substrate 400, the insulating layer 401, the conductive layer 851 serving as one electrode, the insulating layer 412, and the conductive layer 853 serving as the other electrode. The insulating layer 413 providing the planarity of the surface is formed to cover the insulating layer 412 and the conductive layer 853.

Figure 34:
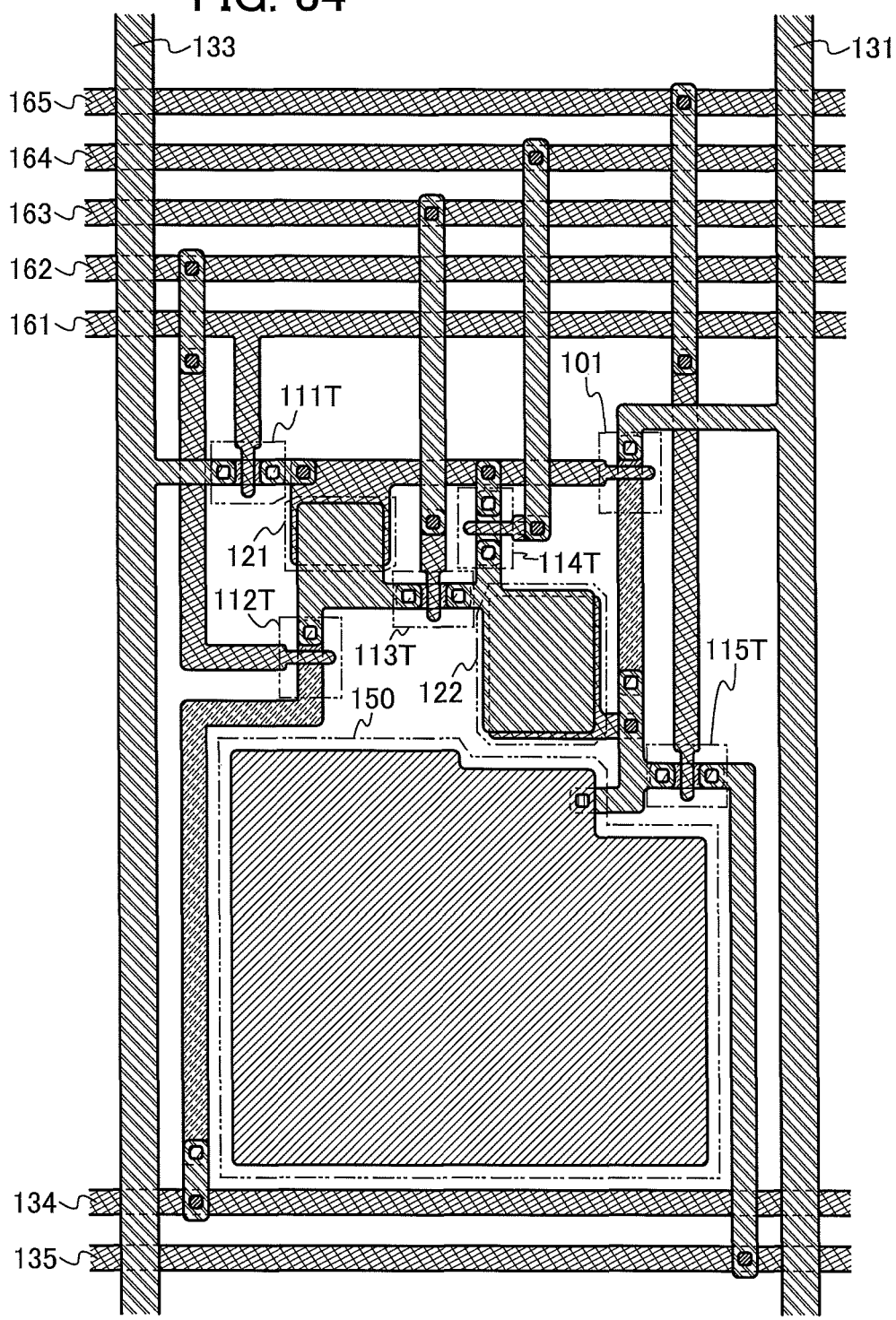
FIG. 34 is a top view illustrating one embodiment of the present invention.

FIG. 34 is a top view illustrating the structure utilizing, as a wiring, the semiconductor layer whose conductivity is increased by introduction of an impurity element such as phosphorus or boron. The semiconductor layer whose conductivity is increased is denoted by 860 in FIG. 34.

This embodiment is obtained by performing change, addition, modification, removal, application, superordinate conceptualization, or subordinate conceptualization on part or the whole of another embodiment. Thus, part of or the whole of this embodiment can be freely combined with or replaced with part of or the whole of another embodiment.

Embodiment 4

In this embodiment, a circuit configuration where each transistor included in the pixel circuit of the display device described with reference to FIG. 18 in the above embodiment is a transistor including an oxide semiconductor in its semiconductor layer in which a channel is formed will be described.

Figure 35:
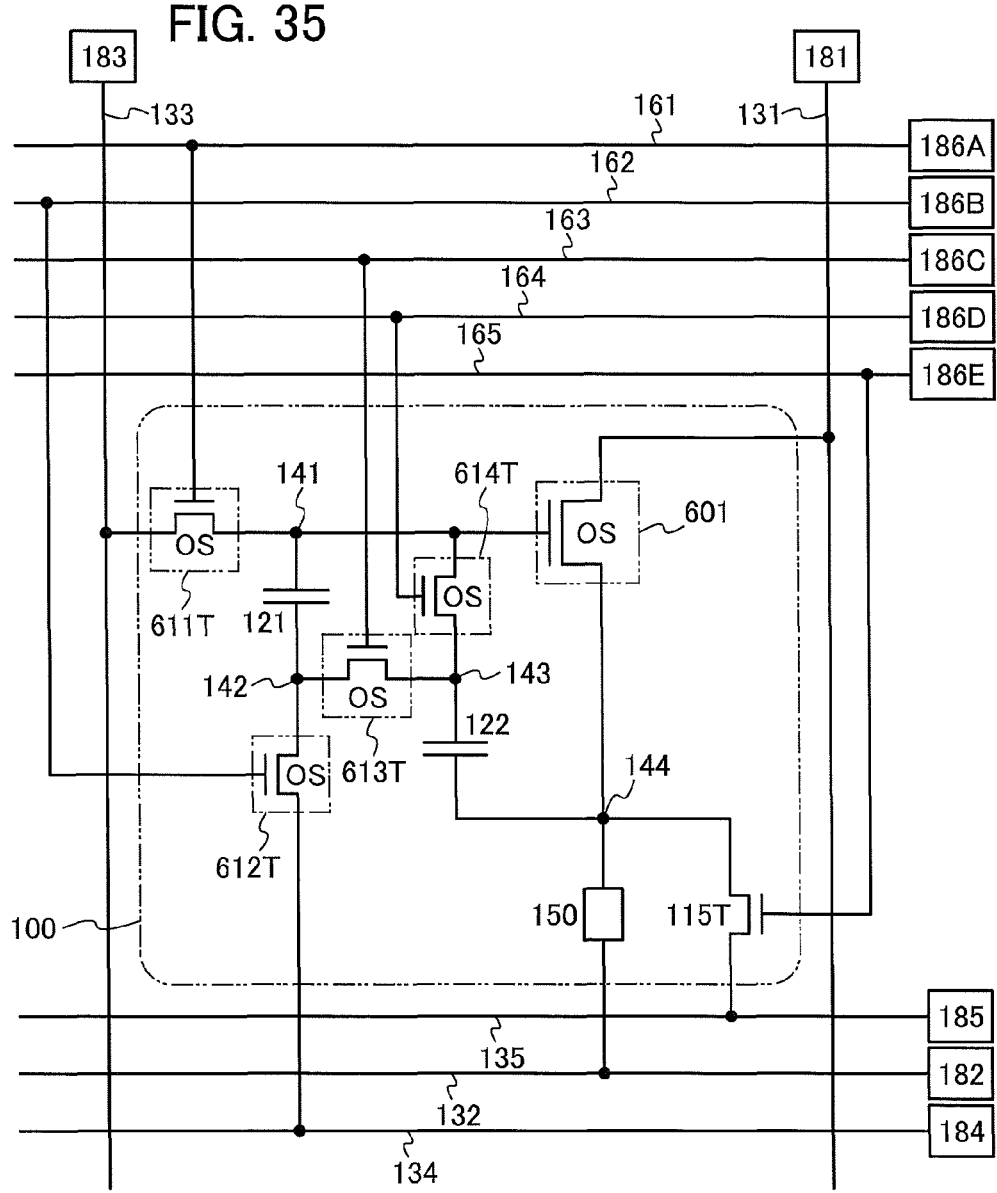
FIG. 35 is a circuit diagram showing one embodiment of the present invention.

A pixel circuit 600 illustrated in FIG. 35 has a configuration where a transistor including an oxide semiconductor in its semiconductor layer in which a channel is formed is used as each transistor included in the pixel circuit 100 illustrated in FIG. 18. A transistor 601, a transistor 611T, a transistor 612T, a transistor 613T, a transistor 614T, and a transistor 615T in FIG. 35 correspond to the transistor 101, the transistor 111T, the transistor 112T, the transistor 113T, the transistor 114T, and the transistor 115T in FIG. 18. By using an oxide semiconductor in a semiconductor layer in which a channel is formed, off-state current of the transistor can be reduced. Accordingly, malfunctions can be reduced in the circuit configuration.

Note that in this specification, the off-state current is a current that flows between a source and a drain when a transistor is off. In the case of an n-channel transistor (whose threshold voltage is, for example, about 0 V to 2 V), the off-state current refers to a current flowing between the source and the drain when a negative voltage is applied between the gate and the source.

Next, an oxide semiconductor used in a semiconductor layer in which a channel is formed will be described.

As the oxide semiconductor, for example, a four-component metal oxide such as an In—Sn—Ga—Zn-based oxide semiconductor; a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, a Sn—Al—Zn-based oxide semiconductor, or a Hf—In—Zn-based oxide semiconductor; a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, or an In—Ga-based oxide semiconductor; or a single-component metal oxide such as an In-based oxide semiconductor, a Sn-based oxide semiconductor, or a Zn-based oxide semiconductor can be used. In addition, any of the above oxide semiconductors may contain an element other than In, Ga, Sn, and Zn, for example, $SiO_2$.

For example, an In—Sn—Zn-based oxide semiconductor refers to an oxide semiconductor containing indium (In), tin (Sn), and zinc (Zn), and there is no particular limitation on the composition thereof. Further, for example, an In—Ga—Zn-based oxide semiconductor refers to an oxide semiconductor containing indium (In), gallium (Ga), and zinc (Zn), and there is no limitation on the composition thereof. An In—Ga—Zn-based oxide semiconductor can be referred to as IGZO.

In the case where an In—Sn—Zn-based oxide semiconductor is deposited by sputtering, a target which has a composition of In:Sn:Zn=1:2:2, 2:1:3, 1:1:1, 20:45:35, or the like in an atomic ratio is used.

In the case where an In—Zn-based oxide semiconductor is deposited by sputtering, a target which has a composition of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio) is used. For example, in a target which has an atomic ratio of In:Zn:O=X:Y:Z, an inequality of Z>1.5X+Y is satisfied.

In the case where an In—Ga—Zn-based oxide semiconductor is deposited by sputtering, a target which has a composition of In:Ga:Zn=1:1:0.5, 1:1:1, or 1:1:2 in an atomic ratio is used.

When the purity of the target is set to 99.99% or higher, alkali metal, a hydrogen atom, a hydrogen molecule, water, a hydroxyl group, a hydride, or the like mixed into the oxide semiconductor can be reduced. In addition, when the target is used, the concentration of alkali metal such as lithium, sodium, or potassium can be reduced in the oxide semiconductor.

Note that it has been pointed out that an oxide semiconductor is insensitive to impurities, there is no problem even when a considerable amount of metal impurities is contained in the film, and therefore, soda-lime glass which contains a large amount of alkali metal such as sodium (Na) and is inexpensive can be used (Kamiya, Nomura, and Hosono, "Carrier Transport Properties and Electronic Structures of Amorphous Oxide Semiconductors: The present status", *KOTAI BUTSURI* (*SOLID STATE PHYSICS*), 2009, Vol. 44, pp. 621-633). However, such consideration is not appropriate. Alkali metal is not a constituent element of an oxide semiconductor, and therefore, is an impurity. Likewise, alkaline earth metal is an impurity in the case where alkaline earth metal is not a constituent element of an oxide semiconductor. Alkali metal, in particular, Na becomes $Na^+$ when an insulating film in contact with the oxide semiconductor layer is an oxide and Na diffuses into the insulating film. Further, in the oxide semiconductor layer, Na cuts or enters a bond between metal and oxygen which constitute the oxide semiconductor. As a result, for example, deterioration in characteristics of a transistor, such as a negative shift of threshold voltage, which leads to a normally-on state of the transistor, or a decrease in mobility, occurs. In addition, variation in characteristics occurs. Such deterioration in characteristics of the transistor and variation in the characteristics due to the impurity remarkably appear when the concentration of hydrogen in the oxide semiconductor layer is sufficiently low. Therefore, when the hydrogen concentration in the oxide semiconductor layer is lower than or equal to $1\times10^{18}/cm^3$, preferably lower than or equal to $1\times10^{17}/cm^3$, the concentration of the above impurity is preferably reduced. Specifically, the Na concentration measured by secondary ion mass spectrometry is preferably lower than or equal to $5\times10^{16}/cm^3$, further preferably lower than or equal to $1\times10^{16}/cm^3$, still further preferably lower than or equal to $1\times10^{15}/cm^3$. Similarly, the measurement value of a Li concentration is preferably less than or equal to $5\times10^{15}/cm^3$, further preferably less than or equal to $1\times10^{15}/cm^3$. Similarly, the measurement value of a K concentration is preferably less than or equal to $5\times10^{15}/cm^3$, further preferably less than or equal to $1\times10^{15}/cm^3$.

A structure of an oxide semiconductor film will be described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

Nitrogen may be substituted for part of constituent oxygen of the oxide semiconductor. Examples of a crystal structure of the CAAC-OS are described in detail with reference to FIGS. 36A to 36E, FIGS. 37A to 37C, FIGS. 38A to 38C, and FIGS. 39A and 39B. In FIGS. 36A to 36E, FIGS. 37A to 37C, FIGS. 38A to 38C, and FIGS. 39A and 39B, the vertical direction corresponds to the c-axis direction and a plane perpendicular to the c-axis direction corresponds to the a-b plane, unless otherwise specified. When the terms "upper half" and "lower half" are simply used, they refer to an upper half above the a-b plane and a lower half below the a-b plane (an upper half and a lower half with respect to the a-b plane). Furthermore, in FIGS. 36A to 36E, O surrounded by a circle represents a tetracoordinate O atom and O surrounded by a double circle represents a tricoordinate O atom.

Figure 36A:
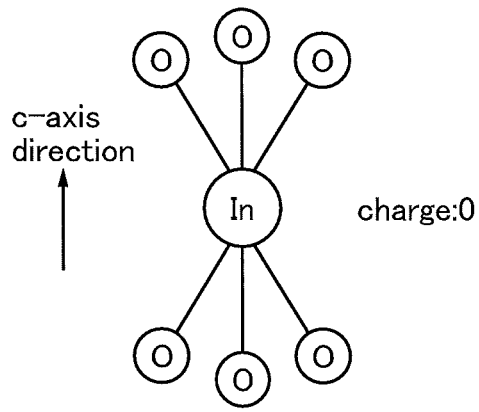
FIGS. 36A to 36E each illustrate a crystal structure of an oxide material.

FIG. 36A illustrates a structure including one hexacoordinate In atom and six tetracoordinate oxygen atoms (hereinafter referred to as tetracoordinate O atoms) proximate to the In atom. Here, a structure including one metal atom and oxygen atoms proximate thereto is referred to as a small group. The structure in FIG. 36A is actually an octahedral structure, but is illustrated as a planar structure for simplicity. Note that three tetracoordinate O atoms exist in each of an upper half and a lower half in FIG. 36A. In the small group illustrated in FIG. 36A, electric charge is 0.

Figure 36D:
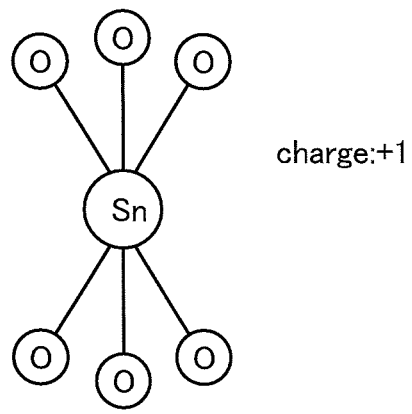
Figure 36B:
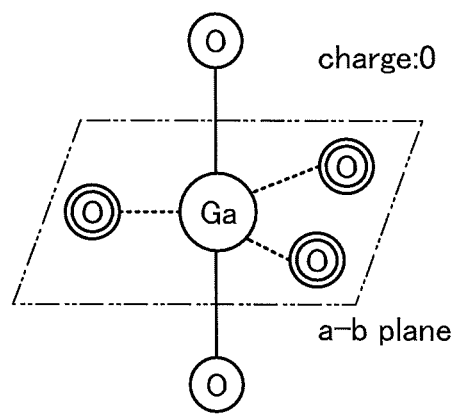

FIG. 36B illustrates a structure including one pentacoordinate Ga atom, three tricoordinate oxygen atoms (hereinafter referred to as tricoordinate O atoms) proximate to the Ga atom, and two tetracoordinate O atoms proximate to the Ga atom. All the tricoordinate O atoms exist on the a-b plane. One tetracoordinate O atom exists in each of an upper half and a lower half in FIG. 36B. An In atom can also have the structure illustrated in FIG. 36B because an In atom can have five ligands. In the small group illustrated in FIG. 36B, electric charge is 0.

Figure 36E:
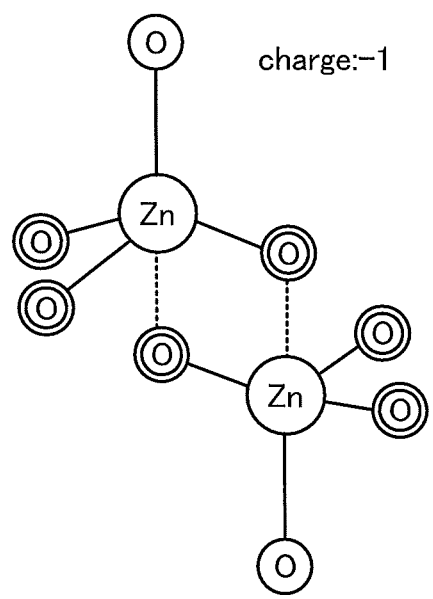
Figure 36C:
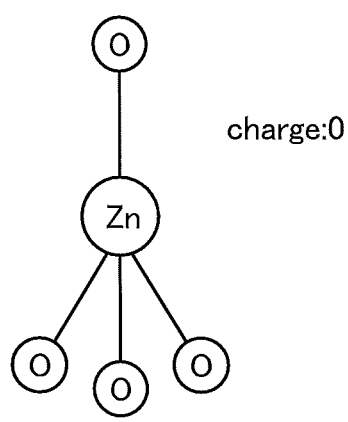

FIG. 36C illustrates a structure including one tetracoordinate Zn atom and four tetracoordinate O atoms proximate to the Zn atom. In FIG. 36C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 36C. In the small group illustrated in FIG. 36C, electric charge is 0.

FIG. 36D illustrates a structure including one hexacoordinate Sn atom and six tetracoordinate O atoms proximate to the Sn atom. In FIG. 36D, three tetracoordinate O atoms exist in each of an upper half and a lower half. In the small group illustrated in FIG. 36D, electric charge is +1.

FIG. 36E illustrates a small group including two Zn atoms. In FIG. 36E, one tetracoordinate O atom exists in each of an upper half and a lower half. In the small group illustrated in FIG. 36E, electric charge is −1.

Here, a plurality of small groups forms a medium group, and a plurality of medium groups forms a large group (also referred to as a unit).

Now, a rule of bonding between the small groups is described. The three O atoms in the upper half with respect to the hexacoordinate In atom in FIG. 36A each have three proximate In atoms in the downward direction, and the three O atoms in the lower half each have three proximate In atoms in the upward direction. The one O atom in the upper half with respect to the pentacoordinate Ga atom in FIG. 36B has one proximate Ga atom in the downward direction, and the one O atom in the lower half has one proximate Ga atom in the upward direction. The one O atom in the upper half with respect to the tetracoordinate Zn atom in FIG. 36C has one proximate Zn atom in the downward direction, and the three O atoms in the lower half each have three proximate Zn atoms in the upward direction. In this manner, the number of tetracoordinate O atoms above a metal atom is equal to the number of metal atoms proximate to and below each of the tetracoordinate O atoms. Similarly, the number of tetracoordinate O atoms below a metal atom is equal to the number of metal atoms proximate to and above each of the tetracoordinate O atoms. Since the coordination number of the tetracoordinate O atom is 4, the sum of the number of metal atoms proximate to and below the O atom and the number of metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason is described below. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 37A illustrates a model of a medium group included in a layered structure of an In—Sn—Zn-based oxide. FIG. 37B illustrates a large group including three medium groups. Note that FIG. 37C illustrates an atomic arrangement in the case where the layered structure in FIG. 37B is observed from the c-axis direction.

In FIG. 37A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom is denoted by circled 3. In a similar manner, in FIG. 37A, one tetracoordinate O atom existing in each of an upper half and a lower half with respect to an In atom is denoted by circled 1. FIG. 37A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 37A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge of a small group including a Sn atom is +1. Therefore, electric charge of −1, which cancels +1, is needed to form a layered structure including a Sn atom. As a structure having electric charge of −1, the small group including two Zn atoms as illustrated in FIG. 36E can be given. For example, with one small group including two Zn atoms, electric charge of one small group including a Sn atom can be cancelled, so that the total electric charge of the layered structure can be 0.

Specifically, when the large group illustrated in FIG. 37B is repeated, a In—Sn—Zn-based oxide crystal ($In_2SnZn_3O_8$) can be obtained. Note that a layered structure of the obtained In—Sn—Zn-based oxide crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 38A:
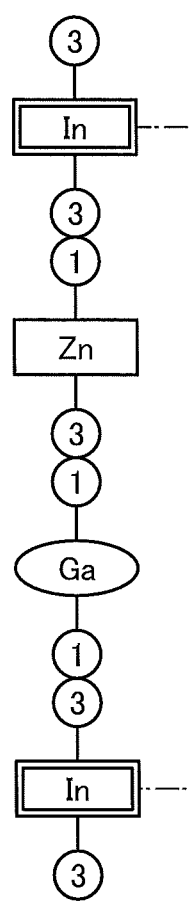
FIGS. 38A to 38C illustrate a crystal structure of an oxide material.

As an example, FIG. 38A illustrates a model of a medium group included in a layered structure of an In—Ga—Zn-based oxide.

In the medium group included in the layered structure of the In—Ga—Zn-based oxide in FIG. 38A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through the one tetracoordinate O atom in the lower half with respect to the Ga atom. A plurality of such medium groups is bonded, so that a large group is formed.

Figure 38B:
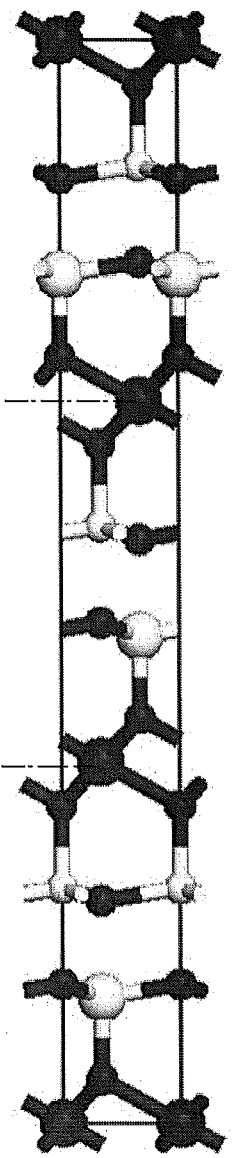
Figure 38C:
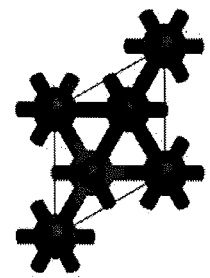

FIG. 38B illustrates a large group including three medium groups. Note that FIG. 38C illustrates an atomic arrangement in the case where the layered structure in FIG. 38B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 38A but also a medium group in which the arrangement of the In atom, the Ga atom, and the Zn atom is different from that in FIG. 38A.

Specifically, when the large group illustrated in FIG. 38B is repeated, an In—Ga—Zn-based oxide crystal can be obtained. Note that a layered structure of the obtained In—Ga—Zn-based oxide crystal can be expressed as a composition formula, $InGaO_3(ZnO)_n$ (n is a natural number).

Figure 39A:
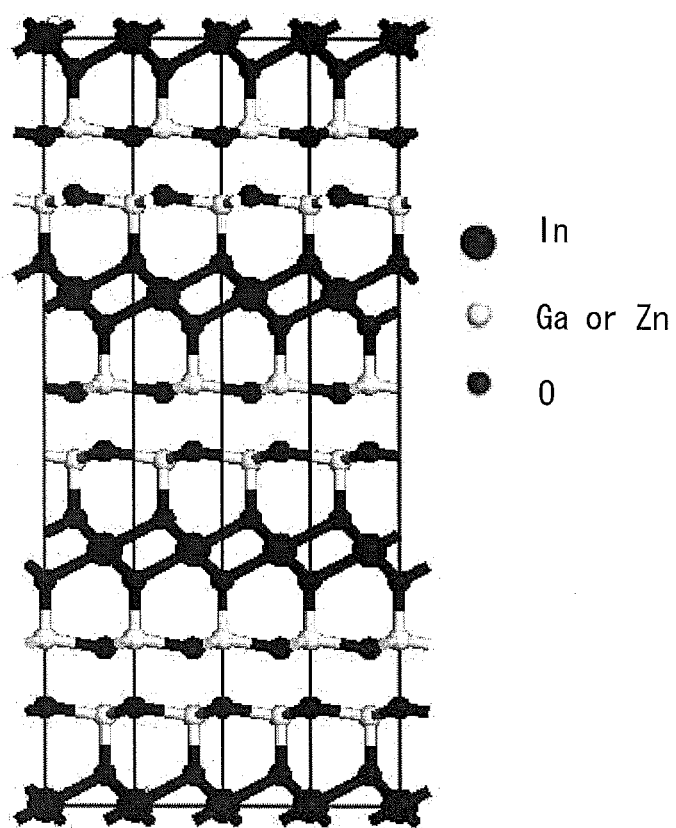
FIGS. 39A and 39B each illustrate a crystal structure of an oxide material.

In the case of n=1 ($InGaZnO_4$), a crystal structure illustrated in FIG. 39A can be obtained, for example. Note that, in the crystal structure in FIG. 39A, since a Ga atom and an In atom each have five ligands as described with reference to FIG. 36B, a structure where Ga is replaced with In can be obtained.

Figure 39B:
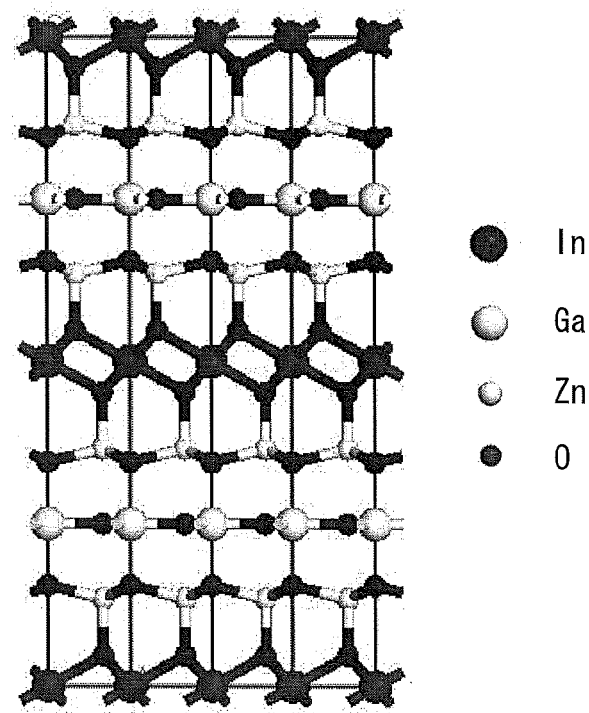

In the case of n=2 ($InGaZn_2O_5$), a crystal structure illustrated in FIG. 39B can be obtained, for example. Note that, in the crystal structure in FIG. 39B, since a Ga atom and an In atom each have five ligands as described with reference to FIG. 36B, a structure where Ga is replaced with In can be obtained.

For example, a film containing CAAC-OS (hereinafter also referred to as a CAAC-OS film) can be deposited by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while keeping its crystal state, whereby the crystal state of the sputtering target is transferred to the substrate and the CAAC-OS film can be formed over the substrate.

For the deposition of the CAAC-OS film, the following conditions are preferably used.

By reducing the concentration of impurities during the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target is described below.

The polycrystalline In—Ga—Zn-based oxide target is made by mixing $InO_X$ powder, $GaO_Y$ powder, and $ZnO_Z$ powder in a predetermined ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powders and the ratio for mixing the powders may be determined as appropriate depending on the desired sputtering target.

A film surface where the CAAC-OS film is formed (deposition surface) is preferably flat. This is because the c-axes of crystal parts in the CAAC-OS film are substantially perpendicular to the deposition surface, and thus roughness of the deposition surface causes grain boundaries in the CAAC-OS film. For that reason, the deposition surface is preferably subjected to planarization treatment such as chemical mechanical polishing (CMP) before the CAAC-OS film is formed. The average roughness of the deposition surface is preferably 0.5 nm or less, further preferably 0.3 nm or less.

Note that the oxide semiconductor deposited by sputtering or the like contains moisture or hydrogen (including a hydroxyl group) as an impurity in some cases. In one embodiment of the present invention, in order to reduce impurities such as moisture or hydrogen in the oxide semiconductor (or a semiconductor layer formed containing the oxide semiconductor) (in order to perform dehydration or dehydrogenation), the oxide semiconductor is subjected to heat treatment in a reduced-pressure atmosphere, an inert gas atmosphere of nitrogen, a rare gas, or the like, an oxygen gas atmosphere, or ultra dry air (the moisture amount is less than or equal to 20 ppm (−55° C. by conversion into a dew point), preferably less than or equal to 1 ppm, further preferably less than or equal to 10 ppb, in the case where the measurement is performed with a dew point meter of a cavity ring down laser spectroscopy (CRDS) system).

By performing heat treatment on the oxide semiconductor, moisture or hydrogen in the oxide semiconductor can be eliminated. Specifically, the heat treatment may be performed at a temperature higher than or equal to 250° C. and lower than or equal to 750° C., preferably higher than or equal to 400° C. and lower than the strain point of the substrate. For example, the heat treatment may be performed at 500° C. for longer than or equal to 3 minutes and shorter than or equal to 6 minutes. When an RTA method is used for the heat treatment, dehydration or dehydrogenation can be performed in a short time; thus, treatment can be performed even at a temperature higher than the strain point of a glass substrate.

After moisture or hydrogen in the oxide semiconductor is eliminated in this manner, oxygen is added. Thus, oxygen defects, for example, in the oxide semiconductor can be reduced, so that the oxide semiconductor can be i-type (intrinsic) or substantially i-type.

Oxygen can be added in such a manner that, for example, an insulating film including a region where the proportion of oxygen is higher than that in the stoichiometric composition ratio is formed in contact with the oxide semiconductor, and then heat treatment is performed. In such a manner, excess oxygen in the insulating film can be supplied to the oxide semiconductor. Thus, the oxide semiconductor can contain oxygen excessively. Oxygen contained excessively exists, for example, between lattices of a crystal included in the oxide semiconductor.

Note that the insulating film including a region where the proportion of oxygen is higher than that in the stoichiometric composition may be used for either an insulating film positioned on the upper side of the oxide semiconductor or an insulating film positioned on the lower side of the oxide semiconductor of insulating films in contact with the oxide semiconductor; it is preferable to use such an insulating film to both of the insulating films in contact with the oxide semiconductor. The above-described effect can be enhanced with a structure in which the insulating films each including a region where the proportion of oxygen is higher than that in the stoichiometric composition are used as the insulating films in contact with the oxide semiconductor and positioned on the upper side and lower side of the oxide semiconductor so that the oxide semiconductor is sandwiched between the insulating films.

Here, the insulating film including a region where the proportion of oxygen is higher than that in the stoichiometric composition may be a single-layer insulating film or a plurality of insulating films stacked. Note that it is preferable that the insulating film contain impurities such as moisture and hydrogen as little as possible. When hydrogen is contained in the insulating film, entry of the hydrogen into the oxide semiconductor or extraction of oxygen from the oxide semiconductor by the hydrogen occurs, whereby the oxide semiconductor has lower resistance (n-type conductivity); thus, a parasitic channel might be formed. Therefore, it is important that a film formation method in which hydrogen is not used be employed in order to form the insulating film containing as little hydrogen as possible. In addition, a material having a high barrier property is preferably used for the insulating film. For example, as the insulating film having a high barrier property, a silicon nitride film, a silicon nitride oxide film, an aluminum nitride film, an aluminum oxide film, or an aluminum nitride oxide film can be used. In the case of using a plurality of insulating films stacked, an insulating film having a low proportion of nitrogen such as a silicon oxide film or a silicon oxynitride film is formed to be closer to the oxide semiconductor than the insulating film having a high barrier property. Then, the insulating film having a high barrier property is formed to overlap with the oxide semiconductor with the insulating film having a low proportion of nitrogen positioned therebetween. With the use of the insulating film having a high barrier property, impurities such as moisture and hydrogen can be prevented from entering the oxide semiconductor, an interface between the oxide semiconductor and another insulating film, and the vicinity thereof. In addition, the insulating film having a low proportion of nitrogen such as a silicon oxide film or a silicon oxynitride film is formed in contact with the oxide semiconductor, so that the insulating film formed using a material having a high barrier property can be prevented from being in contact with the oxide semiconductor directly.

Alternatively, the addition of oxygen after moisture or hydrogen in the oxide semiconductor is eliminated may be performed by performing heat treatment on the oxide semiconductor in an oxygen atmosphere. The heat treatment is performed at a temperature, for example, higher than or equal to 100° C. and lower than 350° C., preferably higher than or equal to 150° C. and lower than 250° C. It is preferable that an oxygen gas used for the heat treatment in an oxygen atmosphere do not contain water, hydrogen, and the like. The purity of the oxygen gas which is introduced into a heat treatment apparatus is preferably higher than or equal to 6N (99.9999%), further preferably higher than or equal to 7N (99.99999%) (that is, the impurity concentration in the oxygen gas is preferably lower than or equal to 1 ppm, further preferably lower than or equal to 0.1 ppm).

Alternatively, the addition of oxygen after moisture or hydrogen in the oxide semiconductor is eliminated may be performed by an ion implantation method, an ion doping method, or the like. For example, oxygen made to be plasma with a microwave of 2.45 GHz may be added to the oxide semiconductor.

The thus formed oxide semiconductor layer can be used as the semiconductor layer of a transistor. In this manner, a transistor with extremely small off-state current can be obtained.

Alternatively, the semiconductor layer of the transistor 601 may include microcrystalline silicon. Note that microcrystalline silicon is a semiconductor having an intermediate structure between an amorphous structure and a crystalline structure (including single crystal and polycrystal). In microcrystalline silicon, columnar or needle-like crystals having a grain size greater than or equal to 2 nm and less than or equal to 200 nm, preferably greater than or equal to 10 nm and less than or equal to 80 nm, further preferably greater than or equal to 20 nm and less than or equal to 50 nm, still further preferably greater than or equal to 25 nm and less than or equal to 33 nm, have grown in a direction normal to a substrate surface. Therefore, a grain boundary is formed at an interface between the columnar or needle-like crystals in some cases.

Alternatively, the semiconductor layer of the transistor 601 may include amorphous silicon. Alternatively, the semiconductor layer of the transistor 601 may include polycrystalline silicon. Alternatively, the semiconductor layer of the transistor 601 may include an organic semiconductor, a carbon nanotube, or the like.

The semiconductor layer of the transistor 601 may have a stacked structure including a plurality of oxide semiconductors. For example, the semiconductor layer may be a stacked layer of a first oxide semiconductor layer and a second oxide semiconductor layer which are formed using metal oxides with different compositions. For example, the first oxide semiconductor layer may be formed using a three-component metal oxide, and the second oxide semiconductor layer may be formed using a two-component metal oxide. Alternatively, for example, both the first oxide semiconductor layer and the second oxide semiconductor layer may be formed using a three-component metal oxide.

Further, the constituent elements of the first oxide semiconductor layer and the second oxide semiconductor layer may be the same as each other but the composition of the constituent elements of the first oxide semiconductor layer and the second oxide semiconductor layer may be different from each other. For example, the first oxide semiconductor layer may have an atomic ratio of In:Ga:Zn=1:1:1, and the second oxide semiconductor layer may have an atomic ratio of In:Ga:Zn=3:1:2. Alternatively, the first oxide semiconductor layer may have an atomic ratio of In:Ga:Zn=1:3:2, and the second oxide semiconductor layer may have an atomic ratio of In:Ga:Zn=2:1:13.

In this case, one of the first oxide semiconductor layer and the second oxide semiconductor layer which is closer to the gate electrode (on a channel side) preferably contains In and Ga at a proportion satisfying In>Ga. The other which is farther from the gate electrode (on a back channel side) preferably contains In and Ga at a proportion satisfying In≤Ga.

In an oxide semiconductor, the s orbital of heavy metal mainly contributes to carrier transfer, and overlap of the s orbitals is likely to increase when the In content in the oxide semiconductor is increased. Therefore, an oxide having a composition of In>Ga has higher mobility than an oxide having a composition of In≤Ga. Further, in Ga, the formation energy of oxygen vacancies is larger and thus oxygen vacancies are less likely to occur, than in In; therefore, the oxide having a composition of In≤Ga has more stable characteristics than the oxide having a composition of In>Ga.

An oxide semiconductor containing In and Ga at a proportion satisfying In>Ga is used on a channel side, and an oxide semiconductor containing In and Ga at a proportion satisfying In≤Ga is used on a back channel side, so that mobility and reliability of a transistor can be further improved.

Further, oxide semiconductors having different crystallinities may be used for the first oxide semiconductor layer and the second oxide semiconductor layer. That is, the semiconductor layer may be formed using an appropriate combination of a single crystal oxide semiconductor, a polycrystalline oxide semiconductor, an amorphous oxide semiconductor, and a CAAC-OS. When an amorphous oxide semiconductor is used for at least one of the first oxide semiconductor layer and the second oxide semiconductor layer, internal stress or external stress of the semiconductor layer is relieved, variations in characteristics of a transistor is reduced, and reliability of the transistor can be further improved.

On the other hand, an amorphous oxide semiconductor is likely to absorb an impurity which serves as a donor, such as hydrogen, and to generate an oxygen vacancy, and thus easily becomes an n-type. Thus, the oxide semiconductor layer on the channel side is preferably formed using a crystalline oxide semiconductor such as a CAAC-OS.

In the case where a channel-etched bottom-gate transistor is used as the transistor, when an amorphous oxide semiconductor is used on a back channel side, oxygen vacancies are generated due to etching treatment at the time of forming a source electrode and a drain electrode; thus, the oxide semiconductor is likely to be n-type. Therefore, in the case of using a channel-etched transistor, an oxide semiconductor having crystallinity is preferably used for an oxide semiconductor layer on a back channel side.

Further, the semiconductor layer may have a stacked structure of three or more semiconductor layers in which an amorphous oxide semiconductor layer is sandwiched between a plurality of oxide semiconductor layers each having crystallinity. Furthermore, a structure in which an oxide semiconductor layer having crystallinity and an amorphous oxide semiconductor layer are alternately stacked may be employed.

The above structures used when the semiconductor layer has a stacked structure of a plurality of layers can be employed in combination as appropriate.

This embodiment is obtained by performing change, addition, modification, removal, application, superordinate conceptualization, or subordinate conceptualization on part or the whole of another embodiment. Thus, part of or the whole of this embodiment can be freely combined with or replaced with part of or the whole of another embodiment.

Embodiment 5

In this embodiment, an example of a semiconductor device including a driver circuit will be described.

An example of the structure of the semiconductor device of this embodiment will be described with reference to FIGS. 40A and 40B.

Figure 40A:
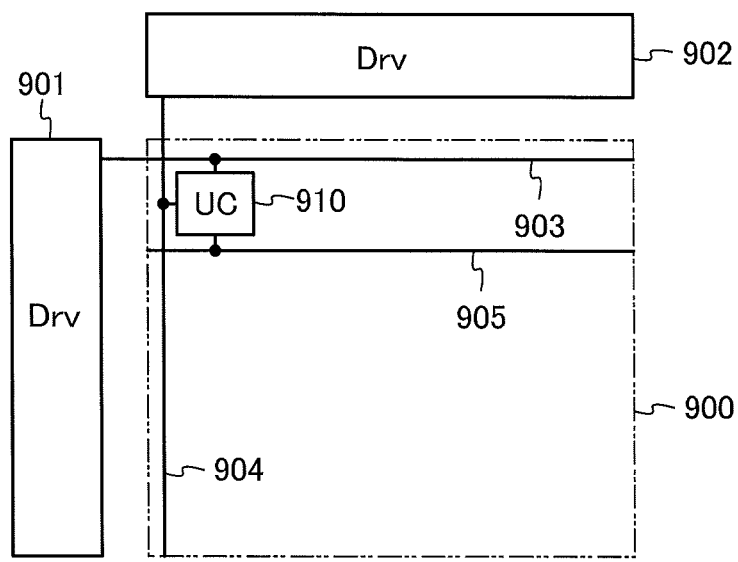
FIGS. 40A and 40B illustrate structural examples of a semiconductor device.

The semiconductor device illustrated in FIG. 40A includes a driver circuit (also referred to as Drv) 901, a driver circuit 902, a wiring 903, a wiring 904, a wiring 905, and a unit circuit (also referred to as UC) 910. Note that a plurality of unit circuits 910 may be provided. For example, a plurality of pixel circuits are provided as the unit circuits, whereby a display device can be formed.

The driver circuit 901 has a function of controlling the unit circuit 910 by inputting a potential or a signal to the unit circuit 910 through the wiring 903.

The driver circuit 901 is formed using a shift register, for example.

The driver circuit 902 has a function of controlling the unit circuit 910 by inputting a potential or a signal to the unit circuit 910 through the wiring 904.

The driver circuit 902 is formed using a shift register, for example.

Note that one of the driver circuits 901 and 902 may be provided over the same substrate as the unit circuit 910.

The wiring 905 can be a wiring for supplying a potential or a wiring for supplying a signal, for example. The wiring 905 is connected to the driver circuit 901 or another circuit. Note that the number of the wirings 905 may be two or more.

Figure 40B:
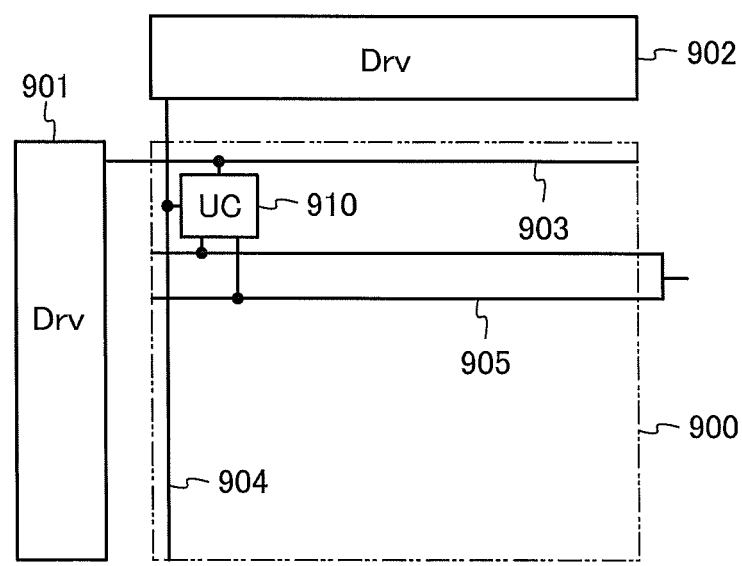

As illustrated in FIG. 40B, the wiring 905 may be a plurality of wirings which are connected to different elements in the unit circuit 910 and which are connected to each other outside a region 900 in which the unit circuit 910 is provided.

As described with reference to FIGS. 40A and 40B, in an example of the semiconductor device of this embodiment, a unit circuit and a driver circuit may be provided over the same substrate.

This embodiment is obtained by performing change, addition, modification, removal, application, superordinate conceptualization, or subordinate conceptualization on part or the whole of another embodiment. Thus, part of or the whole of this embodiment can be freely combined with or replaced with part of or the whole of another embodiment.

Embodiment 6

In this embodiment, a structure of a display panel having any of the pixel configurations described in the above embodiments is described with reference to FIGS. 41A and 41B.

Note that FIG. 41A is a top plan view illustrating a display panel 6000, and FIG. 41B is a cross-sectional view of FIG.

41A taken along chain line E1-E2 in FIG. 41A. In FIG. 41A, the display panel 6000 includes a signal line driver circuit 6701, a pixel portion 6702, a first scan line driver circuit 6703, and a second scan line driver circuit 6706, which are shown by dotted lines. In addition, a substrate 6710, a sealing substrate 6704, and a sealing material 6705 are provided. A portion surrounded by the sealing material 6705 is a space 6707.

Note that a wiring 6708 formed over the substrate 6710 is a wiring for transmitting a signal input to the signal line driver circuit 6701, the first scan line driver circuit 6703, and the second scan line driver circuit 6706 and receives a video signal, a clock signal, a start signal, and the like from a flexible printed circuit (FPC) 6709 functioning as an external input terminal. An IC chip (a semiconductor chip including a memory circuit, a buffer circuit, and the like) 6719 is mounted over a connecting portion of the FPC 6709 and the display panel by chip on glass (COG) or the like. Although only the FPC 6709 is illustrated here, a printed wiring board (PWB) may be attached to the FPC 6709. The display device in this specification includes not only a main body of the display panel but one with an FPC or a PWB attached thereto. In addition, it also includes a display device on which an IC chip or the like is mounted.

Next, the cross-sectional structure is described with reference to FIG. 41B. The pixel portion 6702 and peripheral driver circuits (the first scan line driver circuit 6703, the second scan line driver circuit 6706, and the signal line driver circuit 6701) are formed over a substrate 6710. Here, the signal line driver circuit 6701 and the pixel portion 6702 are illustrated.

Note that the signal line driver circuit 6701 is formed of transistors having the same conductivity type, such as an n-channel transistor 6720 and an n-channel transistor 6721. A pixel can be formed using transistors having the same conductivity type with the use of any of the pixel configurations in FIG. 25 and FIGS. 33A and 33B. Accordingly, the peripheral driver circuits are formed of n-channel transistors, whereby a display panel of a single conductivity type can be manufactured. It is needless to say that a CMOS circuit may be formed using a p-channel transistor as well as an n-channel transistor. Further, in this embodiment, a display panel in which the peripheral driver circuits are formed over one substrate is shown; however, the present invention is not limited thereto. All or some of the peripheral driver circuits may be formed into an IC chip or the like and mounted by COG or the like. In this case, the driver circuit does not need to be formed using transistors of a single conductivity type, and an n-channel transistor and a p-channel transistor can be used in combination.

Further, the pixel portion 6702 includes a transistor 6711 and a transistor 6712. Note that a source electrode of the transistor 6712 is connected to a first electrode (pixel electrode) 6713. An insulating layer 6714 is formed so as to cover end portions of the first electrode 6713. Here, the insulating layer 6714 is formed using a positive photosensitive acrylic resin film.

In order to obtain favorable coverage, the insulating layer 6714 that covers an end portion of the first electrode 6713 is formed to have a curved surface having a curvature at a top end portion or a bottom end portion of the insulating layer 6714. For example, in the case of using a positive photosensitive acrylic as a material for the insulating layer 6714, it is preferable that only the top end portion of the insulating layer 6714 have a curved surface having a radius of curvature (0.2 µm to 3 µm). Moreover, either a negative photosensitive resin or a positive photosensitive resin can be used as the insulating layer 6714.

A layer 6716 containing an organic compound and a second electrode (counter electrode) 6717 are formed over the first electrode 6713. Here, it is preferable to use a material having a high work function as a material for the first electrode 6713 which functions as an anode. For example, a single layer of an indium tin oxide (ITO) film, an indium zinc oxide film, a titanium nitride film, a chromium film, a tungsten film, a Zn film, a Pt film, or the like, a stack of a titanium nitride film and a film containing aluminum as a main component, a three-layer structure of a titanium nitride film, a film containing aluminum as a main component, and a titanium nitride film, or the like can be used. When the layered structure is employed, low wiring resistance, favorable ohmic contact, and a function as an anode can be achieved.

The layer 6716 containing an organic compound is formed by an evaporation method using an evaporation mask, or an ink-jet method. A complex of a metal belonging to Group 4 of the periodic table of the elements is used for a part of the layer 6716 containing an organic compound. Besides, a low molecular material or a high molecular material may be used in combination as well. Further, as a material for the layer 6716 containing an organic compound, a single layer or a stacked layer of an organic compound is often used; however, in this embodiment, an inorganic compound may be used for a part of a film formed using an organic compound. Moreover, a known triplet material can also be used.

Further, as a material for the second electrode 6717 which functions as a cathode and is formed over the layer 6716 containing an organic compound, a material having a low work function (Al, Ag, Li, Ca, or an alloy thereof such as MgAg, MgIn, AlLi, $CaF_2$, or $Ca_3N_2$) may be used. In the case where light generated from the layer 6716 containing an organic compound passes through the second electrode 6717, a stack of a thin metal film with a small thickness and a transparent conductive film (of ITO (indium tin oxide), indium oxide-zinc oxide ($In_2O_3$—ZnO), zinc oxide (ZnO), or the like) is preferably used as the second electrode (cathode) 6717.

Further, by attaching the sealing substrate 6704 to the substrate 6710 with the sealing material 6705, a light-emitting element 6718 is provided in the space 6707 surrounded by the substrate 6710, the sealing substrate 6704, and the sealing material 6705. Note that the space 6707 may be filled with an inert gas (e.g., nitrogen, argon, or the like) or filled with a resin material or the sealant 6705.

Note that an epoxy-based resin is preferably used for the sealing material 6705. It is preferable to use a material that allows as little moisture or oxygen as possible to penetrate. As a material for the sealing substrate 6704, a glass substrate, a quartz substrate, a plastic substrate formed of fiberglass-reinforced plastics (FRP), polyvinylfluoride (PVF), polyester, acrylic, or the like can be used.

In the above manner, a display panel having any of the pixel configurations described in the above embodiments can be obtained.

This embodiment is obtained by performing change, addition, modification, removal, application, superordinate conceptualization, or subordinate conceptualization on part or the whole of another embodiment. Thus, part of or the whole of this embodiment can be freely combined with or replaced with part of or the whole of another embodiment.

Embodiment 7

In this embodiment, an example of a semiconductor device functioning as a display module will be described.

Figure 42:
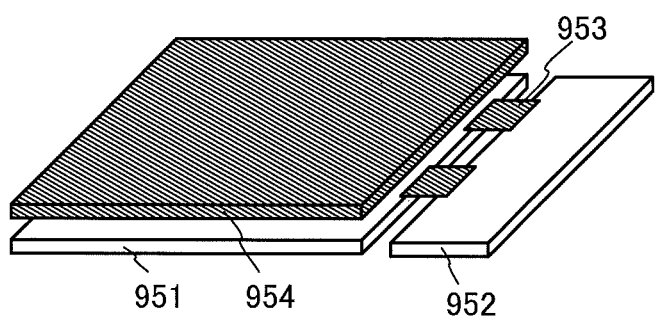
FIG. 42 illustrates one embodiment of the present invention.

An example of the structure of the semiconductor device of this embodiment will be described with reference to FIG. 42. FIG. 42 illustrates an example of the structure of the semiconductor device of this embodiment.

The semiconductor device illustrated in FIG. 42 includes a display panel 951, a circuit board 952 connected to the display panel 951 through a terminal 953, and a touch panel 954 overlapping with the display panel 951.

In the display panel 951, any of the semiconductor devices in the above embodiments of the present invention can be employed.

The circuit board 952 is provided with a circuit having a function of controlling driving of the display panel 951 or the touch panel 954, or the like.

As the touch panel 954, one or more of a capacitive touch panel, a resistive touch panel, an optical touch panel, and the like can be used. Instead of or in addition to the touch panel 954, for example, a display module may be provided by provision of a housing, a radiator plate, an optical film, a polarizing plate, a retardation plate, a prism sheet, a diffusion plate, a backlight, and the like.

As illustrated in FIG. 42, the semiconductor device of this embodiment is formed using the semiconductor device described in any of the above embodiments and another component such as a touch panel.

Note that the touch panel and the display panel 951 may be formed over the same substrate. For example, in the case where a counter substrate is provided over a substrate (element substrate) where a transistor and a light-emitting element are formed, an electrode for the touch panel and the like may be formed over a surface of the counter substrate. The counter substrate has a function of sealing the light-emitting element in some cases and may also have a function of a touch panel. Alternatively, the element substrate may have a function of a touch panel.

Embodiment 8

In this embodiment, examples of electronic appliances are described.

FIGS. 43A to 43H and FIGS. 44A to 44H illustrate electronic appliances. These electronic appliances can include a housing 5000, a display portion 5001, a speaker 5003, an LED lamp 5004, an operation key 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 43A:
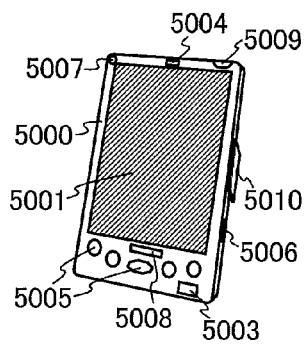
FIGS. 43A to 43H illustrate electronic appliances.
Figure 43B:
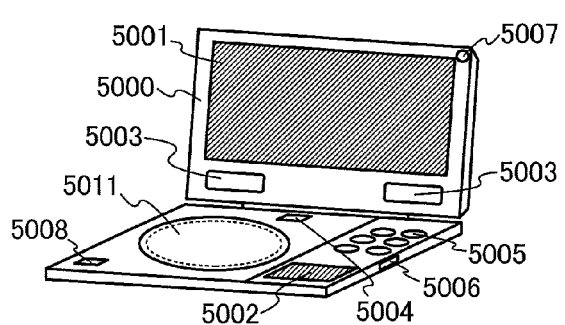
Figure 43C:
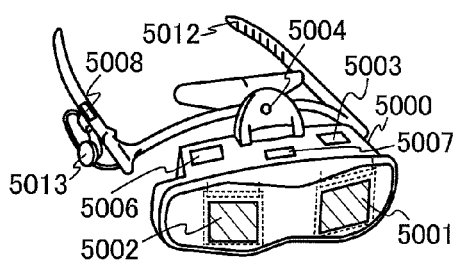
Figure 43D:
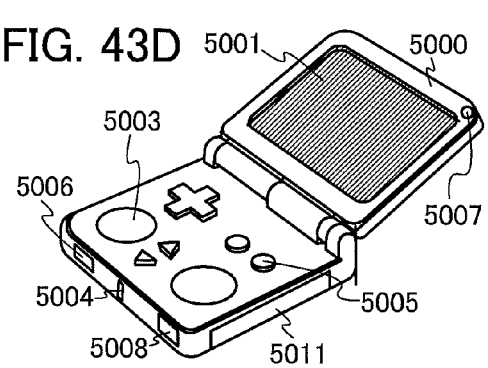
Figure 43E:
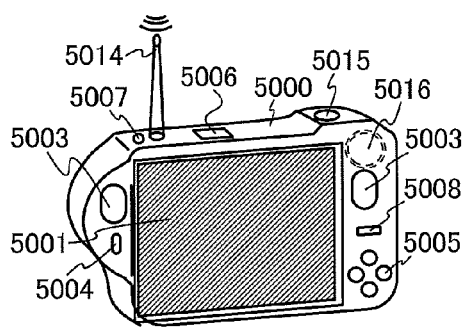
Figure 43F:
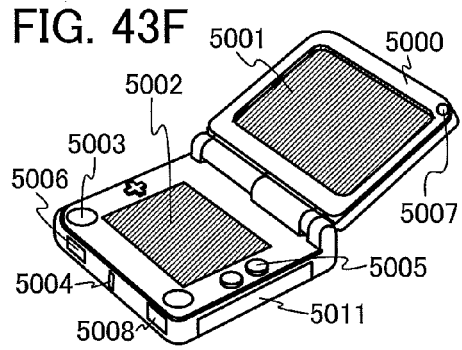
Figure 43G:
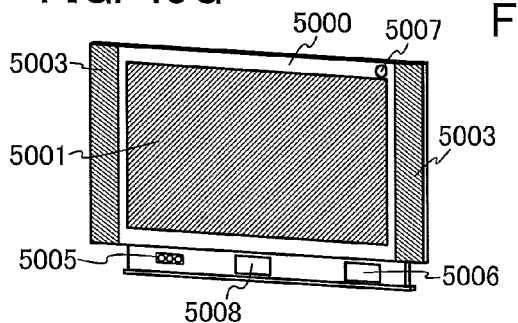
Figure 43H:
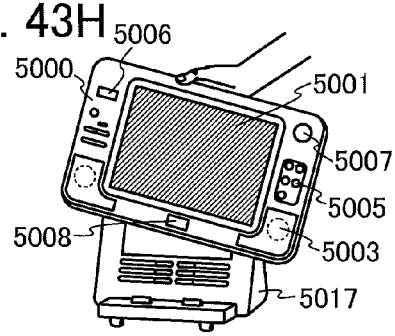
Figure 44A:
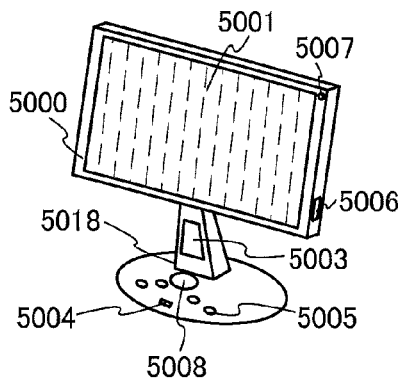
FIGS. 44A to 44H illustrate electronic appliances.
Figure 44B:
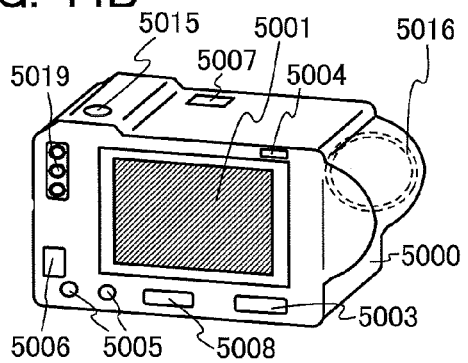
Figure 44C:
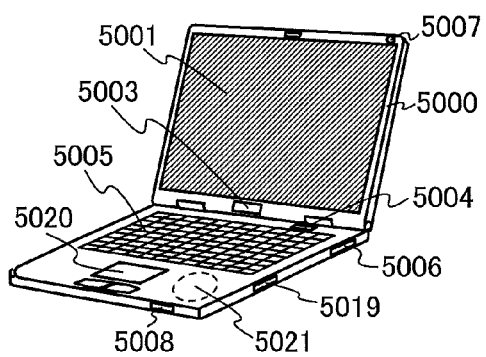
Figure 44D:
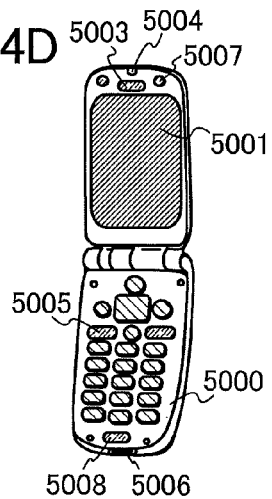

FIG. 43A illustrates a mobile computer which can include a switch 5009, an infrared port 5010, and the like in addition to the above objects. FIG. 43B illustrates a portable image reproducing device (e.g., a DVD reproducing device) provided with a memory medium, which can include a second display portion 5002, a memory medium reading portion 5011, and the like in addition to the above objects. FIG. 43C illustrates a goggle-type display which can include the second display portion 5002, a support 5012, an earphone 5013, and the like in addition to the above objects. FIG. 43D illustrates a portable game machine which can include the memory medium reading portion 5011 and the like in addition to the above objects. FIG. 43E illustrates a digital camera with a television reception function, which can include an antenna 5014, a shutter button 5015, an image receiving portion 5016, and the like in addition to the above objects. FIG. 43F illustrates a portable game machine which can include the second display portion 5002, the memory medium reading portion 5011, and the like in addition to the above objects. FIG. 43G illustrates a television receiver which can include a tuner, an image processing portion, and the like in addition to the above objects. FIG. 43H illustrates a portable television receiver which can include a charger 5017 capable of transmitting and receiving signals and the like in addition to the above objects. FIG. 44A illustrates a display which can include a support base 5018 and the like in addition to the above objects. FIG. 44B illustrates a camera which can include an external connection port 5019, the shutter button 5015, the image receiving portion 5016, and the like in addition to the above objects. FIG. 44C illustrates a computer which can include a pointing device 5020, the external connection port 5019, a reader/writer 5021, and the like in addition to the above objects. FIG. 44D illustrates a mobile phone which can include a transmitter, a receiver, a tuner of one-segment partial reception service for mobile phones and mobile terminals, and the like in addition to the above objects.

The electronic appliances illustrated in FIGS. 43A to 43H and FIGS. 44A to 44D can have a variety of functions. For example, a function of displaying a variety of information (a still image, a moving image, a text image, and the like) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a memory medium and displaying the program or data on a display portion can be given. Further, the electronic appliance including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic appliance including an image receiving portion can have a function of shooting a still image, a function of shooting a moving image, a function of automatically or manually correcting a shot image, a function of storing a shot image in a memory medium (an external memory medium or a memory medium incorporated in the camera), a function of displaying a shot image on a display portion, or the like. Note that functions which can be provided for the electronic appliances illustrated in FIGS. 43A to 43H and FIGS. 44A to 44D are not limited to those described above, and the electronic appliances can have a variety of functions.

The electronic appliances described in this embodiment each include a display portion for displaying some sort of information.

Next, application examples of a semiconductor device are described.

Figure 44E:
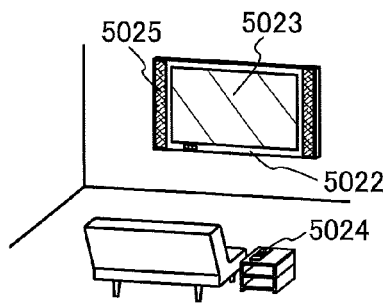

FIG. 44E illustrates an example in which a semiconductor device is incorporated in a building structure. FIG. 44E illustrates a housing 5022, a display portion 5023, a remote controller 5024 which is an operation portion, a speaker 5025, and the like. The semiconductor device is incorporated in the building structure as a wall-hanging type and can be provided without requiring a large space.

Figure 44F:
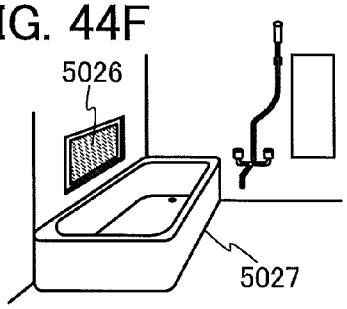

FIG. 44F illustrates another example in which a semiconductor device is incorporated in a building structure. A display panel 5026 is incorporated in a prefabricated bath 5027, so that a person who takes a bath can view the display panel 5026.

Note that, although the wall and the prefabricated bath are described as examples of the building structure in this embodiment, this embodiment is not limited thereto. The semiconductor device can be provided in a variety of building structures.

Next, examples of a semiconductor device incorporated in a moving object are described.

Figure 44G:
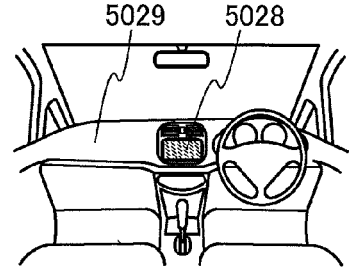

FIG. 44G illustrates an example in which a semiconductor device is provided in a car. A display panel 5028 is attached to a body 5029 of the car and can display information on the operation of the car or information input from the inside or outside of the car on demand. Note that a navigation function may be provided.

Figure 44H:
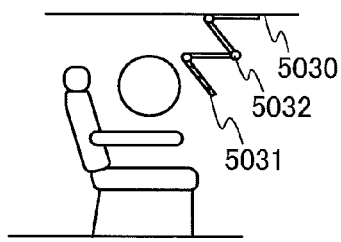

FIG. 44H illustrates an example in which a semiconductor device is incorporated in a passenger airplane. FIG. 44H illustrates a usage pattern in the case where a display panel 5031 is provided for a ceiling 5030 above a seat of the passenger airplane. The display panel 5031 is attached to the ceiling 5030 with a hinge portion 5032, and a passenger can view the display panel 5031 by stretching of the hinge portion 5032. The display panel 5031 has a function of displaying information when operated by the passenger.

Note that, although the body of the car and the body of the airplane are described as examples of the moving object in this embodiment, this embodiment is not limited thereto. The semiconductor device can be provided for a variety of moving objects such as a two-wheel motor vehicle, a four-wheel vehicle (including a car, a bus, and the like), a train (including a monorail, a railway, and the like), and a ship.

Note that, in this specification and the like, part of a diagram or a text described in one embodiment can be taken out to constitute one embodiment of the invention. Thus, in the case where a diagram or a text related to a certain part is described, a content taken out from a diagram or a text of the certain part is also disclosed as one embodiment of the invention and can constitute one embodiment of the invention. Therefore, for example, part of a diagram or a text including one or more of active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like can be taken out to constitute one embodiment of the invention. For example, M circuit elements (e.g., transistors or capacitors) (M is an integer) are picked up from a circuit diagram in which N circuit elements (e.g., transistors or capacitors) (N is an integer, where M<N) are provided, whereby one embodiment of the invention can be constituted. As another example, M layers (M is an integer) are picked up from a cross-sectional view in which N layers (N is an integer, where M<N) are provided, whereby one embodiment of the invention can be constituted. As another example, M elements (M is an integer) are picked up from a flow chart in which N elements (N is an integer, where M<N) are provided, whereby one embodiment of the invention can be constituted.

Note that, in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention and can constitute one embodiment of the invention.

Note that, in this specification and the like, a content described in at least a diagram (which may be part of the diagram) is disclosed as one embodiment of the invention and can constitute one embodiment of the invention. Therefore, when a certain content is described in a diagram, the content is disclosed as one embodiment of the invention even without text description and can constitute one embodiment of the invention. Similarly, a diagram obtained by taking out part of a diagram is disclosed as one embodiment of the invention and can constitute one embodiment of the invention.

This application is based on Japanese Patent Application serial no. 2012-126402 filed with Japan Patent Office on Jun. 1, 2012, the entire contents of which are hereby incorporated by reference.

What is claimed is:

1. A semiconductor device comprising:
   a transistor;
   a load;
   a first capacitor;
   a second capacitor;
   a first switch;
   a second switch;
   a third switch;
   a fourth switch; and
   a fifth switch,
   wherein one of a source and a drain of the transistor is electrically connected to the load,
   wherein the other of the source and the drain of the transistor is electrically connected to a first wiring,
   wherein a gate of the transistor is electrically connected to a second wiring through the first switch,
   wherein the gate of the transistor is electrically connected to a first electrode of the first capacitor,
   wherein a second electrode of the first capacitor is electrically connected to a third wiring through the second switch,
   wherein the second electrode of the first capacitor is electrically connected to a first electrode of the second capacitor through the third switch,
   wherein the first electrode of the second capacitor is electrically connected to the gate of the transistor through the fourth switch,
   wherein a second electrode of the second capacitor is electrically connected to the load, and
   wherein the second electrode of the second capacitor is electrically connected to a fourth wiring through the fifth switch.

2. The semiconductor device according to claim 1, further comprising a sixth switch,
   wherein the gate of the transistor is electrically connected to the other of the source and the drain of the transistor through the sixth switch.

3. The semiconductor device according to claim 1, further comprising a sixth switch,
   wherein the gate of the transistor is electrically connected to a fifth wiring through the sixth switch.

4. The semiconductor device according to claim 1, further comprising a sixth switch and a seventh switch,
   wherein the gate of the transistor is electrically connected to the other of the source and the drain of the transistor through the sixth switch, and
   wherein the other of the source and the drain of the transistor is electrically connected to the first wiring through the seventh switch.

5. The semiconductor device according to claim 1, further comprising a sixth switch and a seventh switch, wherein the gate of the transistor is electrically connected to the other of the source and the drain of the transistor through the sixth switch, and wherein the one of the source and the drain of the transistor is electrically connected to the load through the seventh switch.

6. The semiconductor device according to claim 1, further comprising a sixth switch, wherein the one of the source and the drain of the transistor is electrically connected to the load through the sixth switch.

7. The semiconductor device according to claim 1, wherein the transistor is a depletion transistor.

8. The semiconductor device according to claim 1,
wherein the first switch is a first transistor,
wherein the second switch is a second transistor,
wherein the third switch is a third transistor,
wherein the fourth switch is a fourth transistor, and
wherein the fifth switch is a fifth transistor.

9. The semiconductor device according to claim 8,
wherein the first transistor, the second transistor, the third transistor, the fourth transistor, and the fifth transistor have the same conductivity type.

10. A display panel comprising the semiconductor device according to claim 1,
wherein the load is a display element.

11. An electronic appliance comprising the semiconductor device according to claim 1 and an operation switch.

12. A semiconductor device comprising:
a first capacitor;
a second capacitor;
a first transistor;
a second transistor;
a third transistor;
a fourth transistor;
a fifth transistor; and
a sixth transistor,
wherein one of a source and a drain of the first transistor is electrically connected to a pixel electrode,
wherein the other of the source and the drain of the first transistor is electrically connected to a first wiring,
wherein one of a source and a drain of the second transistor is electrically connected to a gate of the first transistor,
wherein the other of the source and the drain of the second transistor is electrically connected to a second wiring,
wherein a first electrode of the first capacitor is electrically connected to the gate of the first transistor,
wherein a second electrode of the first capacitor is electrically connected to one of a source and a drain of the third transistor,
wherein the other of the source and the drain of the third transistor is electrically connected to a third wiring,
wherein one of a source and a drain of the fourth transistor is electrically connected to the second electrode of the first capacitor,
wherein the other of the source and the drain of the fourth transistor is electrically connected to a first electrode of the second capacitor,
wherein a second electrode of the second capacitor is electrically connected to the pixel electrode,
wherein one of a source and a drain of the fifth transistor is electrically connected to the first electrode of the second capacitor,
wherein the other of the source and the drain of the fifth transistor is electrically connected to the gate of the first transistor, wherein one of a source and a drain of the sixth transistor is electrically connected to the second electrode of the second capacitor, and
wherein the other of the source and the drain of the sixth transistor is electrically connected to a fourth wiring.

13. The semiconductor device according to claim 12, further comprising a seventh transistor,
wherein one of a source and a drain of the seventh transistor is electrically connected to the gate of the first transistor, and
wherein the other of the source and the drain of the seventh transistor is electrically connected to the other of the source and the drain of the first transistor.

14. The semiconductor device according to claim 12, further comprising a seventh transistor,
wherein one of a source and a drain of the seventh transistor is electrically connected to the gate of the first transistor, and
wherein the other of the source and the drain of the seventh transistor is electrically connected to a fifth wiring.

15. The semiconductor device according to claim 12, further comprising a seventh transistor and an eighth transistor,
wherein one of a source and a drain of the seventh transistor is electrically connected to the gate of the first transistor,
wherein the other of the source and the drain of the seventh transistor is electrically connected to the other of the source and the drain of the first transistor,
wherein one of a source and a drain of the eighth transistor is electrically connected to the other of the source and the drain of the first transistor, and
wherein the other of the source and the drain of the eighth transistor is electrically connected to the first wiring.

16. The semiconductor device according to claim 12, further comprising a seventh transistor and an eighth transistor,
wherein one of a source and a drain of the seventh transistor is electrically connected to the gate of the first transistor,
wherein the other of the source and the drain of the seventh transistor is electrically connected to the other of the source and the drain of the first transistor,
wherein one of a source and a drain of the eighth transistor is electrically connected to the one of the source and the drain of the first transistor, and
wherein the other of the source and the drain of the eighth transistor is electrically connected to the pixel electrode.

17. The semiconductor device according to claim 12, further comprising a seventh transistor,
wherein one of a source and a drain of the seventh transistor is electrically connected to the one of the source and the drain of the first transistor, and
wherein the other of the source and the drain of the seventh transistor is electrically connected to the pixel electrode.

18. The semiconductor device according to claim 12,
wherein the first transistor is a depletion transistor.

19. The semiconductor device according to claim 12,
wherein the first transistor, the second transistor, the third transistor, the fourth transistor, the fifth transistor and the sixth transistor have the same conductivity type.

20. A display panel comprising the semiconductor device according to claim 12,
wherein a display element comprises the pixel electrode.

21. An electronic appliance comprising the semiconductor device according to claim 12 and an operation switch.

22. A method for driving a semiconductor device comprising a transistor, a load, a first capacitor, a second capacitor, a first switch, a second switch, a third switch, a fourth switch, and a fifth switch, wherein one of a source and a drain of the transistor is electrically connected to the load, wherein the other of the source and the drain of the transistor is electrically connected to a first wiring, wherein a gate of the transistor is electrically connected to a second wiring through the first switch, wherein the gate of the transistor is electrically connected to a first electrode of the first capacitor, wherein a second electrode of the first capacitor is electrically connected to a third wiring through the second switch, wherein the second electrode of the first capacitor is electrically connected to a first electrode of the second capacitor through the third switch, wherein the first electrode of the second capacitor is electrically connected to the gate of the transistor through the fourth switch, wherein a second electrode of the second capacitor is electrically connected to the load, and wherein the second electrode of the second capacitor is electrically connected to a fourth wiring through the fifth switch, the method comprising the steps of:

applying a first voltage between the first electrode and the second electrode of the first capacitor and a second voltage between the first electrode and the second electrode of the second capacitor while the first switch, the second switch, the fourth switch and the fifth switch are in on-state and the third switch is in off-state;

discharging electric charge accumulated in the second capacitor until a potential difference between the first electrode and the second electrode of the second capacitor becomes a third voltage while the first switch, the second switch and the fourth switch are in on-state and the third switch and the fifth switch are in off-state;

applying a total voltage of the first voltage and the third voltage between the gate and the one of the source and the drain of the transistor while the first switch, the second switch and the fourth switch are in off-state and the third switch and the fifth switch are in on-state; and supplying a current corresponding to the total voltage to the load while the first switch, the second switch, the fourth switch and the fifth switch are in off-state and the third switch is in on-state.

23. The method for driving a semiconductor device according to claim 22,
    wherein the third voltage is substantially equal to the threshold voltage of the transistor.

24. The method for driving a semiconductor device according to claim 22,
    wherein an amount of the current supplied to the load depends on a video signal supplied to the second wiring.

* * * * *